(12) United States Patent
Yoon et al.

(10) Patent No.: US 11,569,323 B2
(45) Date of Patent: Jan. 31, 2023

(54) DISPLAY PANEL, DISPLAY DEVICE, AND METHOD OF MANUFACTURING THE DISPLAY DEVICE

(71) Applicant: Samsung Display Co., Ltd., Yongin-si (KR)

(72) Inventors: Jangyeol Yoon, Yongin-si (KR); Sangwoo Kim, Yongin-si (KR); Junhyeong Park, Yongin-si (KR); Jaemin Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 17/344,150

(22) Filed: Jun. 10, 2021

(65) Prior Publication Data

US 2022/0077242 A1    Mar. 10, 2022

(30) Foreign Application Priority Data

Sep. 10, 2020  (KR) .......................... 10-2020-0116098

(51) Int. Cl.
*H01L 27/32*  (2006.01)
*B32B 3/02*  (2006.01)

(52) U.S. Cl.
CPC .............. *H01L 27/326* (2013.01); *B32B 3/02* (2013.01); *B32B 2457/206* (2013.01); *H01L 2227/323* (2013.01)

(58) Field of Classification Search
CPC ................................. H01L 27/326; B32B 3/02
See application file for complete search history.

(56) References Cited

U.S. PATENT DOCUMENTS

| 9,844,133 | B2 | 12/2017 | Tomita et al. | |
|---|---|---|---|---|
| 2011/0050657 | A1* | 3/2011 | Yamada | H01L 27/3293 361/679.01 |
| 2012/0212698 | A1* | 8/2012 | Lee | G02F 1/1341 349/138 |
| 2017/0323779 | A1 | 11/2017 | Um et al. | |
| 2018/0373073 | A1* | 12/2018 | Ikeda | G02F 1/1339 |
| 2020/0137472 | A1 | 4/2020 | Won et al. | |
| 2020/0142449 | A1 | 5/2020 | Nakatogawa | |
| 2020/0160761 | A1* | 5/2020 | Ahn | H01L 27/3244 |

(Continued)

FOREIGN PATENT DOCUMENTS

| CN | 108766977 A | 11/2018 |
|---|---|---|
| KR | 10-2019-0101270 A | 8/2019 |

(Continued)

*Primary Examiner* — Douglas M Menz
(74) *Attorney, Agent, or Firm* — Lewis Roca Rothgerber Christie LLP

(57) ABSTRACT

A display panel includes: a substrate including a front display area, and a corner display area at a corner of the display panel; and a display element at the corner display area. The corner display area includes: a first extension area extending in a direction away from the front display area; and a first auxiliary area connected to the first extension area, and extending in a direction away from the front display area. The substrate includes a base layer, and a barrier layer on the base layer, the base layer overlapping with the first extension area and the first auxiliary area, and the barrier layer overlapping with the first extension area and spaced from the first auxiliary area.

26 Claims, 40 Drawing Sheets

(56) References Cited

U.S. PATENT DOCUMENTS

| | | | |
|---|---|---|---|
| 2020/0170126 A1 | 5/2020 | Ahn et al. | |
| 2020/0176696 A1* | 6/2020 | Dai | |
| 2020/0258952 A1* | 8/2020 | Bok | H01L 27/3276 |
| 2021/0376038 A1* | 12/2021 | Won | H01L 27/3265 |
| 2021/0384465 A1* | 12/2021 | Park | H01L 27/3258 |
| 2022/0069051 A1* | 3/2022 | Lee | H01L 27/3262 |

FOREIGN PATENT DOCUMENTS

| | | |
|---|---|---|
| KR | 10-2020-0047883 A | 5/2020 |
| KR | 10-2020-0058638 A | 5/2020 |

* cited by examiner

DISPLAY PANEL, DISPLAY DEVICE, AND METHOD OF MANUFACTURING THE DISPLAY DEVICE

CROSS-REFERENCE TO RELATED APPLICATION

This application claims priority to and the benefit of Korean Patent Application No. 10-2020-0116098, filed on Sep. 10, 2020, in the Korean Intellectual Property Office, the entire disclosure of which is incorporated by reference herein.

BACKGROUND

1. Field

Aspects of one or more embodiments relate to a display panel, and more particularly, to a display panel in which a display area for displaying an image is expanded, a display device including the display panel, and a method of manufacturing the display device.

2. Description of Related Art

Mobile electronic devices are widely used. Recently, mobile electronic devices such as tablet personal computers (PCs) have been widely used, in addition to small electronic devices such as mobile phones.

Such a mobile electronic device includes a display device so that various functions, for example, such as visual information (e.g., images or video) may be provided to a user. As other components for driving the display device have become more compact, the display device has been more emphasized from among electronic devices, and a structure that may be bent at a certain angle in a flat state have been developed.

The above information disclosed in this Background section is for enhancement of understanding of the background of the present disclosure, and therefore, it may contain information that does not constitute prior art.

SUMMARY

A display panel for displaying an image in the display device may include a front display area, a first side display area connected to the front display area in a first direction and being bent, and a second side display area connected to the front display area in a second direction and being bent. Thus, the display panel may include various curvatures.

Such a display device having various curvatures may be implemented using a flexible substrate including a polymer resin or the like. However, the flexible substrate may not be easy to handle during a manufacturing process due to its flexibility. Thus, the flexible substrate may be formed on a support substrate having sufficient rigidity, and after various processes, the flexible substrate may be separated from the support substrate.

One or more embodiments of the present disclosure are directed to a display panel in which a display area for displaying an image is expanded, and a display device including the display panel. For example, one or more embodiments are directed to a display panel including a corner display area that is arranged at a corner of the display panel and is bent therefrom, and a display device including the display panel.

In addition, one or more embodiments are directed to a method of manufacturing the display device in which peeling and deformation of the corner display area during a process may be prevented or reduced.

Additional aspects and features of the present disclosure will be set forth, in part, from the description which follows, and in part, will be apparent from the description, or may be learned by practicing one or more of the presented embodiments of the present disclosure.

According to one or more embodiments of the present disclosure, a display panel includes a substrate including a front display area, and a corner display area at a corner of the display panel, and a display element at the corner display area. The corner display area includes a first extension area extending in a direction away from the front display area, and a first auxiliary area connected to the first extension area, and extending in a direction away from the front display area. The substrate includes a base layer, and a barrier layer on the base layer, the base layer overlapping with the first extension area and the first auxiliary area, and the barrier layer overlapping with the first extension area and spaced from the first auxiliary area.

In an embodiment, the corner display area may further include an adjacent area that is adjacent to the first extension area, and extends in a direction away from the front display area, and a first through portion penetrating through the display panel may be defined between the adjacent area and the first extension area, and between the adjacent area and the first auxiliary area.

In an embodiment, the corner display area may further include a second extension area extending in a direction away from the front display area, and a second auxiliary area connected to the second extension area, and extending in a direction away from the front display area. A second through portion penetrating through the display panel may be defined between the first extension area and the second extension area, and between the first auxiliary area and the second auxiliary area.

In an embodiment, a distance between the first auxiliary area and the second auxiliary area may be greater than a distance between the first extension area and the second extension area.

In an embodiment, a width of the first extension area may be greater than a width of the first auxiliary area.

In an embodiment, the first auxiliary area may extend in the same direction as that of the first extension area.

In an embodiment, the first auxiliary area may extend in a direction different from that of the first extension area.

In an embodiment, an extension direction of the first auxiliary area may be changed at least twice.

In an embodiment, the corner display area may further include an adjacent area that is adjacent to the first extension area, and extends in a direction away from the front display area, a connection area connecting the adjacent area to the first auxiliary area. A first through portion penetrating through the display panel, the first through portion being surrounded by the adjacent area, the first extension area, the first auxiliary area, and the connection area.

In an embodiment, the display element may include a plurality of display elements at the first extension area, and the plurality of display elements may be arranged in the direction in which the first extension area extends.

According to one or more embodiments of the present disclosure, a display device includes a display panel and a cover window on the display panel. The display panel includes a substrate including a front display area, and a corner display area at a corner of the display panel, the corner display area being bendable, and a display element at the corner display area. The corner display area includes a first extension area extending in a direction away from the front display area, and a first auxiliary area connected to the first extension area, and extending in a direction away from the front display area. A width of the first auxiliary area is less than a width of the first extension area.

In an embodiment, the corner display area may further include an adjacent area that is adjacent to the first extension area, and extends in a direction away from the front display area, and a first through portion penetrating through the display panel may be defined between the first extension area and the adjacent area, and between the first auxiliary area and the adjacent area.

In an embodiment, the corner display area may further include a second extension area extending in a direction away from the front display area, and a second auxiliary area connected to the second extension area, and extending in a direction away from the front display area. A second through portion penetrating through the display panel may be defined between the first extension area and the second extension area, and between the first auxiliary area and the second auxiliary area.

In an embodiment, the substrate may include a base layer, and a barrier layer on the base layer, the base layer overlapping with the first extension area and the first auxiliary area, and the barrier layer overlapping with the first extension area and spaced from the first auxiliary area.

In an embodiment, the corner display area may further include an adjacent area that is adjacent to the first extension area, and extends in a direction away from the front display area, a connection area connecting the adjacent area to the first auxiliary area. A first through portion penetrating through the display panel, and surrounded by the adjacent area, the first extension area, the first auxiliary area, and the connection area.

In an embodiment, the substrate may further include a first side display area connected to the front display area in a first direction, and bent at a first curvature radius, and a second side display area connected to the front display area in a second direction crossing the first direction, and bent at a second curvature radius different from the first curvature radius. The corner display area may at least partially surround the front display area between the first side display area and the second side display area.

According to one or more embodiments of the present disclosure, a method of manufacturing a display device, includes forming a first pattern layer and a second pattern layer on a support substrate to overlap with a corner of the display device, forming a substrate layer on the support substrate, forming a first opening having a closed loop shape by etching the substrate layer along an edge of the first pattern layer, forming a second opening spaced from the first opening and having a closed loop shape, by etching the substrate layer along an edge of the second pattern layer, and separating an outer area from the support substrate, the outer area surrounding the first opening and the second opening of the substrate layer.

In an embodiment, the outer area may include a first extension area extending between the first opening and the second opening, a connection area facing the first extension area, and at least partially surrounding the first opening and the second opening, and a first guide area extending between the first opening and the second opening, and connecting the first extension area to the connection area.

In an embodiment, the substrate layer may include a base layer, and a barrier layer on the base layer. The first extension area may overlap with the base layer and the barrier layer. The first guide area may overlap with the base layer, and may be spaced from the barrier layer.

In an embodiment, the method may further include forming a pixel circuit layer on the first extension area, and forming a display element layer and a thin-film encapsulation layer on the pixel circuit layer.

In an embodiment, the method may further include removing at least a portion of the connection area.

In an embodiment, the method may further include removing at least a portion of the first guide area.

In an embodiment, the method may further include forming a third pattern layer on the support substrate to overlap with the corner, and forming a third opening surrounded by the outer area in a closed loop shape, by etching the substrate layer along an edge of the third pattern layer. The third opening may be spaced from the first opening and the second opening. The outer area may include a second extension area extending between the second opening and the third opening, and a second guide area extending between the second opening and the third opening, and connecting the second extension area to the connection area. A distance between the first guide area and the second guide area may be greater than a distance between the first extension area and the second extension area.

In an embodiment, in the separating of the outer area from the support substrate, a first dummy pattern in the substrate layer may remain on the support substrate, the first dummy pattern being arranged on the first pattern layer and surrounded by the first opening.

In an embodiment, the method may further include bending a corner display area that overlaps with the corner, and arranging a cover window on the corner display area.

According to one or more embodiments of the present disclosure, a display panel includes a substrate including a front display area, a first side display area extending from the front display area in a first direction, a second side display area extending from the front display area in a second direction crossing the first direction, and a corner display area between the first side display area and the second side display area, and a display element at the corner display area. The corner display area includes a first extension area extending in a direction away from the front display area, a first auxiliary area extending in a direction away from the front display area at one end of the first extension area, and having a width that is less than a width of the first extension area, a second extension area that is adjacent to the first extension area, and extending in a direction away from the front display area, and a second auxiliary area extending in a direction away from the front display area at an end of the second extension area, and having a width that is less than a width of the second extension area. The first extension area, the second extension area, the first auxiliary area, and the second auxiliary area define a through portion therebetween that penetrates through the display panel, and a size of the through portion between the first extension area and the second extension area is less than a size of the through portion between the first auxiliary area and the second auxiliary area.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
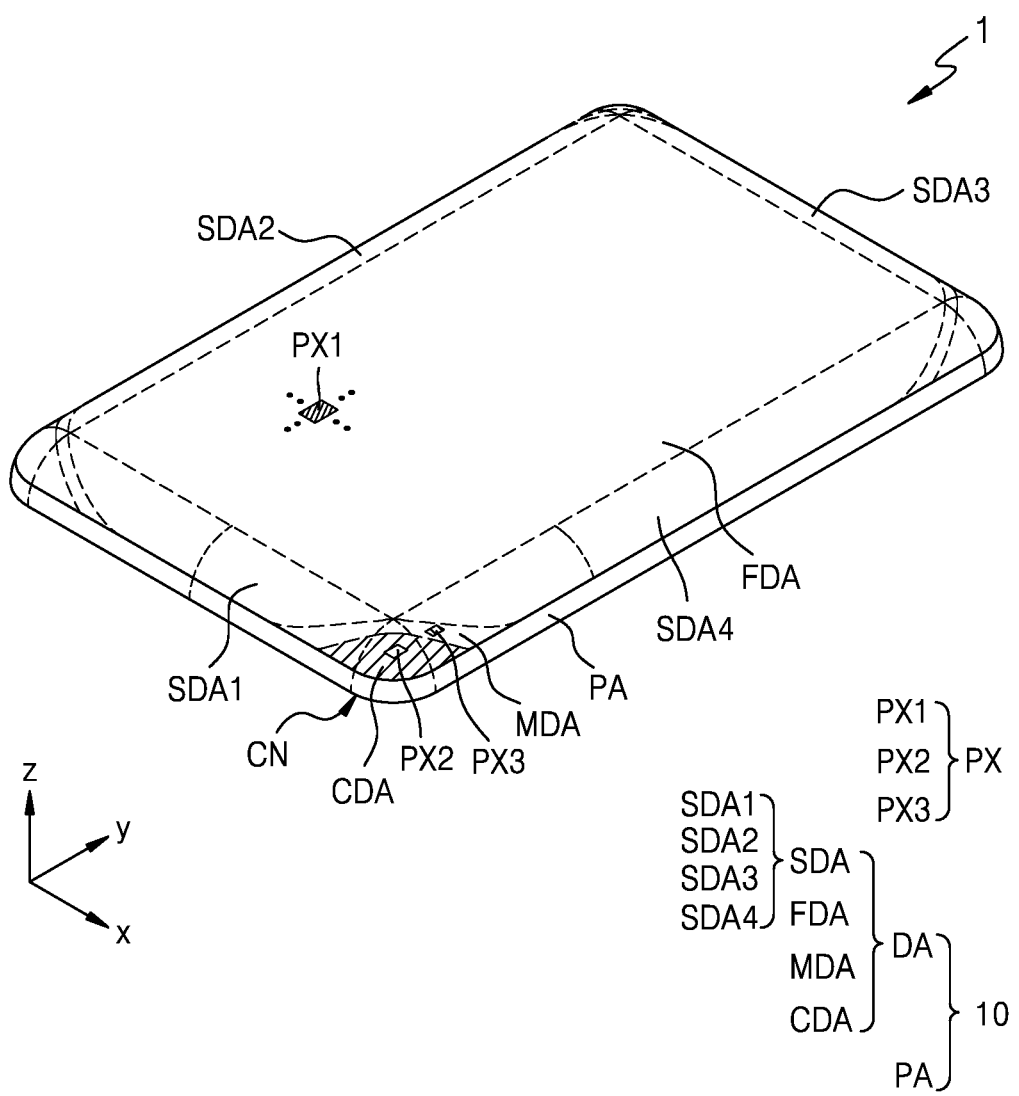
FIG. 1 is a perspective view schematically illustrating a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When an embodiment may be implemented differently, a process order may be performed differently from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, region, or element is referred to as being "electrically connected to" or "electrically coupled to" another layer, region, or element, it may be directly or indirectly electrically connected or coupled to the other layer, region, or element. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
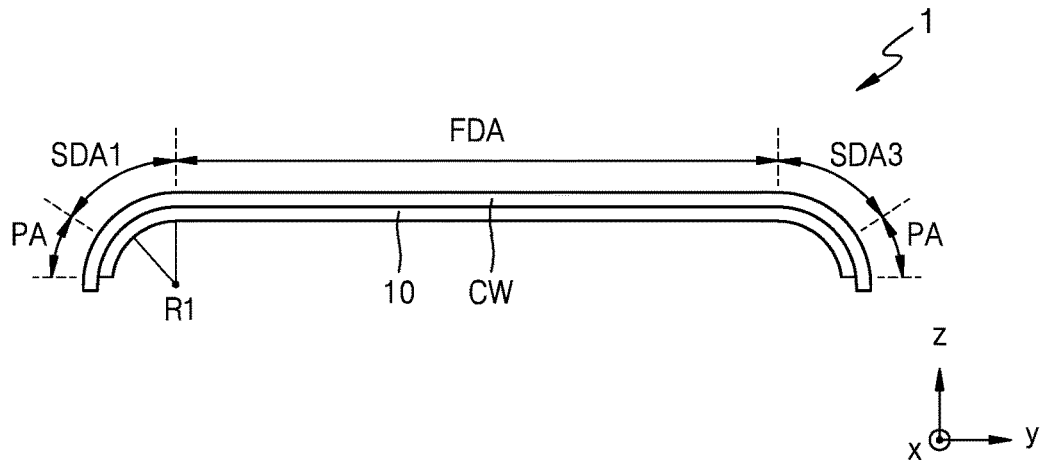
FIGS. 2A, 2B, and 2C are cross-sectional views schematically illustrating a display device according to one or more embodiments.
Figure 2B:
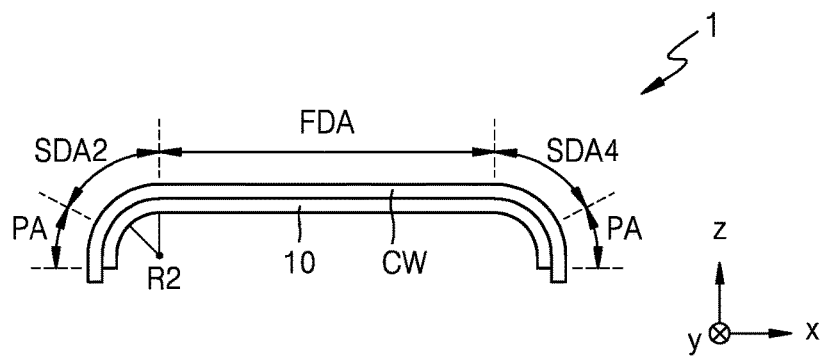
Figure 2C:
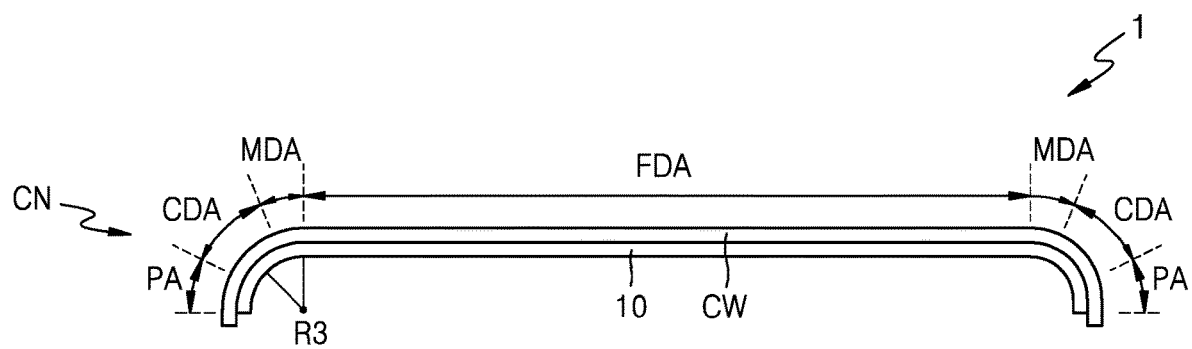

FIG. 1 is a perspective view schematically illustrating a display device 1 according to an embodiment. FIGS. 2A, 2B, and 2C are cross-sectional views schematically illustrating the display device 1 according to one or more embodiments. FIG. 2A shows a cross-section of the display device 1 in the y direction. FIG. 2B shows a cross-section of the display device 1 in the x direction. FIG. 2C is a cross-sectional view of the display device 1 including a corner display area CDA arranged at opposite sides of a front display area FDA.

Referring to FIGS. 1, 2A, 2B, and 2C, the display device 1 may display a moving image or a still image, and may be used in a portable electronic device, for example, such as mobile phones, smartphones, tablet personal computers (PCs), mobile communication terminals, electronic notebooks, electronic books, portable multimedia players (PMPs), navigations, ultra-mobile PCs (UMPCs), and/or the like, and may be used as a display screen of various suitable products, for example, such as televisions, laptops, monitors, billboards, Internet of things (IoT) devices, and/or the like. In addition, the display device 1 according to an embodiment may be used in a wearable device, for example, such as a smart watch, a watch phone, a glasses-type display, a head-mounted display (HMD), and/or the like. In addition, the display device 1 according to an embodiment may correspond to an instrument panel of a vehicle, a center information display (CID) arranged on a center fascia of a vehicle or a dashboard, a room mirror display replacing a side-view mirror of a vehicle, a display at a rear surface of a vehicle for entertainment for the backseat of the vehicle, and/or the like.

In an embodiment, the display device 1 may include a long side extending in a first direction (e.g., the y direction), and a short side extending in a second direction (e.g., the x direction). In this case, the first direction and the second direction may cross each other. For example, the first direction and the second direction may form an acute angle therebetween. As another example, the first direction and the second direction may form an obtuse angle or a right angle therebetween. Hereinafter, a case where the first direction (e.g., the y direction and a −y direction) and the second direction (e.g., the x direction and a −x direction) forms a right angle therebetween will be mainly described in more detail.

In another embodiment, the display device 1 may include a side extending in the first direction (e.g., the y direction or the −y direction) that has the same or substantially the same length as a side extending in the second direction (e.g., the x direction or the −x direction). In another embodiment, the display device 1 may include a short side extending in the first direction (e.g., the y direction or the −y direction) and a long side extending in the second direction (e.g., the x direction or the −x direction).

A corner where the long side extending in the first direction (e.g., the y direction or the −y direction) and the short side extending in the second direction (e.g., the x direction or the −x direction) meet may be rounded at a curvature.

The display device 1 may include a display panel 10 and a cover window CW. In this case, the cover window CW may protect the display panel 10.

The cover window CW may be flexible. The cover window CW may be bent (e.g., may be easily bent) according to an external force without the occurrence of cracks and/or the like, thereby protecting the display panel 10. The cover window CW may include glass, sapphire, or plastic. For example, the cover window CW may include ultra-thin glass (UTG), colorless polyimide (CPI), and/or the like. In an embodiment, in the cover window CW, a flexible polymer layer may be arranged on one surface of a glass substrate, or the cover window CW may include only the flexible polymer layer.

The display panel 10 may be arranged below the cover window CW. For example, the display panel 10 may be attached to the cover window CW with a transparent adhesive member, for example, such as an optically clear adhesive (OCA) film.

The display panel 10 may include a display area DA for displaying an image, and a peripheral area PA at least partially surrounding (e.g., around a periphery of) the display area DA. A plurality of pixels may be arranged at (e.g., in or on) the display area DA, and an image may be displayed by the plurality of pixels PX. Each of the plurality of pixels PX may include subpixels. For example, each of the plurality of pixels PX may include a red subpixel, a green subpixel, and a blue subpixel. In some embodiments, each of the plurality of pixels PX may include a red subpixel, a green subpixel, a blue subpixel, and a white subpixel.

The display area DA may include a front display area FDA, a side display area SDA, a corner display area CDA, and an intermediate display area MDA (collectively, the display areas DA). An image may be displayed by the plurality of pixels PX arranged at (e.g., in or on) each of the display areas DA. In an embodiment, each of the plurality of pixels PX at (e.g., in or on) the front display area FDA, the side display area SDA, the corner display area CDA, and the intermediate display area MDA may provide an independent image. In another embodiment, each of the plurality of pixels PX at (e.g., in or on) the front display area FDA, the side display area SDA, the corner display area CDA, and the intermediate display area MDA may provide a portion of an image (e.g., a portion of one image).

The front display area FDA may be flat or substantially flat, and may include a first pixel PX1 including a display element. In an embodiment, the front display area FDA may provide a major portion of an image.

A pixel PX including a display element may be arranged at (e.g., in or on) the side display area SDA. Thus, an image may be displayed at (e.g., in or on) the side display area SDA. In an embodiment, the side display area SDA may include a first side display area SDA1, a second side display area SDA2, a third side display area SDA3, and a fourth side display area SDA4. In some embodiments, at least one of the first side display area SDA1, the second side display area SDA2, the third side display area SDA3, or the fourth side display area SDA4 may be omitted.

Each of the first side display area SDA1 and the third side display area SDA3 may be connected to the front display area FDA in the first direction (e.g., the y direction or the −y direction). For example, the first side display area SDA1 may be connected in the −y direction from the front display area FDA, and the third side display area SDA3 may be connected in the y direction from the front display area FDA.

Each of the first side display area SDA1 and the third side display area SDA3 may be bent at a suitable curvature radius. In an embodiment, a curvature radius of the first side display area SDA1 may be different from a curvature radius of the third side display area SDA3. In another embodiment, the curvature radius of the first side display area SDA1 may be the same or substantially the same as the curvature radius of the third side display area SDA3. Hereinbelow, a case where the first side display area SDA1 and the third side display area SDA3 have the same or substantially the same first curvature radius R1 will be mainly described in more detail. In addition, because the first side display area SDA1 is the same or substantially the as (or similar to) the third side display area SDA3, the first side display area SDA1 will be mainly described in more detail below.

Each of the second side display area SDA2 and the fourth side display area SDA4 may be connected to the front display area FDA in a second direction (e.g., the x direction or the −x direction). For example, the second side display area SDA2 may be connected in the −x direction from the front display area FDA, and the fourth side display area SDA4 may be connected in the x direction from the front display area FDA.

Each of the second side display area SDA2 and the fourth side display area SDA4 may be bent at a suitable curvature radius. In an embodiment, a curvature radius of the second side display area SDA2 may be different from a curvature radius of the fourth side display area SDA4. In another embodiment, the curvature radius of the second side display area SDA2 may be the same or substantially the same as that of the fourth side display area SDA4. Hereinbelow, a case where the second side display area SDA2 and the fourth side display area SDA4 have the same or substantially the same second curvature radius R2 will be mainly described in more detail. In addition, because the second side display area SDA2 is the same or substantially the same as (or similar to) the fourth side display area SDA4, the second side display area SDA2 will be mainly described in more detail below.

In an embodiment, the first curvature radius R1 of the first side display area SDA1 may be different from the second curvature radius R2 of the second side display area SDA2. For example, the first curvature radius R1 may be less than the second curvature radius R2. As another example, the first curvature radius R1 may be greater than the second curvature radius R2. In another embodiment, the first curvature radius R1 of the first side display area SDA1 may be the same or substantially the same as the second curvature radius R2 of the second side display area SDA2. Hereinbelow, a case where the first curvature radius R1 is greater than the second curvature radius R2 will be mainly described in more detail.

The corner display area CDA may be bent at a corner CN of the display panel 10. In other words, the corner display area CDA may correspond to the corner CN. Here, the corner CN may be a portion where the long side extending in the first direction (e.g., the y direction or the −y direction) of the display device 1 and/or the display panel 10 and the short side extending in the second direction (e.g., the x direction or the −x direction) of the display device 1 and/or the display panel 10 meet each other. The corner display area CDA may be arranged between adjacent ones of the side display areas SDA. For example, the corner display area CDA may be arranged between the first side display area SDA1 and the second side display area SDA2. In some embodiments, the corner display area CDA may be arranged between the second side display area SDA2 and the third side display area SDA3, between the third side display area SDA3 and the fourth side display area SDA4, and/or between the fourth side display area SDA4 and the first side display area SDA1. Thus, the side display area SDA and the corner display area CDA may be bent by at least partially surrounding (e.g., around a periphery of) the front display area FDA.

A second pixel PX2 including a display element may be arranged at (e.g., in or on) the corner display area CDA. Thus, an image may be displayed at (e.g., in or on) the corner display area CDA.

When the first curvature radius R1 of the first side display area SDA1 is different from the second curvature radius R2 of the second side display area SDA2, a curvature radius of the corner display area CDA may be gradually changed. In an embodiment, when the first curvature radius R1 of the first side display area SDA1 is greater than the second curvature radius R2 of the second side display area SDA2, the curvature radius of the corner display area CDA may gradually decrease in a direction from the first side display area SDA1 to the second side display area SDA2. For example, a third curvature radius R3 of the corner display area CDA may be greater than the second curvature radius R2 and less than the first curvature radius R1.

The intermediate display area MDA may be arranged between the corner display area CDA and the front display area FDA. In an embodiment, the intermediate display area MDA may extend between the side display area SDA and the corner display area CDA. For example, the intermediate display area MDA may extend between the first side display area SDA1 and the corner display area CDA. In addition, the intermediate display area MDA may extend between the second side display area SDA2 and the corner display area CDA.

The intermediate display area MDA may include a third pixel PX3. In addition, in an embodiment, a driving circuit for providing an electrical signal or a power line for providing a voltage may be arranged at (e.g., in or on) the intermediate display area MDA, and the third pixel PX3 may overlap with the driving circuit or the power line. In this case, a display element of the third pixel PX3 may be arranged on the driving circuit or the power line. In some embodiments, the driving circuit or the power line may be arranged at (e.g., in or on) the peripheral area PA, and in this case, the third pixel PX3 may not overlap with the driving circuit or the power line.

In an embodiment, the peripheral area PA may entirely surround (e.g., around a periphery of) the display area DA. In another embodiment, the peripheral area PA may partially surround (e.g., around a periphery of) the display area DA. For example, the peripheral area PA may be arranged outside the side display area SDA, but may not be arranged outside the corner display area CDA.

In the display device 1, an image may be displayed not only at (e.g., in or on) the front display area FDA, but also at (e.g., in or on) the side display area SDA, the corner display area CDA, and the intermediate display area MDA. Thus, a ratio of the display area DA may increase in the display device 1. In addition, the display device 1 may be bent at the corner CN, and may include the corner display area CDA for displaying an image, and thus, aesthetics of the display device 1 may be improved.

Figure 3:
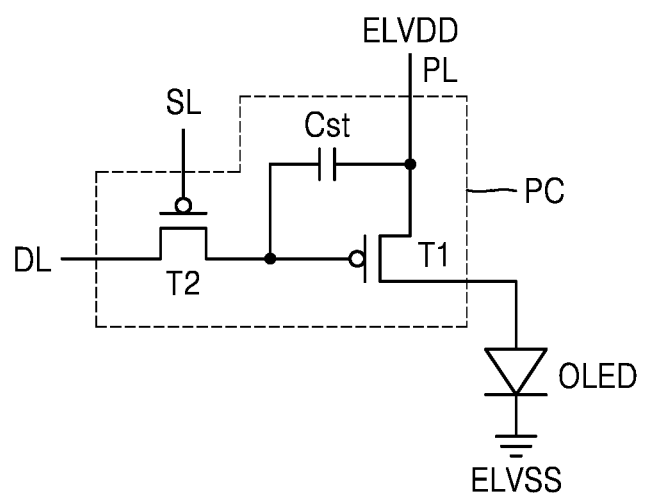
FIG. 3 is an equivalent circuit diagram schematically illustrating a pixel circuit applicable to a display panel according to an embodiment.

FIG. 3 is an equivalent circuit diagram schematically illustrating a pixel circuit PC that is applicable to a display panel, according to an embodiment.

Referring to FIG. 3, the pixel circuit PC may be connected to a display element, for example, such as an organic light-emitting diode OLED.

The pixel circuit PC may include a driving thin-film transistor T1, a switching thin-film transistor T2, and a storage capacitor Cst. In addition, the organic light-emitting diode OLED may emit a suitable one of a red light, a green light, or a blue light, or may emit a suitable one of a red light, a green light, a blue light, or a white light.

The switching thin-film transistor T2 may be connected to a scan line SL and a data line DL, and may transmit, to the driving thin-film transistor T1, a data signal or a data voltage received from the data line DL based on a scan signal or a switching voltage received from the scan line SL. The storage capacitor Cst may be connected to the switching thin-film transistor T2 and a driving voltage line PL, and may store a voltage difference between a voltage received from the switching thin-film transistor T2 and a first power voltage ELVDD applied to the driving voltage line PL.

The driving thin-film transistor T1 may be connected to the driving voltage line PL and the storage capacitor Cst, and may control a driving current flowing to the organic light-emitting diode OLED from the driving voltage line PL corresponding to (e.g., according to) the voltage stored in the storage capacitor Cst. The organic light-emitting diode OLED may emit light having a desired luminance based on the driving current. An opposite electrode of the organic light-emitting diode OLED may receive a second power voltage ELVSS.

In FIG. 3, the pixel circuit PC is shown as including two thin-film transistors and one storage capacitor. However, the present disclosure is not limited thereto, and in some embodiments, the pixel circuit PC may include three or more thin-film transistors, and/or two or more storage capacitors.

Figure 4:
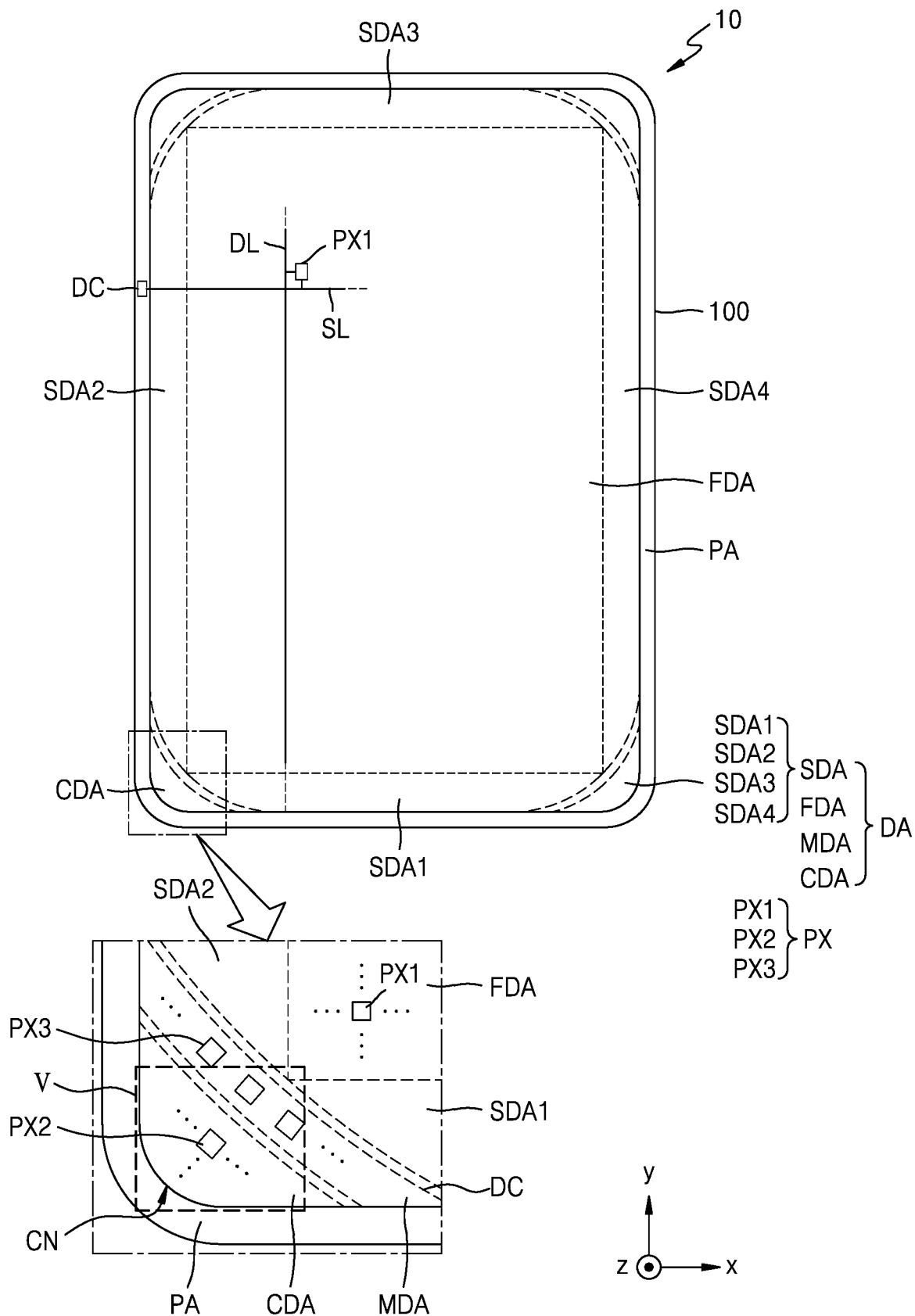
FIG. 4 is a plan view schematically illustrating a display panel according to an embodiment.

FIG. 4 is a plan view schematically illustrating the display panel 10 according to an embodiment. For example, FIG. 4 is a plan view schematically illustrating the display panel 10 in an unbent shape before the corner display area CDA is bent.

Referring to FIG. 4, the display panel 10 may include a display element. For example, the display panel 10 may correspond to an organic light-emitting display panel that uses an organic light-emitting diode including an organic emission layer, a micro light-emitting diode display panel that uses a micro light-emitting diode, a quantum dot light-emitting display panel that uses a quantum dot light-emitting diode including a quantum dot emission layer, or an inorganic light-emitting display panel that uses an inorganic light-emitting element including an inorganic semiconductor. Hereinbelow, a case where the display panel 10 includes the organic light-emitting display panel that uses the organic light-emitting diode as the display element will be mainly described in more detail.

The display panel 10 may include the display area DA and the peripheral area PA. The display area DA may be an area for displaying an image by the plurality of pixels PX, and the peripheral area PA may be an area that at least partially surrounds (e.g., around a periphery of) the display area DA. The display area DA may include the front display area FDA, the side display area SDA, the corner display area CDA, and the intermediate display area MDA.

Each of the pixels PX may include subpixels, and each subpixel may emit light of a suitable color using the organic light-emitting diode as the display element. In the present disclosure, the subpixel may correspond to a light-emitting area, which is a minimum unit for implementing an image. When the organic light-emitting diode is used as the display element, the light-emitting area may be defined by an opening in a pixel-defining layer. This will be described in more detail below.

For example, the organic light-emitting diode may emit one of a red light, a green light, or a blue light. The organic light-emitting diode may be connected to a pixel circuit including a thin-film transistor and a storage capacitor.

The display panel 10 may include a substrate 100, and a multi-layered film arranged on the substrate 100. In this case, the display area DA and the peripheral area PA may be defined on the substrate 100 and/or the multi-layered film. In other words, the substrate 100 and/or the multi-layered film may include the front display area FDA, the side display area SDA, the corner display area CDA, the intermediate display area MDA, and the peripheral area PA. Hereinbelow, a case where the front display area FDA, the side display area SDA, the corner display area CDA, the intermediate display area MDA, and the peripheral area PA are defined on the substrate 100 will be mainly described in more detail.

The substrate 100 may include glass or a polymer resin, for example, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, and/or bendable. The substrate 100 may have a multi-layered structure that includes a base layer including the polymer resin, and a barrier layer.

The peripheral area PA may correspond to a non-display area where no image is provided. In an embodiment, the peripheral area PA may entirely surround (e.g., around a periphery of) the display area DA. In another embodiment, the peripheral area PA may partially surround (e.g., around a periphery of) the display area DA. For example, the peripheral area PA may be arranged outside the side display area SDA, but may not be arranged outside the corner display area CDA.

A driving circuit DC for providing an electrical signal to the pixels PX, a power line for providing a power supply, or the like may be arranged at (e.g., in or on) the peripheral area PA. For example, the driving circuit DC may include a scan driving circuit configured to provide a scan signal to each pixel PX through the scan line SL. In some embodiments, the driving circuit DC may include a data driving circuit configured to provide a data signal to each pixel PX through the data line DL. In an embodiment, the data driving circuit may be arranged to be adjacent to one side of the display panel 10. For example, the data driving circuit at (e.g., in or on) the peripheral area PA may correspond to the first side display area SDA1.

The peripheral area PA may include a pad portion, which is an area to which an electronic element, a printed circuit board, or the like may be electrically connected. The pad portion may be exposed, instead of being covered by an insulating layer, and may be electrically connected to a flexible printed circuit board (FPCB). The FPCB may electrically connect a controller to the pad portion, and may supply a signal or a power received from the controller. In some embodiments, the data driving circuit may be arranged on the FPCB.

The first pixel PX1 including a display element may be arranged at (e.g., in or on) the front display area FDA. The front display area FDA may be flat or substantially flat. In an embodiment, the front display area FDA may provide a major portion of an image.

The pixel PX including a display element may be arranged at (e.g., in or on) the side display area SDA, and the side display area SDA may be bendable. In other words, as described above with reference to FIG. 1, the side display area SDA may correspond to an area that is bent from the front display area FDA. The side display area SDA may include the first side display area SDA1, the second side display area SDA2, the third side display area SDA3, and the fourth side display area SDA4.

The first side display area SDA1 and the third side display area SDA3 may be connected to each other in the first direction (e.g., the y direction or the −y direction). Each of the first side display area SDA1 and the third side display area SDA3 may extend in the first direction (e.g., the y direction or the −y direction) from the front display area FDA. In addition, the second side display area SDA2 and the fourth side display area SDA4 may be connected to each other in the second direction (e.g., the x direction or the −x direction). Each of the second side display area SDA2 and the fourth side display area SDA4 may extend in the second direction (e.g., the x direction or the −x direction) from the front display area FDA.

The corner display area CDA may be arranged at the corner CN of the display panel 10. Here, the corner CN of the display panel 10 may correspond to a portion where a long side extending in the first direction (e.g., the y direction or the −y direction) and a short side extending in the second direction (e.g., the x direction or the −x direction) of the display panel 10 meet each other from among the sides of the display panel 10.

The corner display area CDA may be arranged between the adjacent ones of the side display areas SDA. For example, the corner display area CDA may be arranged between the first side display area SDA1 and the second side display area SDA2. In some embodiments, the corner display area CDA may be arranged between the second side display area SDA2 and the third side display area SDA3, between the third side display area SDA3 and the fourth side display area SDA4, and/or between the fourth side display area SDA4 and the first side display area SDA1. Hereinbelow, a case where the corner display area CDA is arranged between the first side display area SDA1 and the second side display area SDA2 will be mainly described in more detail.

The corner display area CDA may at least partially surround (e.g., around a periphery of) the front display area FDA. For example, the corner display area CDA may be arranged between the first side display area SDA1 and the second side display area SDA2, and may at least partially surround the front display area FDA.

The second pixel PX2 including a display element may be arranged at (e.g., in or on) the corner display area CDA, and the corner display area CDA may be bendable. In other words, as described above with reference to FIG. 1, the corner display area CDA may be an area that is arranged to correspond to the corner CN, and is bent or bends from the front display area FDA.

The intermediate display area MDA may be arranged between the front display area FDA and the corner display area CDA. In an embodiment, the intermediate display area MDA may extend between the side display area SDA and the corner display area CDA. For example, the intermediate display area MDA may extend between the first side display area SDA1 and the corner display area CDA, and/or between the second side display area SDA2 and the corner display area CDA. In an embodiment, the intermediate display area MDA may be bendable.

The third pixel PX3 including a display element may be arranged at (e.g., in or on) the intermediate display area MDA. In addition, in an embodiment, the driving circuit DC for providing an electrical signal, a power line for supplying power, or the like may be arranged at (e.g., in or on) the intermediate display area MDA. In an embodiment, the driving circuit DC may be arranged along the intermediate display area MDA and the peripheral area PA. In this case, the third pixel PX3 arranged at (e.g., in or on) the intermediate display area MDA may overlap with the driving circuit DC or the power line. In another embodiment, the third pixel PX3 may not overlap with the driving circuit DC or the power line. In this case, the driving circuit DC may be arranged along the peripheral area PA.

At least one of the side display area SDA, the corner display area CDA, or the intermediate display area MDA may be bent. In this case, the first side display area SDA1 of the side display areas SDA may be bent at a first curvature radius, and the second side display area SDA2 of the side display areas SDA may be bent at a second curvature radius. When the first curvature radius is greater than the second curvature radius, a curvature radius at which the corner display area CDA is bent or bends may gradually decrease in a direction from the first side display area SDA1 to the second side display area SDA2.

When the corner display area CDA is bent or bends, a compressive strain that is greater than a tensile strain may occur in the corner display area CDA. In this case, a shrinkable substrate and multi-layered film structure may be applied to the corner display area CDA. Thus, a stacked structure of the multi-layered film or a shape of the substrate 100 at (e.g., in or on) the corner display area CDA may be different from a stacked structure of the multi-layered film or a shape of the substrate 100 at (e.g., in or on) the front display area FDA.

Figure 5A:
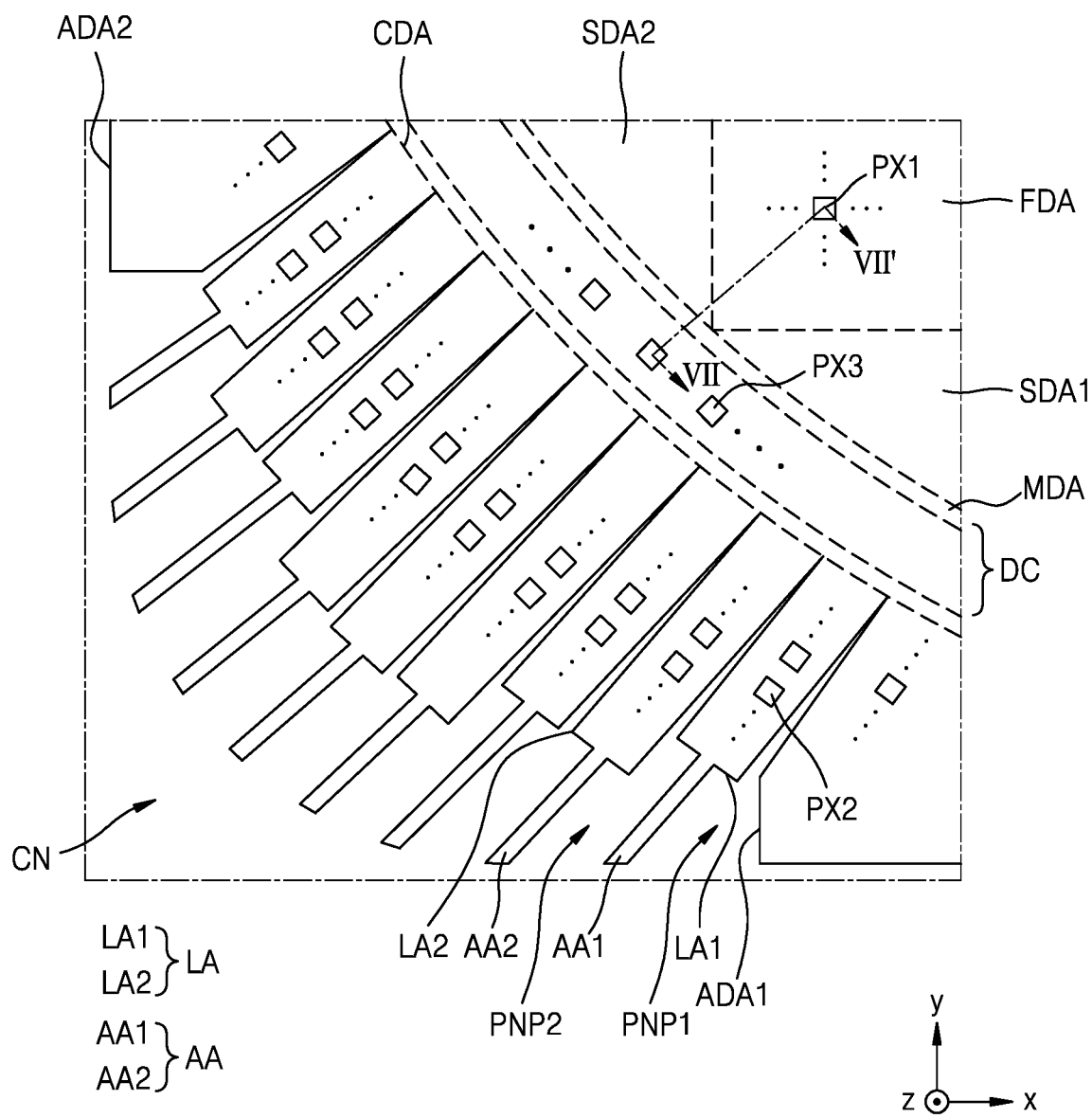
FIG. 5A is an enlarged view of a corner of a display panel according to an embodiment.
Figure 5B:
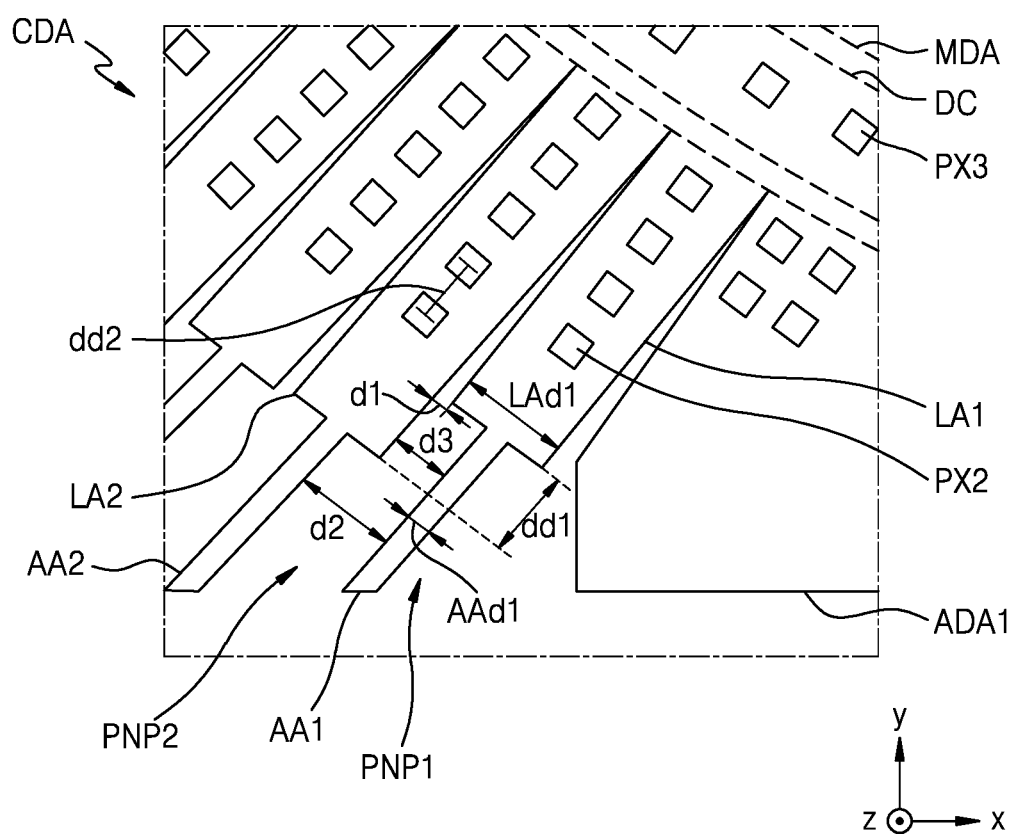
FIG. 5B is an enlarged view of a portion of the display panel shown in FIG. 5A.

FIG. 5A is an enlarged view of the corner CN of a display panel according to an embodiment. FIG. 5B is an enlarged view of a portion of FIG. 5A. For example, FIG. 5A is an enlarged view of the region V of FIG. 4 according to an embodiment.

Referring to FIGS. 5A and 5B, the display panel may include the corner CN. In this case, the substrate may include the front display area FDA, the first side display area SDA1, the second side display area SDA2, the corner display area CDA, and the intermediate display area MDA. The first pixel PX1 may be arranged at (e.g., in or on) the front display area FDA, the second pixel PX2 may be arranged at (e.g., in or on) the corner display area CDA, and the third pixel PX3 may be arranged at (e.g., in or on) the intermediate display area MDA.

In an embodiment, the peripheral area PA at least partially surrounding (e.g., around a periphery of) the display area may not be arranged outside the corner display area CDA. In another embodiment, the peripheral area PA may at least partially surround the corner display area CDA. Hereinbelow, a case where the peripheral area is not arranged outside the corner display area CDA will be mainly described in more detail with reference to FIGS. 5A and 5B.

The corner display area CDA may be arranged at the corner CN of the display panel. The corner display area CDA may include an extension area LA, an auxiliary area AA, a first adjacent area ADA1, and a second adjacent area ADA2. In an embodiment, each of the extension area LA, the auxiliary area AA, the first adjacent area ADA1, and the second adjacent area ADA2 may extend in a direction away from the front display area FDA.

The second pixel PX2 may be arranged at (e.g., in or on) the corner display area CDA. In an embodiment, the plurality of second pixels PX2 may be arranged at (e.g., in or on) the corner display area CDA. The second pixels PX2 may be arranged at (e.g., in or on) the extension area LA, the auxiliary area AA, the first adjacent area ADA1, and the second adjacent area ADA2. Because the second adjacent area ADA2 is the same or substantially the same as (or similar to) the first adjacent area ADA1, the first adjacent area ADA1 will be mainly described in more detail below.

The plurality of extension areas LA may be provided at (e.g., in or on) the corner display area CDA. The plurality of extension areas LA may be arranged between the first adjacent area ADA1 and the second adjacent area ADA2. The extension areas LA may be arranged at (e.g., in or on) an area that receives a relatively greater compressive strain in the corner display area CDA, and the first adjacent area ADA1 and the second adjacent area ADA2 may be arranged at (e.g., in or on) an area that receives a relatively less compressive strain in the corner display area CDA. Hereinbelow, from among the plurality of extension areas LA, a first extension area LA1 and a second extension area LA2 will be mainly described in more detail.

The first extension area LA1 may extend in a direction away from the front display area FDA. In an embodiment, the first extension area LA1 may extend in a direction away from the intermediate display area MDA. In an embodiment, the substrate may include a base layer including an organic material, and a barrier layer arranged on the base layer and including an inorganic material. In this case, the first extension area LA1 may overlap with the base layer and the barrier layer.

The base layer of the first extension area LA1 may extend to a first auxiliary area AA1. Thus, the base layer of the first extension area LA1 may be continuously provided with a base layer of the first auxiliary area AA1. The barrier layer of the first extension area LA1 may be spaced apart from the first auxiliary area AA1.

The auxiliary area AA may be connected to the extension area LA, and may extend in a direction away from the front display area FDA. The plurality of auxiliary areas AA may be provided at (e.g., in or on) the corner display area CDA. The auxiliary areas AA may include the first auxiliary area AA1 and a second auxiliary area AA2.

The first auxiliary area AA1 may be connected to the first extension area LA1, and may extend in a direction away from the front display area FDA. In an embodiment, an extension direction of the first auxiliary area AA1 may be the same or substantially the same as an extension direction of the first extension area LA1. In another embodiment, the extension direction of the first auxiliary area AA1 may be different from the extension direction of the first extension area LA1.

In an embodiment, a width LAd1 of the first extension area LA1 may be greater than a width AAd1 of the first auxiliary area AA1. The width LAd1 of the first extension area LA1 may be a distance between edges of the first extension area LA1 in a direction perpendicular to or substantially perpendicular to the extension direction of the first extension area LA1. The width AAd1 of the first auxiliary area AA1 may be a distance between edges of the first auxiliary area AA1 in a direction perpendicular to or substantially perpendicular to the extension direction of the first auxiliary area AA1.

In another embodiment, the width LAd1 of the first extension area LA1 may be equal to or substantially equal to the width AAd1 of the first auxiliary area AA1. In another embodiment, the width LAd1 of the first extension area LA1 may be less than the width AAd1 of the first auxiliary area AA1. Hereinbelow, a case where the width LAd1 of the first extension area LA1 is greater than the width AAd1 of the first auxiliary area AA1 will be mainly described in more detail.

In an embodiment, the width AAd1 of the first auxiliary area AA1 may be constant or substantially constant in the extension direction of the first auxiliary area AA1. In another embodiment, the width AAd1 of the first auxiliary area AA1 may be variable (e.g., may vary) in the extension direction of the first auxiliary area AA1. For example, the width AAd1 of the first auxiliary area AA1 may increase from the first extension area LA1 to an end of the first auxiliary area AA1 in the extension direction of the first auxiliary area AA1. As another example, the width AAd1 of the first auxiliary area AA1 may decrease from the first extension area LA1 in the extension direction of the first auxiliary area AA1.

The first auxiliary area AA1 may overlap with the base layer extending from the first extension area LA1. In an embodiment, an upper surface of the base layer may be exposed at (e.g., in or on) the first auxiliary area AA1. In addition, the barrier layer arranged at (e.g., in or on) the first extension area LA1 may be spaced apart from the first auxiliary area AA1.

The second extension area LA2 may extend in a direction away from the front display area FDA. In an embodiment, the second extension area LA2 may extend in a direction away from the intermediate display area MDA. Similar to the first extension area LA1, the second extension area LA2 may include a base layer and a barrier layer arranged on the base layer.

The base layer of the second extension area LA2 may extend to the second auxiliary area AA2. Thus, the base layer of the second extension area LA2 may be continuously provided with the base layer of the second auxiliary area AA2. The barrier layer of the second extension area LA2 may be spaced apart from the second auxiliary area AA2.

Similar to the first auxiliary area AA1, the second auxiliary area AA2 may be connected to the second extension area LA2, and may extend in a direction away from the front display area FDA. In an embodiment, the extension direction of the second auxiliary area AA2 may be the same or substantially the same as the extension direction of the second extension area LA2. In another embodiment, the extension direction of the second auxiliary area AA2 may be different from the extension direction of the second extension area LA2.

In an embodiment, a length of the second extension area LA2 may be different from a length of the first extension area LA1. The length of the second extension area LA2 may be defined as a length of the barrier layer of the second extension area LA2. The length of the first extension area LA1 may be defined as a length of the barrier layer of the first extension area LA1. For example, the length of the second extension area LA2 may be greater than the length of the first extension area LA1. As another example, the length of the second extension area LA2 may be less than the length of the first extension area LA1. In another embodiment, the length of the second extension area LA2 may be equal to or substantially equal to the length of the first extension area LA1.

A second distance d2 between the first auxiliary area AA1 and the second auxiliary area AA2 may be greater than a first distance d1 between the first extension area LA1 and the second extension area LA2. The first distance d1 may be a maximum gap distance between an edge of the first extension area LA1 and an edge of the second extension area LA2 that face each other. The second distance d2 may be a distance between an edge of the first auxiliary area AA1 and an edge of the second auxiliary area AA2 that face each other.

In an embodiment, the second extension area LA2 (e.g., an edge of an end portion thereof) may face the first auxiliary area AA1. In this case, a third distance d3 between the second extension area LA2 and the first auxiliary area AA1 may be greater than the first distance d1 between the first extension area LA1 and the second extension area LA2. In addition, the third distance d3 may be less than the second distance d2 between the first auxiliary area AA1 and the second auxiliary area AA2. Here, the third distance d3 may be a distance between an edge of the second extension area LA2 and an edge of the first auxiliary area AA1 that face each other.

The first adjacent area ADA1 may extend in a direction away from the front display area FDA. The first adjacent area ADA1 may be adjacent to the first extension area LA1. The first adjacent area ADA1 (e.g., an edge thereof) and the first extension area LA1 (e.g., an edge thereof) may face each other. In addition, the first adjacent area ADA1 may be adjacent to the first auxiliary area AA1. The first adjacent area ADA1 (e.g., an edge thereof) and the first auxiliary area AA1 (e.g., an edge thereof) may face each other.

A first through portion PNP1 may be defined between the first extension area LA1, the first auxiliary area AA1, and the first adjacent area ADA1. The first through portion PNP1 may be defined by a portion of the edge of the first extension area LA1, a portion of the edge of the first auxiliary area AA1, and a portion of the edge of the first adjacent area ADA1. The first through portion PNP1 may penetrate into the display panel. Thus, the first through portion PNP1 may include an empty space where no elements of the display panel are arranged.

A second through portion PNP2 may be defined between the first extension area LA1, the second extension area LA2, the first auxiliary area AA1, and the second auxiliary area AA2. The second through portion PNP2 may be defined by a portion of the edge of the first extension area LA1, a portion of the edge of the second extension area LA2, a portion of the edge of the first auxiliary area AA1, and a portion of the edge of the second auxiliary area AA2. In other words, the second through portion PNP2 may be defined by the edge of the first extension area LA1 and the edge of the second extension area LA2 that face each other, and the edge of the first auxiliary area AA1 and the edge of the second auxiliary area AA2 that face each other. Similar to the first through portion PNP1, the second through portion PNP2 may penetrate into the display panel. Thus, the second through portion PNP2 may include an empty space where no elements of the display panel are arranged.

The first extension area LA1 and the first adjacent area ADA1 may be spaced apart from each other with the first through portion PNP1 therebetween. The first extension area LA1 and the second extension area LA2 may be spaced apart from each other with the second through portion PNP2 therebetween. When the display panel is bent or bends at the corner CN, a compressive strain greater than a tensile strain may occur in the corner display area CDA. However, according to one or more embodiments, the plurality of extension areas LA that are spaced apart from one another may be arranged at (e.g., in or on) the corner display area CDA, and thus, damage of the display panel may be prevented or reduced.

The first auxiliary area AA1 and the second auxiliary area AA2 may be provided to form the first through portion PNP1 and the second through portion PNP2. For example, in a case where the first auxiliary area AA1 and the second auxiliary area AA2 are omitted, the second through portion PNP2 may not be formed between the first extension area LA1 and the second extension area LA2. In other words, the second through portion PNP2 may be formed by removing the elements between the first extension area LA1 and the second extension area LA2. However, in a case where the first auxiliary area AA1 and the second auxiliary area AA2 are omitted, some of the elements between the first extension area LA1 and the second extension area LA2 may not be removed.

The first auxiliary area AA1 and the second auxiliary area AA2 may be connected to the first extension area LA1 and the second extension area LA2, respectively, and may adjust a size of the second through portion PNP2. For example, the size of the second through portion PNP2 may be defined by the first distance d1 between the first extension area LA1 and the second extension area LA2, and the second distance d2 between the first auxiliary area AA1 and the second auxiliary area AA2. In the present embodiment, the size of the second through portion PNP2 may decrease (e.g., may gradually decrease) from the auxiliary area AA to the extension area LA so that elements between the first auxiliary area AA1 and the second auxiliary area AA2 and between the first extension area LA1 and the second extension area LA2 may be removed.

The plurality of second pixels PX2 may be arranged at (e.g., in or on) the first extension area LA1, the second extension area LA2, the first adjacent area ADA1, and the second adjacent area ADA2. The plurality of second pixels PX2 may be arranged along the extension direction of the first extension area LA1 and the extension direction of the second extension area LA2. The second pixels PX2 may not be arranged at (e.g., in or on) the first auxiliary area AA1 and the second auxiliary area AA2. Each of the first auxiliary area AA1 and the second auxiliary area AA2 may be spaced apart from the second pixels PX2.

In an embodiment, the number of second pixels PX2 arranged at (e.g., in or on) the first extension area LA1 may be different from the number of second pixels PX2 arranged at (e.g., in or on) the second extension area LA2. For example, as shown in FIG. 5B, four second pixels PX2 may be arranged at (e.g., in or on) the first extension area LA1, and five second pixels PX2 may be arranged at (e.g., in or on) the second extension area LA2. In this case, a length of the first extension area LA1 may be less than a length of the second extension area LA2. In an embodiment, a length difference dd1 between an end of the second extension area LA2 and an end of the first extension area LA1 may be equal to or substantially equal to a distance dd2 between adjacent ones of the second pixels PX2. In another embodiment, the number of second pixels PX2 arranged at (e.g., in or on) the first extension area LA1 may be equal to the number of second pixels PX2 arranged at (e.g., in or on) the second extension area LA2. In this case, the first extension area LA1 and the second extension area LA2 may have the same or substantially the same length as each other.

According to one or more embodiments, the display panel may include the corner CN that is bendable without causing damage to the display panel. In addition, in the display panel according to one or more embodiments of the present disclosure, the second pixels PX2 may be arranged at (e.g., in or on) the corner display area CDA overlapping with the corner CN, so that an image may be displayed at the bent corner CN.

Figure 6A:
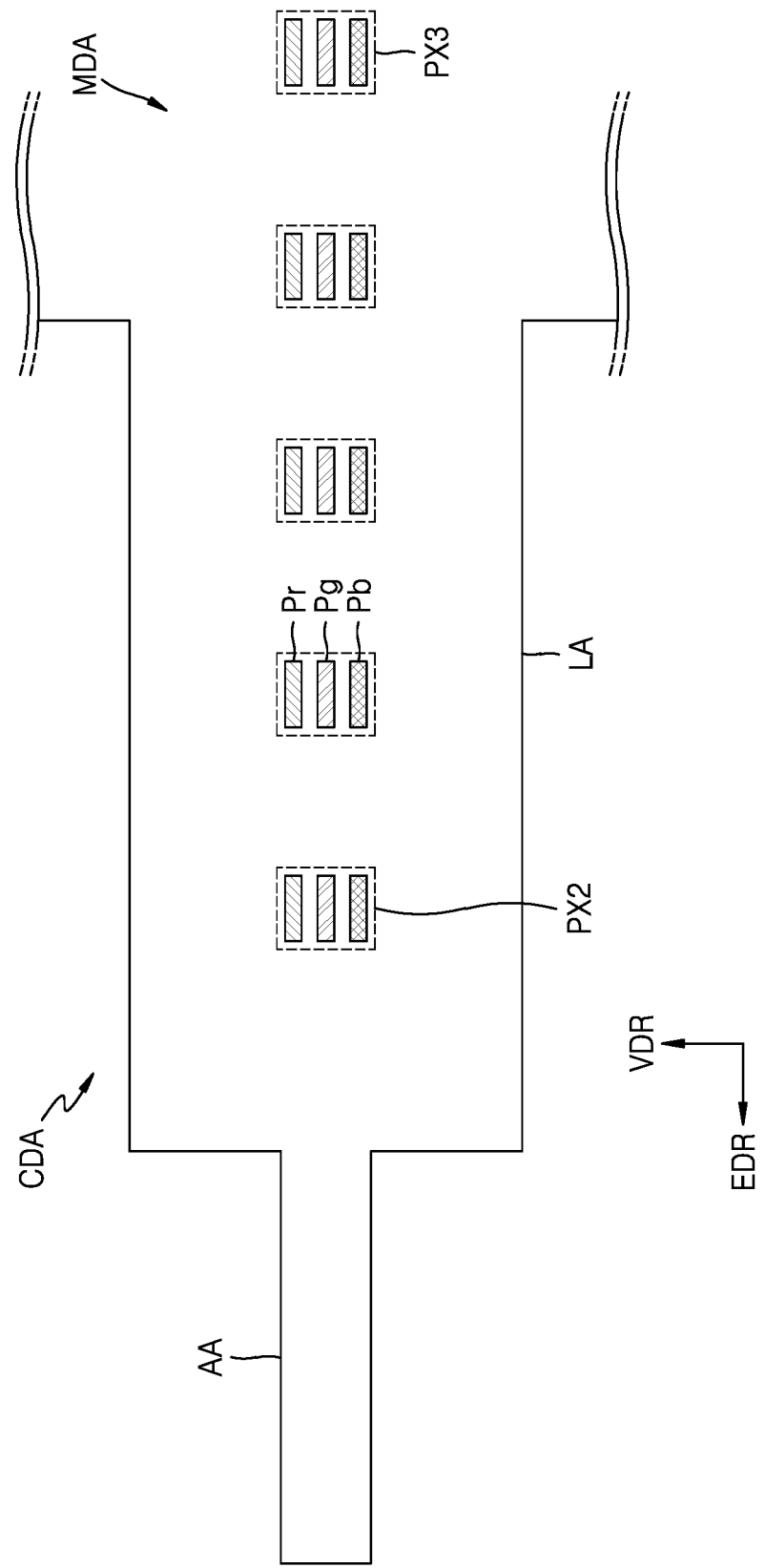
FIGS. 6A-6B are plan views illustrating a subpixel arrangement structure of an extension area according to one or more embodiments.
Figure 6B:
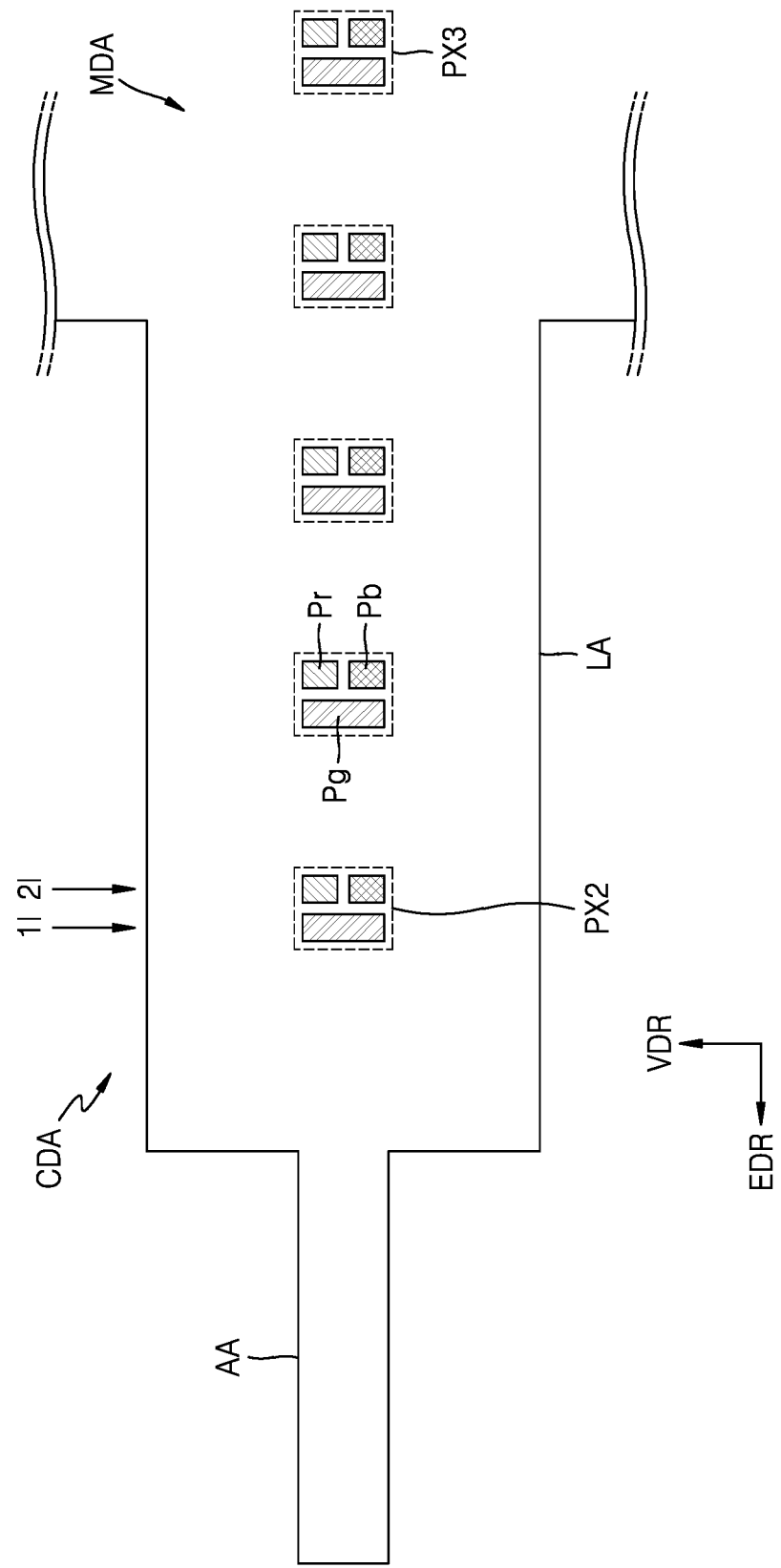

FIGS. 6A and 6B are plan views illustrating a subpixel arrangement structure in the extension area LA according to one or more embodiments.

Referring to FIGS. 6A and 6B, the corner display area CDA may include the extension area LA and the auxiliary area AA, the extension area LA extending from the front display area FDA. The second pixel PX2 may be arranged at (e.g., in or on) the extension area LA. In an embodiment, a plurality of the second pixels PX2 may be arranged side by side along an extension direction EDR of the extension area LA.

The plurality of third pixels PX3 may be arranged at (e.g., in or on) the intermediate display area MDA. In an embodiment, the third pixels PX3 may be arranged side by side along the extension direction EDR. In this case, the third pixels PX3 may be arranged side by side with the plurality of second pixels PX2.

Each of the second pixel PX2 and the third pixel PX3 may include a red subpixel Pr, a green subpixel Pg, and a blue subpixel Pb. The red subpixel Pr, the green subpixel Pg, and the blue subpixel Pb may emit red light, green light, and blue light, respectively. In the present disclosure, the subpixel may correspond to a light-emitting area, which is a minimum unit for implementing an image. When the organic light-emitting diode is used as the display element, the light-emitting area may be defined by an opening in a pixel-defining layer. This will be described in more detail below.

Referring to FIG. 6A, the red subpixel Pr, the green subpixel Pg, and the blue subpixel Pb may have a stripe structure. In other words, the red subpixel Pr, the green subpixel Pg, and the blue subpixel Pb may be arranged side by side along a vertical direction VDR that is perpendicular to or substantially perpendicular to the extension direction EDR. In this case, each of the red subpixels Pr, the green subpixels Pg, and the blue subpixels Pb may be arranged side by side along the extension direction EDR. In addition, the red subpixel Pr, the green subpixel Pg, and the blue subpixel Pb may have a long side extending in the extension direction EDR.

In some embodiments, the red subpixel Pr, the green subpixel Pg, and the blue subpixel Pb may be arranged side by side along the extension direction EDR. In this case, each of the red subpixel Pr, the green subpixel Pg, and the blue subpixel Pb may have a long side extending in the vertical direction VDR.

The red subpixel Pr, the green subpixel Pg, and the blue subpixel Pb of the third pixel PX3 may be arranged side by side with the red subpixel Pr, the green subpixel Pg, and the blue subpixel Pb of the second pixel PX2, respectively.

Referring to FIG. 6B, a subpixel arrangement structure of the second pixel PX2 and a subpixel arrangement structure of the third pixel PX3 may have an S-stripe structure. Each of the second pixel PX2 and the third pixel PX3 may include the red subpixel Pr, the green subpixel Pg, and the blue subpixel Pb.

The green subpixel Pg may be arranged at (e.g., in or on) a first column 11, and the red subpixel Pr and the blue subpixel Pb may be arranged at (e.g., in or on) a second column 21 that is adjacent to the first column 11. In this case, the green subpixel Pg may be arranged in a quadrilateral shape having a long side extending in the vertical direction VDR, and each of the red subpixel Pr and the blue subpixel Pb may be arranged in a quadrilateral shape. In other words, each of a side of the red subpixel Pr and a side of the blue subpixel Pb may face a long side of the green subpixel Pg.

In another embodiment, the subpixel arrangement structure of the second pixel PX2 and the subpixel arrangement structure of the third pixel PX3 may be of an RGBG type (e.g., such as a PENTILE® structure, PENTILE® being a duly registered trademark of Samsung Display Co., Ltd.).

Figure 7:
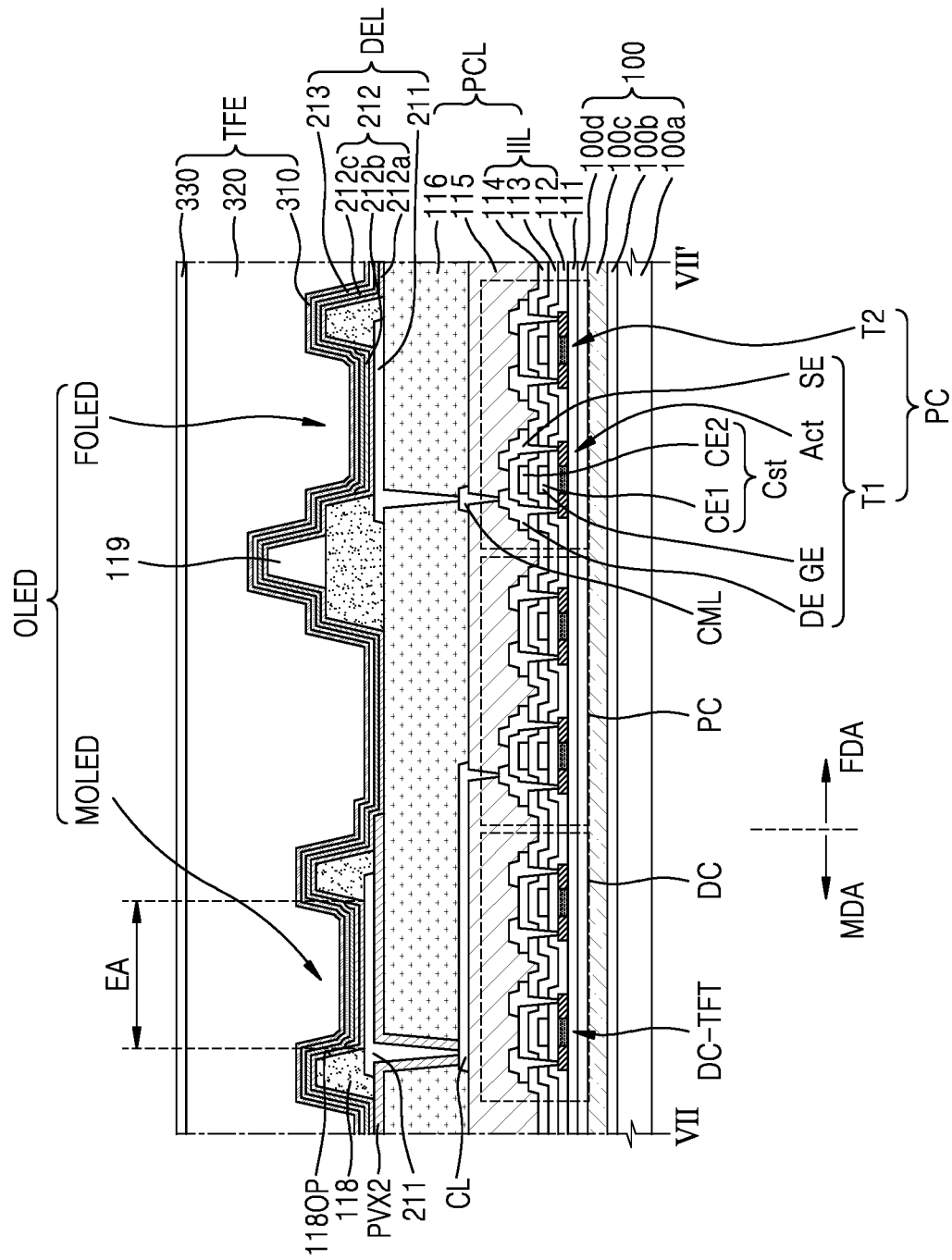
FIG. 7 is a schematic cross-sectional view taken along the line VII-VII' of the display panel of FIG. 5A, according to an embodiment.

FIG. 7 is a schematic cross-sectional view taken along the line VII-VII' of the display panel of FIG. 5A, according to an embodiment.

Referring to FIG. 7, the display panel may include the substrate 100, a buffer layer 111, a pixel circuit layer PCL, an inorganic pattern layer PVX2, a display element layer DEL, and a thin-film encapsulation layer TFE.

The substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be stacked in order on the substrate 100.

At least one of the first base layer 100a and the second base layer 100c may include a polymer resin, for example, such as polyethersulfone, polyarylate, polyetherimide, polyethylene naphthalate, polyethylene terephthalate, polyphenylene sulfide, polyimide, polycarbonate, cellulose triacetate, cellulose acetate propionate, and/or the like.

The first barrier layer 100b and the second barrier layer 100d may prevent or substantially prevent the penetration of foreign substances, and may include a single layer or multiple layers including an inorganic material, for example, such as silicon nitride (SiNx) and/or silicon oxide (SiOx).

The buffer layer 111 may be arranged on the substrate 100. The buffer layer 111 may include a single layer or multiple layers including an inorganic insulating material, for example, such as SiNx, silicon oxynitride (SiON), and/or SiOx.

The pixel circuit layer PCL may be arranged on the buffer layer 111. The pixel circuit layer PCL may include the driving circuit DC and the pixel circuit PC. In an embodiment, the driving circuit DC may be arranged at (e.g., in or on) the intermediate display area MDA. The pixel circuit PC may be arranged at (e.g., in or on) the front display area FDA. In an embodiment, the pixel circuit PC may be spaced apart from the intermediate display area MDA.

The driving circuit DC may include a driving circuit thin-film transistor DC-TFT. In an embodiment, the driving circuit DC may be connected to a scan line. The pixel circuit PC may include the driving thin-film transistor T1, the switching thin-film transistor T2, and the storage capacitor Cst.

The pixel circuit layer PCL may include an inorganic insulating layer IIL, a first insulating layer 115, and a second insulating layer 116 that are arranged on and/or below the elements of the driving thin-film transistor T1. The inorganic insulating layer IIL may include a first gate insulating layer 112, a second gate insulating layer 113, and an interlayer insulating layer 114. The driving thin-film transistor T1 may include a semiconductor layer Act, a gate electrode GE, a source electrode SE, and a drain electrode DE.

The semiconductor layer Act may include polysilicon. In some embodiments, the semiconductor layer Act may include amorphous silicon, a semiconductor oxide, an inorganic semiconductor, or the like. The semiconductor layer Act may include a channel area, a drain area, and a source area. The drain area and the source area may be respectively arranged at opposite sides of the channel area. The gate electrode GE may overlap with the channel area.

The gate electrode GE may include a low-resistance metal material. The gate electrode GE may include a conductive material including molybdenum (Mo), aluminum (Al), copper (Cu), titanium (Ti), or the like, and may include a single layer or multiple layers including one or more of the above materials.

The first gate insulating layer 112 between the semiconductor layer Act and the gate electrode GE may include an inorganic insulating material, for example, such as $SiO_x$, $SiN_x$, SiON, aluminum oxide ($Al_2O_3$), titanium oxide ($TiO_2$), tantalum oxide ($Ta_2O_5$), hafnium oxide ($HfO_2$), zinc oxide (ZnO), or the like.

The second gate insulating layer 113 may cover the gate electrode GE. Similar to the first gate insulating layer 112, the second gate insulating layer 113 may include an inorganic insulating material, for example, such as $SiO_x$, $SiN_x$, SiON, $Al_2O_3$, $TiO_2$, $Ta_2O_5$, $HfO_2$, ZnO, or the like.

An upper electrode CE2 of the storage capacitor Cst may be arranged on the second gate insulating layer 113. The upper electrode CE2 may overlap with the gate electrode GE therebelow. In this case, the gate electrode GE of the driving thin-film transistor T1 and the upper electrode CE2 overlapping with each other with the second gate insulating layer 113 therebetween may form the storage capacitor Cst. In other words, the gate electrode GE of the driving thin-film transistor T1 may serve as a lower electrode CE1 of the storage capacitor Cst.

As described above, the storage capacitor Cst and the driving thin-film transistor T1 may overlap with each other. In some embodiments, the storage capacitor Cst may not overlap with the driving thin-film transistor T1.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may have a single layer or multiple layers including one or more of the above materials.

The interlayer insulating layer 114 may cover the upper electrode CE2. The interlayer insulating layer 114 may include $SiO_x$, $SiN_x$, SiON, $Al_2O_3$, $TiO_2$, $Ta_2O_5$, $HfO_2$, ZnO, or the like. The interlayer insulating layer 114 may include a single layer or multiple layers including one or more of the above inorganic insulating materials.

The drain electrode DE and the source electrode SE may be located on the interlayer insulating layer 114. Each of the drain electrode DE and the source electrode SE may include a material having a suitable conductivity (e.g., a good conductivity). Each of the drain electrode DE and the source electrode SE may include a conductive material including Mo, Al, Cu, Ti, and/or the like, and may have a single layer or multiple layers including one or more of the above materials. In an embodiment, the drain electrode DE and the source electrode SE may have a multi-layered structure of a Ti layer, an Al layer, and another Ti layer.

Similar to the driving thin-film transistor T1, each of the switching thin-film transistor T2 and the driving circuit thin-film transistor DC-TFT may include a semiconductor layer, a gate electrode, a source electrode, and a drain electrode.

The first insulating layer 115 may cover the drain electrode DE and the source electrode SE. The first insulating layer 115 may include an organic material. For example, the first insulating layer 115 may include an organic insulating material, such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any suitable blends thereof.

A connection electrode CML and a connection line CL may be arranged on the first insulating layer 115. In this case, the connection electrode CML and the connection line CL may be connected to the drain electrode DE or the source electrode SE of a corresponding transistor via a contact hole in the first insulating layer 115. Each of the connection electrode CML and the connection line CL may include a material having a suitable conductivity (e.g., a good conductivity). Each of the connection electrode CML and the connection line CL may include a conductive material including Mo, Al, Cu, Ti, and/or the like, and may include a single layer or multiple layers including one or more of the above materials. In an embodiment, each of the connection electrode CML and the connection line CL may have a multi-layered structure of a Ti layer, an Al layer, and another Ti layer.

As shown in FIG. 7, the connection line CL may extend from the front display area FDA to the intermediate display area MDA. In another embodiment, the connection line CL may extend from the peripheral area or the corner display area to the intermediate display area MDA. In another embodiment, the connection line CL may extend from the side display area to the intermediate display area MDA. The connection line CL may overlap with the driving circuit thin-film transistor DC-TFT.

The second insulating layer 116 may cover the connection electrode CML and the connection line CL. The second insulating layer 116 may include an organic insulating layer. For example, the second insulating layer 116 may include an organic insulating material, such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any suitable blends thereof.

The inorganic pattern layer PVX2 may be arranged on the second insulating layer 116. The inorganic pattern layer PVX2 may be provided at (e.g., may overlap with) the intermediate display area MDA. The inorganic pattern layer PVX2 may include a single layer or multiple layers including an inorganic material, for example, such as $SiN_x$, $SiO_x$, and/or the like. In some embodiments, the inorganic pattern layer PVX2 may be omitted.

The display element layer DEL may be arranged on the pixel circuit layer PCL. The display element layer DEL may include the organic light-emitting diode OLED. The display element layer DEL may include a front organic light-emitting diode FOLED arranged at (e.g., in or on) the front display area FDA, and an intermediate organic light-emitting diode MOLED arranged at (e.g., in or on) the intermediate display area MDA. The intermediate organic light-emitting diode MOLED may be arranged on the inorganic pattern layer PVX2, and may overlap with the driving circuit DC. Thus, in the present embodiment, an image may also be displayed at (e.g., in or on) the intermediate display area MDA where the driving circuit DC is arranged.

A pixel electrode 211 of the front organic light-emitting diode FOLED may be electrically connected to the connection electrode CML via a contact hole in the second insulating layer 116. The pixel electrode 211 of the intermediate organic light-emitting diode MOLED may be connected to the connection line CL via a contact hole in the second insulating layer 116.

The pixel electrode 211 may include a conductive oxide, for example, such as indium tin oxide (ITO), indium zinc oxide (IZO), ZnO, indium oxide ($In_2O_3$), indium gallium oxide (IGO), or aluminum zinc oxide (AZO). In another embodiment, the pixel electrode 211 may include a reflective film formed of Ag, Mg, Al, platinum Pt, Pd, Au, Ni, Nd, Ir, Cr, or any suitable compounds thereof. In another embodiment, the pixel electrode 211 may further include a film including ITO, IZO, ZnO, or $In_2O_3$, on or below the above-described reflective film.

A pixel-defining layer 118 may be arranged on the pixel electrode 211. The pixel-defining layer 118 may include an opening 1180P through which a central portion of the pixel electrode 211 is exposed. The pixel-defining layer 118 may include an organic insulating layer and/or an inorganic insulating layer. The opening 1180P may define an emission area of the light emitted by the organic light-emitting diode OLED (hereinafter referred to as an emission area EA). For example, a width of the opening 1180P may correspond to a width of the emission area EA. In addition, the width of the opening 1180P may correspond to a width of a subpixel.

A spacer 119 may be arranged on the pixel-defining layer 118. In a method of manufacturing the display device, the spacer 119 may prevent or substantially prevent damage from being caused to the substrate 100 and/or a multi-layered film on the substrate 100. For example, a mask sheet may be used in the method of manufacturing the display device, and in this case, the mask sheet may enter the opening 1180P of the pixel-defining layer 118 or may adhere to the pixel-defining layer 118. Thus, the spacer 119 may prevent or substantially prevent a portion of the substrate 100 or the multi-layered film from being damaged or destroyed by the mask sheet when a deposition material is deposited on the substrate 100.

The spacer 119 may include an organic material, for example, such as polyimide. In some embodiments, the spacer 119 may include an inorganic insulating layer, for example, such as $SiN_x$ or $SiO_x$, or may include an organic insulating material and an inorganic insulating material.

In an embodiment, the spacer 119 may include a material that is different from a material of the pixel-defining layer 118. In another embodiment, the spacer 119 may include the same or substantially the same material as that of the pixel-defining layer 118. In this case, the pixel-defining layer 118 and the spacer 119 may be formed together by a mask process using a halftone mask or the like.

An intermediate layer 212 may be arranged on the pixel-defining layer 118. The intermediate layer 212 may include an emission layer 212b in the opening 1180P of the pixel-defining layer 118. The emission layer 212b may include a polymer or a low molecular weight inorganic material for emitting light of a suitable color.

A first functional layer 212a may be arranged below the emission layer 212b, and a second functional layer 212c may be arranged on (e.g., above) the emission layer 212b. For example, the first functional layer 212a may include a hole transport layer (HTL), or may include the HTL and a hole injection layer (HIL). The second functional layer 212c may be arranged on the emission layer 212b, and may be optional according to a structure of the intermediate layer 212. The second functional layer 212c may include an electron transport layer (ETL) and/or an electron injection layer (EIL). Like the opposite electrode 213, which will be described in more detail below, the first functional layer 212a and/or the second functional layer 212c may be common layers that cover an entirety the substrate 100.

The opposite electrode 213 may include a conductive material having a low work function. For example, the opposite electrode 213 may include a (semi-) transparent layer (e.g., a transparent layer or a semi-transparent layer) including Ag, Mg, Al, Pt, Pd, Au, Ni, Nd, Ir, Cr, Li, Ca, or any suitable alloys thereof. As another example, the opposite electrode 213 may further include a layer formed of, for example, ITO, IZO, ZnO, or $In_2O_3$, on the (semi-) transparent layer including one or more of the above materials.

In some embodiments, a capping layer may be further arranged on the opposite electrode 213. The capping layer may include lithium fluoride (LiF), an inorganic material, and/or an organic material.

The thin-film encapsulation layer TFE may be arranged on the opposite electrode 213. In an embodiment, the thin-film encapsulation layer TFE may include at least one inorganic encapsulation layer, and at least one organic encapsulation layer. As shown in FIG. 7, in an embodiment, the thin-film encapsulation layer TFE includes a first inorganic encapsulation layer 310, an organic encapsulation layer 320, and a second inorganic encapsulation layer 330 that are sequentially stacked on one another.

The first inorganic encapsulation layer 310 and the second inorganic encapsulation layer 330 may include one or more inorganic materials selected from among $Al_2O_3$, $TiO_2$, $Ta_2O_5$, $HfO_2$, ZnO, $SiO_x$, $SiN_x$, and SiON. The organic encapsulation layer 320 may include a polymer-based material. The polymer-based material may include an acrylic resin, an epoxy resin, polyimide, polyethylene, and/or the like. In an embodiment, the organic encapsulation layer 320 may include acrylate.

Although not shown, a touch electrode layer may be arranged on the thin-film encapsulation layer TFE, and an optical functional layer may be arranged on the touch electrode layer. The touch electrode layer may obtain coordinate information according to an external input, for example, such as a touch event. The optical functional layer may reduce a reflectance of light (e.g., external light) that is incident from the outside onto the display device, and/or may improve the saturation of the light emitted from the display device. In an embodiment, the optical functional layer may include a retarder and/or a polarizer. The retarder may be of a film type or a liquid-crystal coating type, and may include a half-wave ($\lambda/2$) retarder and/or a quarter-wave ($\lambda/4$) retarder. The polarizer may also be of a film type or a liquid-crystal coating type. The polarizer of the film type may include an elongated synthetic resin film, and the polarizer of the liquid-crystal coating type may include liquid crystals arranged with a suitable orientation (e.g., a certain or predetermined orientation). The retarder and the polarizer may further include a protective film.

In another embodiment, the optical functional layer may include a black matrix and color filters. The color filters may be arranged based on the color of light emitted by each pixel PX of the display device. Each of the color filters may include a red, green, or blue pigment or dye. In some embodiments, each of the color filters may further include quantum dots, in addition to the above-described pigment or dye. As another example, some of the color filters may not include the above-described pigment or dye, and may include scattering particles, for example, such as $TiO_2$.

In another embodiment, the optical functional layer may include a destructive interference structure. The destructive interference structure may include a first reflective layer and a second reflective layer located at (e.g., in or on) different layers from each other. First reflected light and second reflected light that are reflected by the first reflective layer and the second reflective layer, respectively, may destructively interfere with each other, thereby reducing the reflectance of the external light.

An adhesive member may be arranged between the touch electrode layer and the optical functional layer. Any suitable ones of general adhesives that are known by those having ordinary skill in the art may be used as the adhesive member. For example, the adhesive member may be a pressure-sensitive adhesive (PSA).

Figure 8:
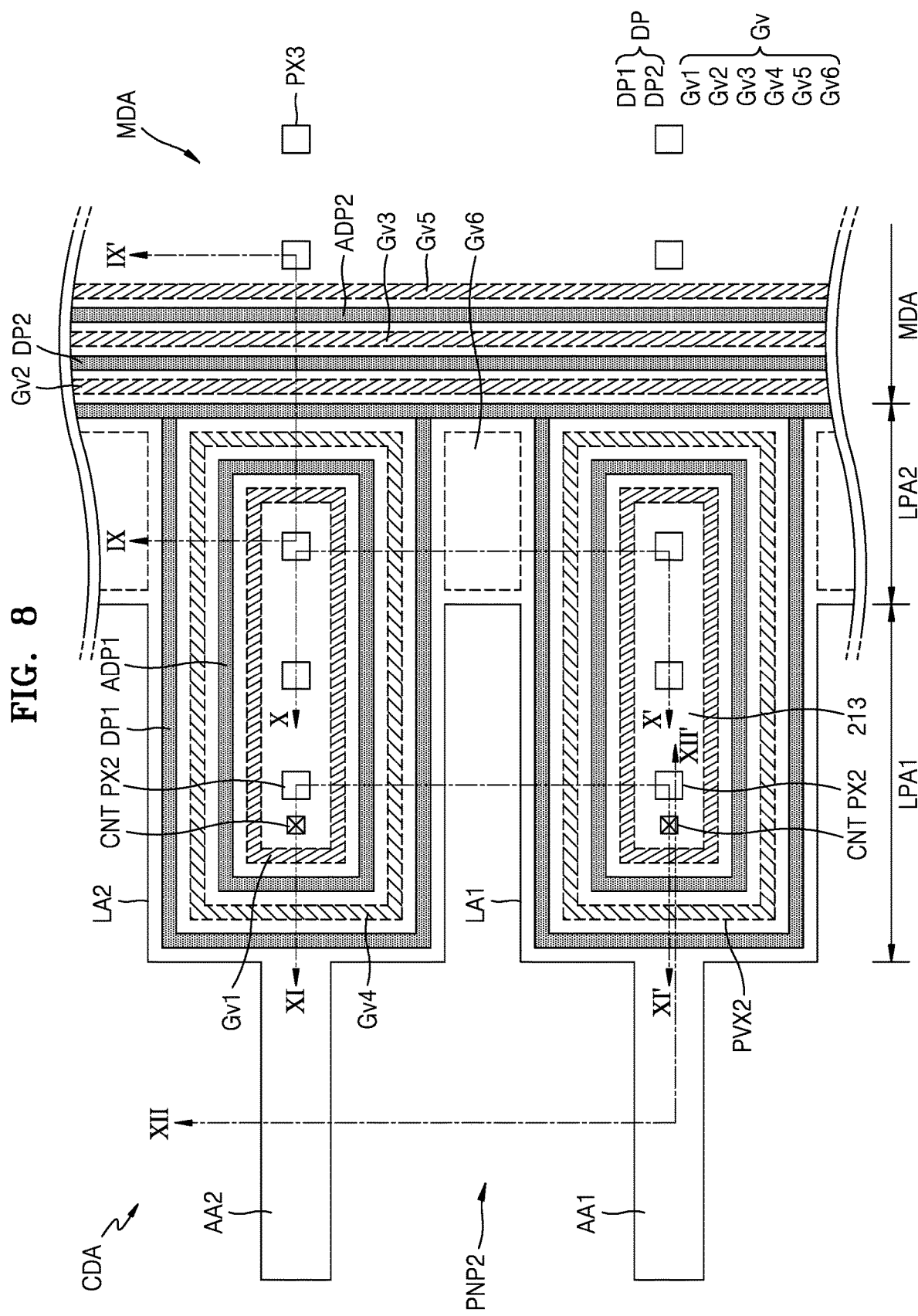
FIG. 8 is a plan view schematically illustrating a corner display area and an intermediate display area according to an embodiment.

FIG. 8 is a plan view schematically illustrating the corner display area CDA and the intermediate display area MDA according to an embodiment.

Referring to FIG. 8, the corner display area CDA may include the first extension area LA1, and the second extension area LA2, each extending from the front display area and/or the intermediate display area MDA. The first auxiliary area AA1 may be connected to the first extension area LA1, and the second auxiliary area AA2 may be connected to the second extension area LA2. The second through portion PNP2 penetrating into the display panel may be defined among the first extension area LA1, the second extension area LA2, the first auxiliary area AA1, and the second auxiliary area AA2.

The plurality of second pixels PX2 may be arranged at (e.g., in or on) the first extension area LA1 and the second extension area LA2, and the plurality of third pixels PX3 may be arranged at (e.g., in or on) the intermediate display area MDA. The plurality of second pixels PX2 and the plurality of third pixels PX3 may be arranged side by side in the extension direction of the first extension area LA1. In addition, the plurality of second pixels PX2 and the plurality of third pixels PX3 may be arranged side by side in the extension direction of the second extension area LA2.

The first extension area LA1 and the second extension area LA2 may be at least partially connected to each other.

For example, the corner display area CDA may include a first area LPA1 and a second area LPA2. The second area LPA2 may be arranged between the first area LPA1 and the intermediate display area MDA. In this case, the first extension area LA1 and the second extension area LA2 may be connected to each other at (e.g., in or on) the second area LPA2. In other words, the first extension area LA1 and the second extension area LA2 may be provided as a single body in the second area LPA2.

A groove Gv may be included in the corner display area CDA and the intermediate display area MDA. The groove Gv may be concave from a reference surface toward a thickness direction of the substrate. In the present specification, at least one of the grooves Gv may be arranged at (e.g., in or on) the first extension area LA1 and/or the second extension area LA2. The groove Gv may include a first groove Gv1, a second groove Gv2, a third groove Gv3, a fourth groove Gv4, a fifth groove Gv5, and a sixth groove Gv6.

The first groove Gv1 may be arranged in the first extension area LA1 and/or the second extension area LA2. In an embodiment, the first groove Gv1 may surround (e.g., around a periphery of) the plurality of second pixels PX2. In another embodiment, the first groove Gv1 may individually surround (e.g., around a periphery of) the second pixel PX2.

The second groove Gv2 may be arranged between the second pixel PX2 and the third pixel PX3. In an embodiment, the second groove Gv2 may extend in a direction in which the first extension area LA1 and the second extension area LA2 are spaced apart from each other. For example, the second groove Gv2 may extend in one direction (e.g., in a direction in which the intermediate area MDA extends). The second groove Gv2 may extend along an edge of the intermediate display area MDA.

The third groove Gv3 may be arranged between the second groove Gv2 and the third pixel PX3. In an embodiment, the third groove Gv3 may extend to be parallel to or substantially parallel to the second groove Gv2. For example, the third groove Gv3 may extend in the direction (e.g., the one direction) in which the first extension area LA1 and the second extension area LA2 are spaced apart from each other.

The fourth groove Gv4 may be arranged in the first extension area LA1 and/or the second extension area LA2. The fourth groove Gv4 may surround (e.g., around a periphery of) the first groove Gv1. For example, the fourth groove Gv4 may surround (e.g., around a periphery of) the plurality of second pixels PX2 and (e.g., around a periphery of) the first groove Gv1.

The fifth groove Gv5 may be arranged between the third groove Gv3 and the third pixel PX3. In an embodiment, the fifth groove Gv5 may extend to be parallel to or substantially parallel to the second groove Gv2 and/or the third groove Gv3. For example, the fifth groove Gv5 may extend in the direction (e.g., the one direction) in which the first extension area LA1 and the second extension area LA2 are spaced apart from each other.

The sixth groove Gv6 may be arranged in the second area LPA2. The sixth groove Gv6 may be arranged between the fourth groove Gv4 of the first extension area LA1 and the fourth groove Gv4 of the second extension area LA2 that are adjacent to each other.

The inorganic pattern layer PVX2 may be arranged at opposite sides of the groove Gv, and may have a pair of protruding tips protruding toward the center of the groove Gv. The inorganic pattern layer PVX2 is shown by dotted lines in FIG. 8.

When a display element included in the second pixel PX2 is an organic light-emitting diode, the organic light-emitting diode may include a pixel electrode, an intermediate layer including an emission layer, and the opposite electrode 213. In addition, the intermediate layer may include a first functional layer arranged between the pixel electrode and the emission layer, and/or a second functional layer arranged between the emission layer and the opposite electrode 213. The first functional layer and the second functional layer may be formed on the entire surface of the intermediate display area MDA, the first extension area LA1, and the second extension area LA2. The first functional layer and the second functional layer may include an organic material, and external oxygen, moisture, and/or the like may be transferred into the intermediate display area MDA, the first extension area LA1, and the second extension area LA2 through the first extension area LA1 and the second extension area LA2. In this case, the oxygen and/or moisture may damage the organic light-emitting diode arranged at (e.g., in or on) the intermediate display area MDA, the first extension area LA1, and the second extension area LA2. In the present embodiment, however, the first functional layer and the second functional layer may be disconnected from each other by the groove Gv and the protruding tips of the inorganic pattern layer PVX2, and thus, the inflow of moisture and/or oxygen to the organic light-emitting diode from the outside may be prevented or substantially prevented. Accordingly, damage to the organic light-emitting diode may be prevented or substantially prevented.

The display panel may include a dam portion DP on the substrate. The dam portion DP may protrude in the thickness direction of the substrate from the reference surface. For example, the dam portion DP may protrude in the thickness direction of the substrate from an upper surface of the inorganic pattern layer PVX2. The dam portion DP may include a first dam portion DP1 and a second dam portion DP2. At least one of the dam portions DP may surround (e.g., around a periphery of) the second pixel PX2. In other words, at least one of the dam portions DP may surround (e.g., around a periphery of) the display element of the second pixel PX2.

The first dam portion DP1 may surround (e.g., around a periphery of) the plurality of second pixels PX2. The first dam portion DP1 may surround (e.g., around peripheries of) the first groove Gv1 and the fourth groove Gv4. In an embodiment, a portion of the first dam portion DP1 may extend in the direction (e.g., the one direction) in which the first extension area LA1 and the second extension area LA2 are spaced apart from each other. For example, the first dam portion DP1 may extend along the edge of the intermediate display area MDA.

The second dam portion DP2 may be arranged between the first dam portion DP1 and the third pixel PX3. For example, the second dam portion DP2 may be arranged between the second groove Gv2 and the third groove Gv3. In this case, the second dam portion DP2 may extend in the direction (e.g., the one direction) in which the second groove Gv2 and/or the third groove Gv3 extend. The second dam portion DP2 may extend in the direction in which the first extension area LA1 and the second extension area LA2 are spaced apart from each other.

A first auxiliary dam portion ADP1 may be arranged between the second pixel PX2 and the first dam portion DP1. The first auxiliary dam portion ADP1 may be arranged between the first groove Gv1 and the fourth groove Gv4. Thus, the first auxiliary dam portion ADP1 may surround (e.g., around a periphery of) the second pixel PX2 and (e.g., around a periphery of) the first groove Gv1.

A second auxiliary dam portion ADP2 may be arranged between the third pixel PX3 and the second dam portion DP2. The second auxiliary dam portion ADP2 may be arranged between the third groove Gv3 and the fifth groove Gv5. In this case, the second auxiliary dam portion ADP2 may extend in the direction in which the third groove Gv3 and/or the fifth groove Gv5 extend. For example, the second auxiliary dam portion ADP2 may extend in the direction in which the first extension area LA1 and the second extension area LA2 are spaced apart from each other.

The first auxiliary dam portion ADP1 and the second auxiliary dam portion ADP2 may be arranged on the inorganic pattern layer PVX2, and may protrude in the thickness direction of the substrate from the upper surface of the inorganic pattern layer PVX2. Each of a thickness of the first auxiliary dam portion ADP1 and a thickness of the second auxiliary dam portion ADP2 may be less than a thickness of the dam portion DP.

In a case where the display element included in the second pixel PX2 is an organic light-emitting diode, the organic light-emitting diode may be vulnerable to oxygen and moisture, as described above. Thus, a thin-film encapsulation layer for encapsulating the organic light-emitting diode may be arranged on the second pixel PX2. The thin-film encapsulation layer may include at least one inorganic encapsulation layer and at least one organic encapsulation layer. The dam portion DP may protrude in the thickness direction of the substrate from the upper surface of the inorganic pattern layer PVX2, and thus, may control a flow of the at least one organic encapsulation layer. In this case, the dam portion DP may separate the at least one organic encapsulation layer. In addition, the at least one organic encapsulation layer may be filled in the first groove Gv1, the third groove Gv3, the fourth groove Gv4, and the fifth groove Gv5.

One of the multi-layered films arranged at (e.g., in or on) the first extension area LA1 and/or the second extension area LA2 may include a contact hole CNT corresponding to an end of the first extension area LA1 and/or the second extension area LA2. The contact hole CNT may be arranged inside (e.g., within) the first groove Gv1. In other words, the contact hole CNT may be surrounded (e.g., around a periphery thereof) by the first groove Gv1. The contact hole CNT may be arranged between the first groove Gv1 and the second pixel PX2 that is the farthest away from the intermediate display area MDA. In the present embodiment, similar to the first functional layer or the second functional layer, the opposite electrode 213 may be formed on the entire surface of the intermediate display area MDA and the extension area LA. Even in this case, the opposite electrode 213 may be disconnected based on the groove Gv. Thus, a connection line for power supply may be arranged at (e.g., in or on) the first extension area LA1 and/or the second extension area LA2, and may apply the second voltage ELVSS (e.g., see FIG. 3) to the second pixel PX2 via the contact hole CNT.

Figure 9A:
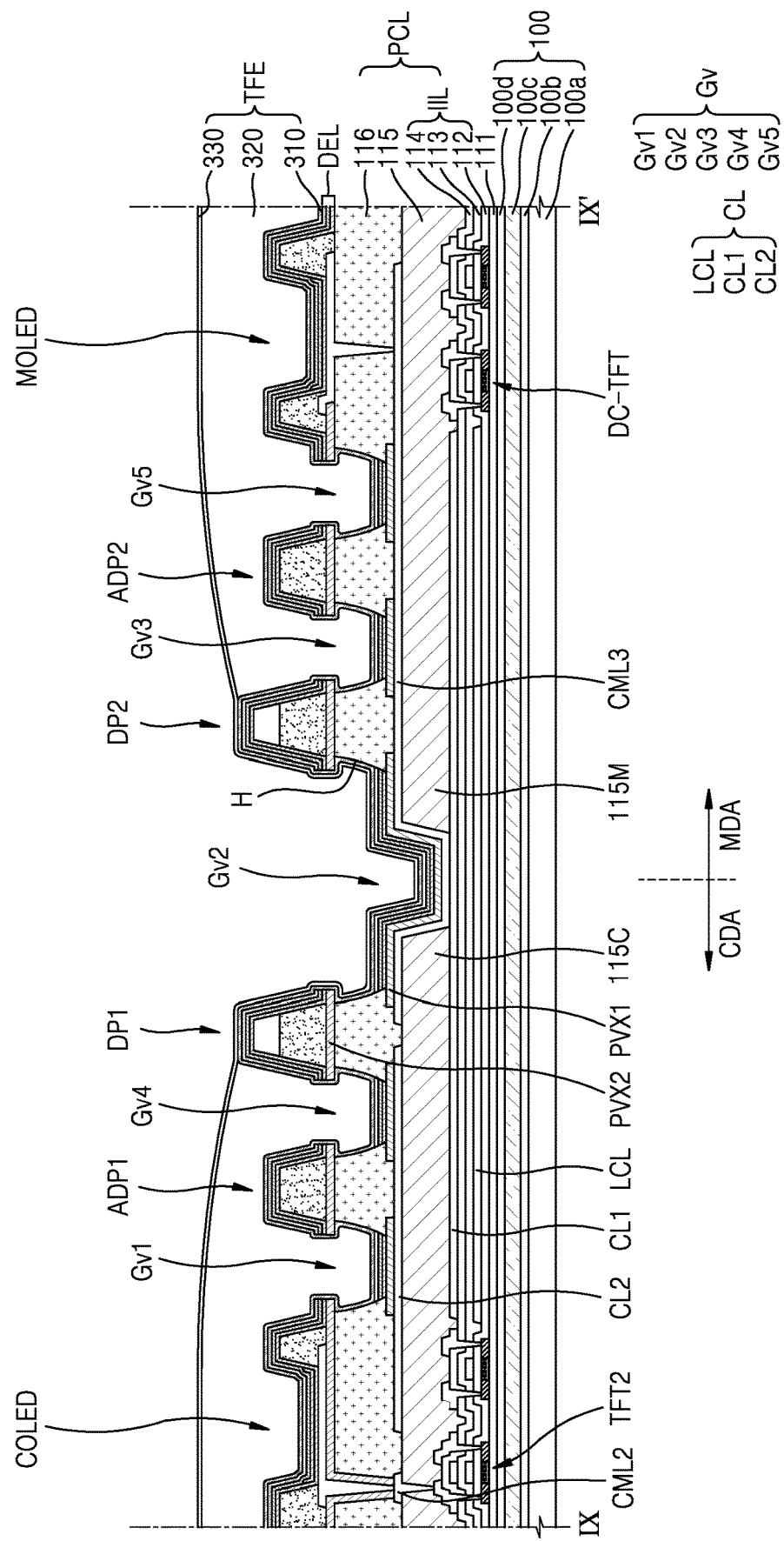
FIG. 9A is a cross-sectional view taken along the line IX-IX' of the display panel of FIG. 8, according to an embodiment.
Figure 9B:
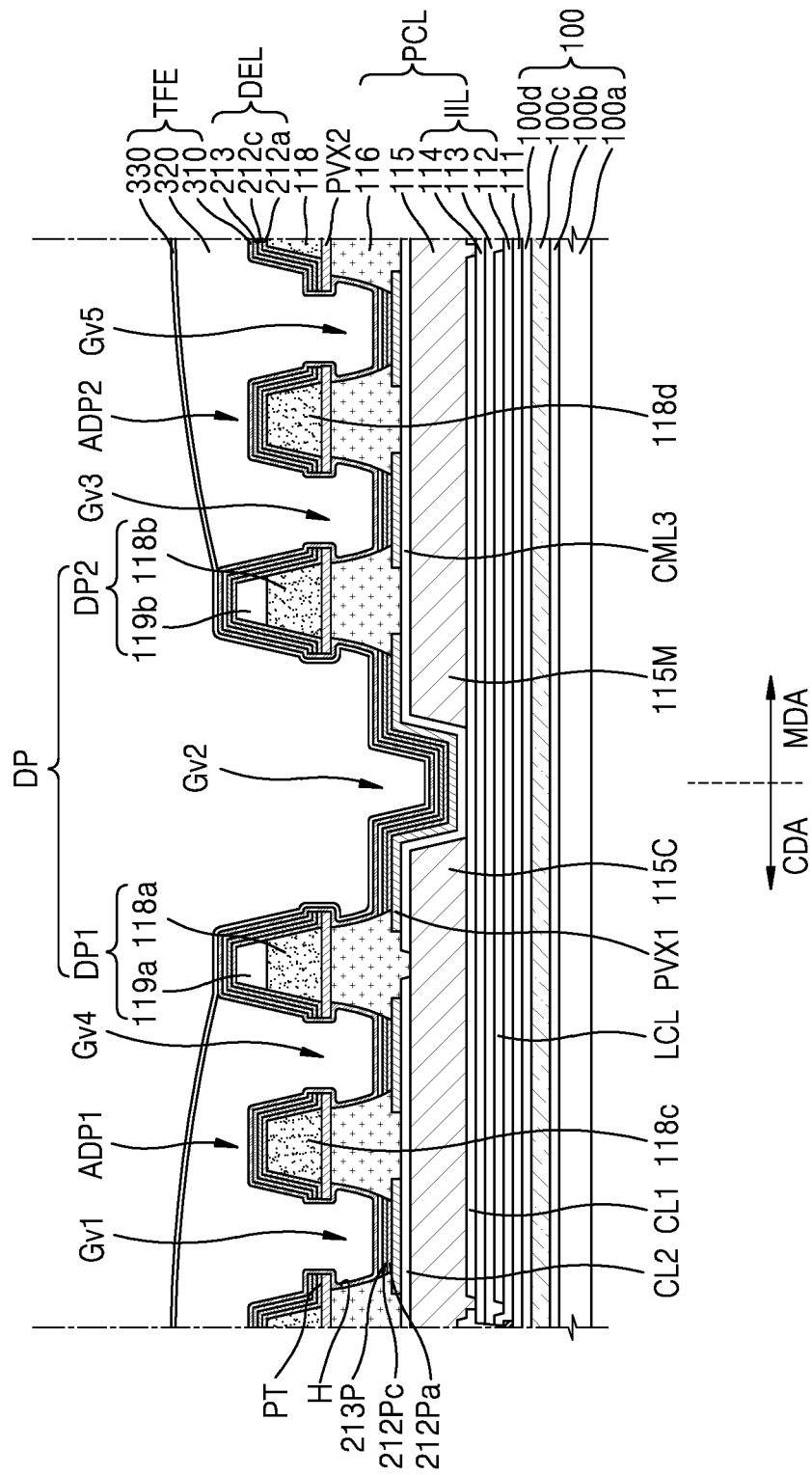
FIG. 9B is an enlarged view of a groove and a dam portion shown in FIG. 9A, according to an embodiment.

FIG. 9A is a cross-sectional view taken along the line IX-IX' of the display panel of FIG. 8, according to an embodiment. FIG. 9B is an enlarged view of the display panel including a groove and a dam portion of FIG. 9A according to an embodiment. In FIGS. 9A and 9B, the same reference symbols as those of FIGS. 7 and 8 are used to denote the same or substantially the same elements, and thus, redundant descriptions thereof may not be repeated.

Referring to FIGS. 9A and 9B, the display panel may include the corner display area CDA and the intermediate display area MDA. A second thin-film transistor TFT2 and a corner organic light-emitting diode COLED may be arranged at (e.g., in or on) the corner display area CDA, and the intermediate organic light-emitting diode MOLED may be arranged at (e.g., in or on) the intermediate display area MDA. The second thin-film transistor TFT2 and the corner organic light-emitting diode COLED may implement a subpixel at (e.g., in or on) the corner display area CDA, and the intermediate organic light-emitting diode MOLED may implement a subpixel at (e.g., in or on) the intermediate display area MDA.

One of the intermediate organic light-emitting diodes MOLED may be closest to the edge of the intermediate display area MDA, and may face (e.g., may be adjacent to) the corner organic light-emitting diode COLED.

The substrate 100, the buffer layer 111, the pixel circuit layer PCL, the display element layer DEL, and the thin-film encapsulation layer TFE may be arranged at (e.g., in or on) the intermediate display area MDA and the corner display area CDA. The pixel circuit layer PCL may include the inorganic insulating layer IIL, the connection line CL, the first insulating layer 115, the second insulating layer 116, and the inorganic pattern layer PVX2. The connection line CL may include a lower connection line LCL, a first connection line CL1, and a second connection line CL2.

In an embodiment, the lower connection line LCL may be arranged between the first gate insulating layer 112 and the second gate insulating layer 113. In another embodiment, the lower connection line LCL may be arranged between the second gate insulating layer 113 and the interlayer insulating layer 114. In this case, the lower connection line LCL may include the same or substantially the same material as that of one of the gate electrode GE or the upper electrode CE2 of FIG. 7.

In another embodiment, the lower connection line LCL may be arranged between the buffer layer 111 and the first gate insulating layer 112. In this case, the lower connection line LCL may include the same or substantially the same material as that of the semiconductor layer Act of FIG. 8.

The lower connection line LCL may extend from the intermediate display area MDA to the corner display area CDA. The lower connection line LCL may correspond to a signal line for providing an electrical signal to the corner organic light-emitting diode COLED, or a power line for power supply.

The first connection line CL1 may be arranged on the inorganic insulating layer IIL, and the first insulating layer 115 may be arranged on the first connection line CL1. The first insulating layer 115 may be divided into a corner insulating layer 115C and an intermediate insulating layer 115M with respect to the groove Gv. In an embodiment, the first insulating layer 115 may be divided into the corner insulating layer 115C and the intermediate insulating layer 115M with respect to the second groove Gv2. The corner insulating layer 115C may cover the second thin-film transistor TFT2, and the intermediate insulating layer 115M may cover the driving circuit thin-film transistor DC-TFT. In an embodiment, a portion of the first connection line CL1 may be exposed between the corner insulating layer 115C and the intermediate insulating layer 115M.

The second connection line CL2, a second connection electrode CML2, and a third connection electrode CML3 may be arranged on the first insulating layer 115. The second connection electrode CML2 may be arranged on the corner insulating layer 115C. In some embodiments, the third connection electrode CML3 may be a part of the second connection line CL2.

The third connection electrode CML3 may be arranged on the intermediate insulating layer 115M. In an embodiment, the third connection electrode CML3 may be connected to the first connection line CL1. In this case, the third connection electrode CML3 may extend from the intermediate insulating layer 115M to the corner insulating layer 115C, and may cover a side surface of the intermediate insulating layer 115M and a side surface of the corner insulating layer 115C that face each other. In addition, the third connection electrode CML3 may be connected to the first connection line CL1 that is exposed between the corner insulating layer 115C and the intermediate insulating layer 115M. Thus, the first connection line CL1 and the third connection electrode CML3 may prevent or substantially prevent external moisture from penetrating into the corner organic light-emitting diode COLED or the intermediate organic light-emitting diode MOLED.

A lower inorganic pattern layer PVX1 may be arranged on the second connection line CL2 and the third connection electrode CML3. In an embodiment, a plurality of lower inorganic pattern layers PVX1 may be arranged on the second connection line CL2 and/or the third connection electrode CML3, and may be spaced apart from each other on the second connection line CL2 and/or the third connection electrode CML3. In the present embodiment, one of the lower inorganic pattern layers PVX1 may cover the side surface of the intermediate insulating layer 115M and the side surface of the corner insulating layer 115C that face each other.

The second insulating layer 116 may cover the second connection line CL2, the second electrode CML2, and the third connection electrode CML3. In an embodiment, the groove Gv may be defined in the lower inorganic pattern layer PVX1 and the second insulating layer 116. The groove Gv may be concave in the thickness direction of the substrate 100 from the upper surface of the second insulating layer 116. The second insulating layer 116 may include a hole H, and the hole H may expose a portion of the lower inorganic pattern layer PVX1. In addition, the second insulating layer 116 may cover the edge of the lower inorganic pattern layer PVX1. Thus, the groove Gv may be defined as the central portion of the lower inorganic pattern layer PVX1 and the hole H of the second insulating layer 116.

The hole H of the second insulating layer 116 may be formed by an etching process. In a case where the lower inorganic pattern layer PVX1 is omitted, the second connection line CL2 may be etched by the etching process. In this case, a resistance of the second connection line CL2 may increase. In the present embodiment, however, the lower inorganic pattern layer PVX1 may overlap with the hole H of the second insulating layer 116 on the second connection line CL2, and thus, the second connection line CL2 may be prevented or substantially prevented from being etched.

The inorganic pattern layer PVX2 may be arranged on the second insulating layer 116. The inorganic pattern layer PVX2 may be arranged at opposite sides of the groove Gv, and may have a pair of protruding tips PT protruding toward the center of the groove Gv.

The first functional layer 212a, the second functional layer 212c, and the opposite electrode 213 arranged on the inorganic pattern layer PVX2 may be disconnected (e.g., may each include disconnected portions) by the groove Gv and the pair of protruding tips PT. In addition, a first functional layer pattern 212Pa, a second functional layer pattern 212Pc, and an opposite electrode pattern 213P may be arranged in the groove Gv.

The dam portion DP that protrudes in the thickness direction of the substrate 100 from the upper surface of the inorganic pattern layer PVX2 may be on the inorganic pattern layer PVX2. The dam portion DP may include the first dam portion DP1 and the second dam portion DP2 that are spaced apart from each other. The dam portion DP and the groove Gv may be alternately arranged.

The dam portion DP may include a first layer 118a and 118b and a second layer 119a and 119b on the first layer 118a and 118b. In this case, the first layer 118a and 118b may include the same or substantially the same material as that of the pixel-defining layer 118. In addition, the first layer 118a and 118b may be formed concurrently (e.g., simultaneously) when the pixel-defining layer 118 is formed. The second layer 119a and 119b may include the same or substantially the same material as that of the spacer 119 (e.g., see FIG. 7). In addition, the second layer 119a and 119b may be formed concurrently (e.g., simultaneously) when the spacer 119 is formed.

The first auxiliary dam portion ADP1 may be arranged between the corner organic light-emitting diode COLED and the first dam portion DP1. In addition, the first auxiliary dam portion ADP1 may be arranged between the first groove Gv1 and the fourth groove Gv4. The second auxiliary dam portion ADP2 may be arranged between the intermediate organic light-emitting diode MOLED and the second dam portion DP2. In addition, the second auxiliary dam portion ADP2 may be arranged between the third groove Gv3 and the fifth groove Gv5.

Each of the first auxiliary dam portion ADP1 and the second auxiliary dam portion ADP2 may be arranged on the inorganic pattern layer PVX2, and may protrude in the thickness direction of the substrate 100 from the upper surface of the inorganic pattern layer PVX2. Each of the first auxiliary dam portion ADP1 and the second auxiliary dam portion ADP2 may include a first layer 118c and 118d. In this case, the first layer 118c and 118d may include the same or substantially the same material as that of the pixel-defining layer 118.

A thickness of the dam portion DP may be greater than a thickness of the first auxiliary dam portion ADP1. Likewise, the thickness of the dam portion DP may be greater than a thickness of the second auxiliary dam portion ADP2. For example, the dam portion DP may include the first layer 118a and 118b and the second layer 119a and 119b, and each of the first auxiliary dam portion ADP1 and the second auxiliary dam portion ADP2 may include the first layer 118c and 118d without a corresponding second layer. Thus, a thickness of the dam portion DP may be different from a thickness of the first auxiliary dam portion ADP1 and a thickness of the second auxiliary dam portion ADP2. In this case, the thickness of the dam portion DP may correspond to a distance between the upper surface of the inorganic pattern layer PVX2 and the upper surface of the second layer 119a and 119b. The thickness of the first auxiliary dam portion ADP1 or the thickness of the second auxiliary dam portion ADP2 may correspond to a distance between the upper surface of the inorganic pattern layer PVX2 and the upper surface of the first layer 118c and 118d.

The distance between the upper surface of the substrate 100 and the upper surface of the second layer 119a and 119b may be greater than the distance between the upper surface of the substrate 100 and the upper surface of the first layer 118c of the first auxiliary dam portion ADP1. Likewise, the distance between the upper surface of the substrate 100 and the upper surface of the second layer 119a and 119b may be greater than the distance between the upper surface of the substrate 100 and the upper surface of the first layer 118d of the second auxiliary dam portion ADP2.

The second layer 119a and 119b of the dam portion DP may perform a function that is the same or substantially the same as (or similar to) a function of the spacer 119 of FIG. 7. For example, in the method of manufacturing the display panel, the second layer 119a and 119b of the dam portion DP may prevent or substantially prevent at least one of the pixel circuit layer PCL and/or the display element layer DEL from being damaged by the mask sheet. In this case, the second layer 119a and 119b of the dam portion DP may contact the mask sheet, and may be deformed. When the second layer 119a and 119b of the dam portion DP is deformed, the first inorganic encapsulation layer 310 may be formed based on the deformed shape of the second layer 119a and 119b of the dam portion DP, and thus, barrier properties thereof may be weakened.

In the present disclosure, the first auxiliary dam portion ADP1 and the second auxiliary dam portion ADP2 may be arranged between the organic light-emitting diode and the dam portion DP. The thickness of the first auxiliary dam portion ADP1 and the thickness of the second auxiliary dam portion ADP2 may be less than the thickness of the dam portion DP. Thus, neither the first auxiliary dam portion ADP1 nor the second auxiliary dam portion ADP2 may contact the mask sheet. Thus, the first inorganic encapsulation layer 310 may be formed on the upper surface of the first auxiliary dam portion ADP1 and the upper surface of the second auxiliary dam portion ADP2 that are flat or substantially flat. Accordingly, a time at which ambient air and/or moisture from the outside reaches the organic light-emitting diode may be delayed, and thus, the barrier characteristics of the first inorganic encapsulation layer 310 may be enhanced.

In some embodiments, similar to the first dam portion DP1 and the second dam portion DP2, the first auxiliary dam portion ADP1 and the second auxiliary dam portion ADP2 may include a second layer including the same or substantially the same material as that of the spacer 119. In this case, the first auxiliary dam portion ADP1 and the second auxiliary dam portion ADP2 may have the same or substantially the same thickness as that of the dam portion DP.

The thin-film encapsulation layer TFE may cover the corner organic light-emitting diode COLED and the intermediate organic light-emitting diode MOLED. The thin-film encapsulation layer TFE may include at least one inorganic encapsulation layer and at least one organic encapsulation layer. FIGS. 9A and 9B show that the thin-film encapsulation layer TFE includes the first inorganic encapsulation layer 310, the organic encapsulation layer 320, and the second inorganic encapsulation layer 330.

The thin-film encapsulation layer TFE may extend from the corner organic light-emitting diode COLED to the first dam portion DP1. In addition, the thin-film encapsulation layer TFE may extend from the intermediate organic light-emitting diode MOLED to the second dam portion DP2.

The first inorganic encapsulation layer 310 may entirely and continuously cover the corner display area CDA and the intermediate display area MDA. For example, the first inorganic encapsulation layer 310 may be entirely and continuously arranged in the first groove Gv1, on the first auxiliary dam portion ADP1, in the fourth groove Gv4, on the first dam portion DP1, in the second groove Gv2, on the second dam portion DP2, in the third groove Gv3, on the second auxiliary dam portion ADP2, and in the fifth groove Gv5. In addition, the first inorganic encapsulation layer 310 may cover the first functional layer pattern 212Pa, the second functional layer pattern 212Pc, and the opposite electrode pattern 213P arranged in the groove Gv. The first inorganic encapsulation layer 310 may contact the inorganic pattern layer PVX2. For example, the first inorganic encapsulation layer 310 may contact a protruding tip PT of the inorganic pattern layer PVX2.

The organic encapsulation layer 320 may be separated (e.g., may be divided) by the dam portion DP. For example, the organic encapsulation layer 320 may extend from the corner organic light-emitting diode COLED to the first dam portion DP1, and may fill the first groove Gv1 and/or the fourth groove Gv4. In addition, the organic encapsulation layer 320 may extend from the intermediate organic light-emitting diode MOLED to the second dam portion DP2, and may fill the third groove Gv3 and/or the fifth groove Gv5. In other words, the organic encapsulation layer 320 may be controlled by the first dam portion DP1 and the second dam portion DP2. In this case, the organic encapsulation layer 320 may not be filled in the second groove Gv2.

Like the first inorganic encapsulation layer 310, the second inorganic encapsulation layer 330 may entirely and continuously cover the corner display area CDA and the intermediate display area MDA. In an embodiment, the second inorganic encapsulation layer 330 may contact the first inorganic encapsulation layer 310 at (e.g., in or on) the first dam portion DP1 and the second dam portion DP2. In addition, the second inorganic encapsulation layer 330 may contact the first inorganic encapsulation layer 310 in the second groove Gv2. Thus, the organic encapsulation layer 320 may be separated by the dam portion DP.

Figure 10:
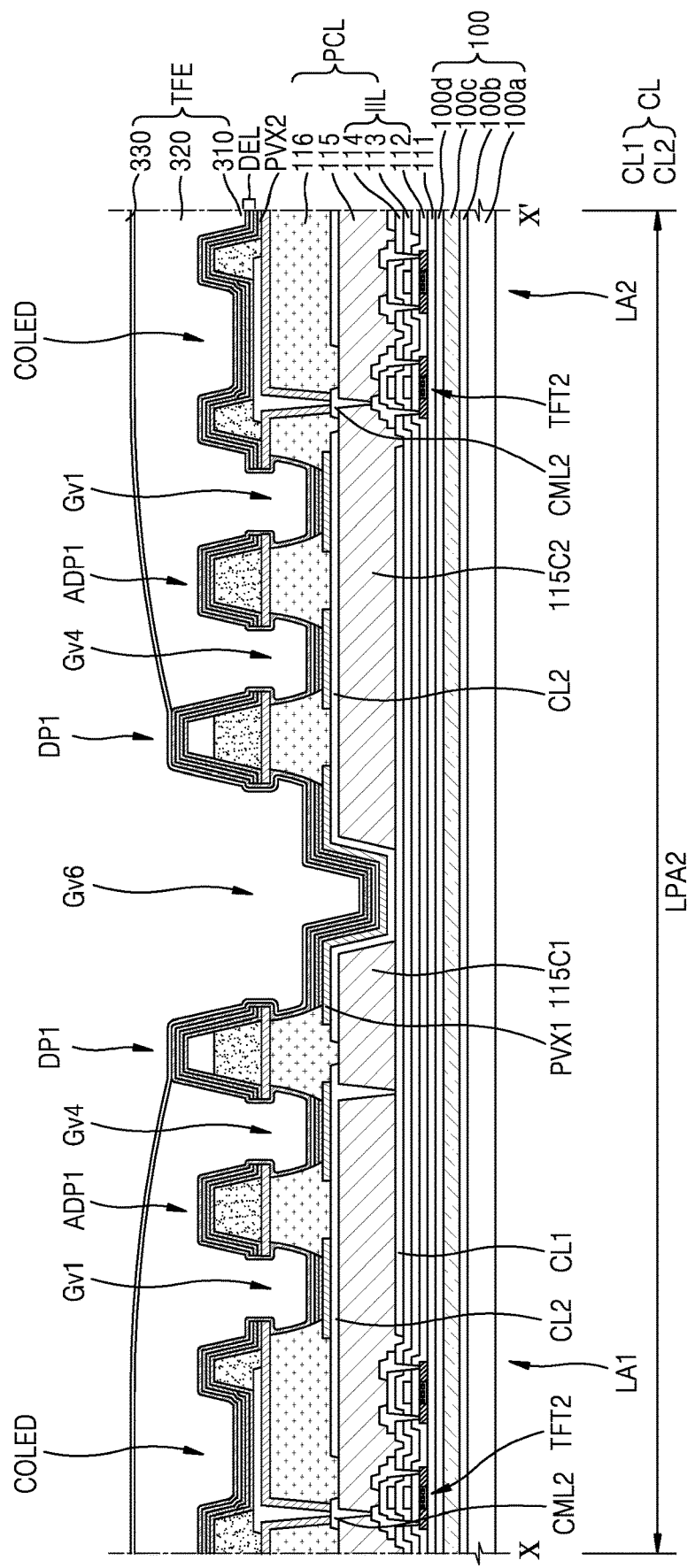
FIG. 10 is a cross-sectional view taken along the line X-X' of the display panel of FIG. 8, according to an embodiment.
Figure 11:
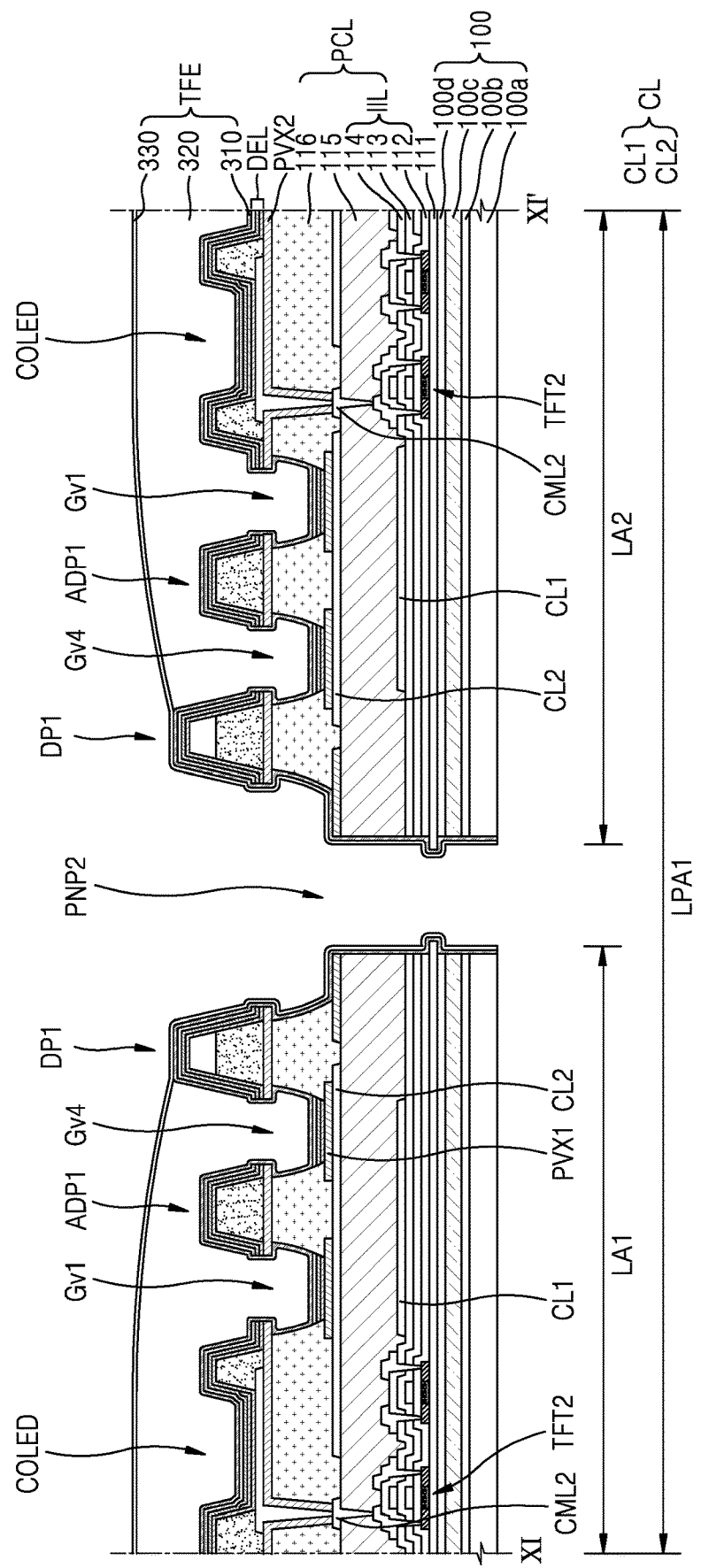
FIG. 11 is a cross-sectional view taken along the line XI-XI' of the display panel of FIG. 8, according to an embodiment.

FIG. 10 is a cross-sectional view taken along the line X-X' of the display panel of FIG. 8, according to an embodiment. FIG. 11 is a cross-sectional view taken along the line XI-XI' of the display panel of FIG. 8, according to an embodiment. In FIGS. 10 and 11, the same reference symbols as those of FIGS. 9A and 9B are used to denote the same or substantially the same elements, and thus, redundant descriptions thereof may not be repeated.

Referring to FIGS. 10 and 11, the corner display area may include the first extension area LA1 and the second extension area LA2. The corner organic light-emitting diode COLED may be arranged at (e.g., in or on) the first extension area LA1 and the second extension area LA2. The first extension area LA1 and the second extension area LA2 may be connected to each other at (e.g., in or on) the second area LPA2. The first extension area LA1 and the second extension area LA2 may be spaced apart from each other at (e.g., in or on) the first area LPA1. In this case, the second through portion PNP2 may be provided between the first extension area LA1 and the second extension area LA2 at (e.g., in or on) the first area LPA1.

Referring to FIG. 10, the pixel circuit layer PCL, the display element layer DEL, and the thin-film encapsulation layer TFE may be arranged at (e.g., in or on) the second area LPA2. The pixel circuit layer PCL may include the second thin-film transistor TFT2, the first connection line CL1, the second connection line CL2, the inorganic insulating layer IIL, the first insulating layer 115, and the second insulating layer 116. The display element layer DEL may include the corner organic light-emitting diode COLED.

The first groove Gv1, the fourth groove Gv4, and the sixth groove Gv6 may be arranged at (e.g., in or on) the second area LPA2. In addition, the first auxiliary dam portion ADP1 may be arranged between the first groove Gv1 and the fourth groove Gv4, and the first dam portion DP1 may be arranged between the fourth groove Gv4 and the sixth groove Gv6.

In an embodiment, the substrate 100 and the inorganic insulating layer IIL may be continuously arranged. The first insulating layer 115 may be divided with respect to the sixth groove Gv6. For example, the first insulating layer 115 may be divided into a first corner insulating layer 115C1 and a second corner insulating layer 115C2 with respect to the sixth groove Gv6. In some embodiments, the inorganic insulating layer IIL may also be divided with respect to the sixth groove Gv6.

The second connection line CL2 and the second connection electrode CML2 may be arranged on the first insulating layer 115. In some embodiments, the second connection electrode CML2 may be a part of the second connection line CL2.

In an embodiment, the second connection line CL2 may cover the first corner insulating layer 115C1 and the second corner insulating layer 115C2. For example, the second connection line CL2 may cover a side surface of the first corner insulating layer 115C1 and a side surface of the second corner insulating layer 115C2 that face each other. The second connection line CL2 may be connected to the first connection line CL1 that is exposed between the first corner insulating layer 115C1 and the second corner insulating layer 115C2. Thus, the first connection line CL1 and the second connection line CL2 may prevent or substantially prevent moisture from penetrating into the corner organic light-emitting diode COLED from the outside.

The lower inorganic pattern layer PVX1 may be arranged on the second connection line CL2. A plurality of lower inorganic pattern layers PVX1 may be arranged on the second connection line CL2, and may be spaced apart from each other on the second connection line CL2. One of the plurality of lower inorganic pattern layers PVX1 may cover the side surface of the first corner insulating layer 115C1 and the side surface of the second corner insulating layer 115C2 that face each other.

The organic encapsulation layer 320 may be divided with respect to the first dam portion DP1.

Referring to FIG. 11, the pixel circuit layer PCL, the display element layer DEL, and the thin-film encapsulation layer TFE may be arranged at (e.g., in or on) the first extension area LA1 and the second extension area LA2. The pixel circuit layer PCL may include the second thin-film transistor TFT2, the first connection line CL1, the second connection line CL2, the inorganic insulating layer IIL, the first insulating layer 115, and the second insulating layer 116. The display element layer DEL may include the corner organic light-emitting diode COLED.

The first groove Gv1 and the fourth groove Gv4 may be arranged at (e.g., in or on) the first extension area LA1 and the second extension area LA2. In addition, a first auxiliary dam portion ADP1 may be arranged between the first groove Gv1 and the fourth groove Gv4, and the first dam portion DP1 may be arranged between the fourth groove Gv4 and the second through portion PNP2.

At (e.g., in or on) the first area LPA1, the first extension area LA1 and the second extension area LA2 may be spaced apart from each other with the second through portion PNP2 therebetween. In addition, each of the inorganic insulating layer IIL, the first insulating layer 115, the second insulating layer 116, and the thin-film encapsulation layer TFE may be divided by the second through portion PNP2.

Figure 12:
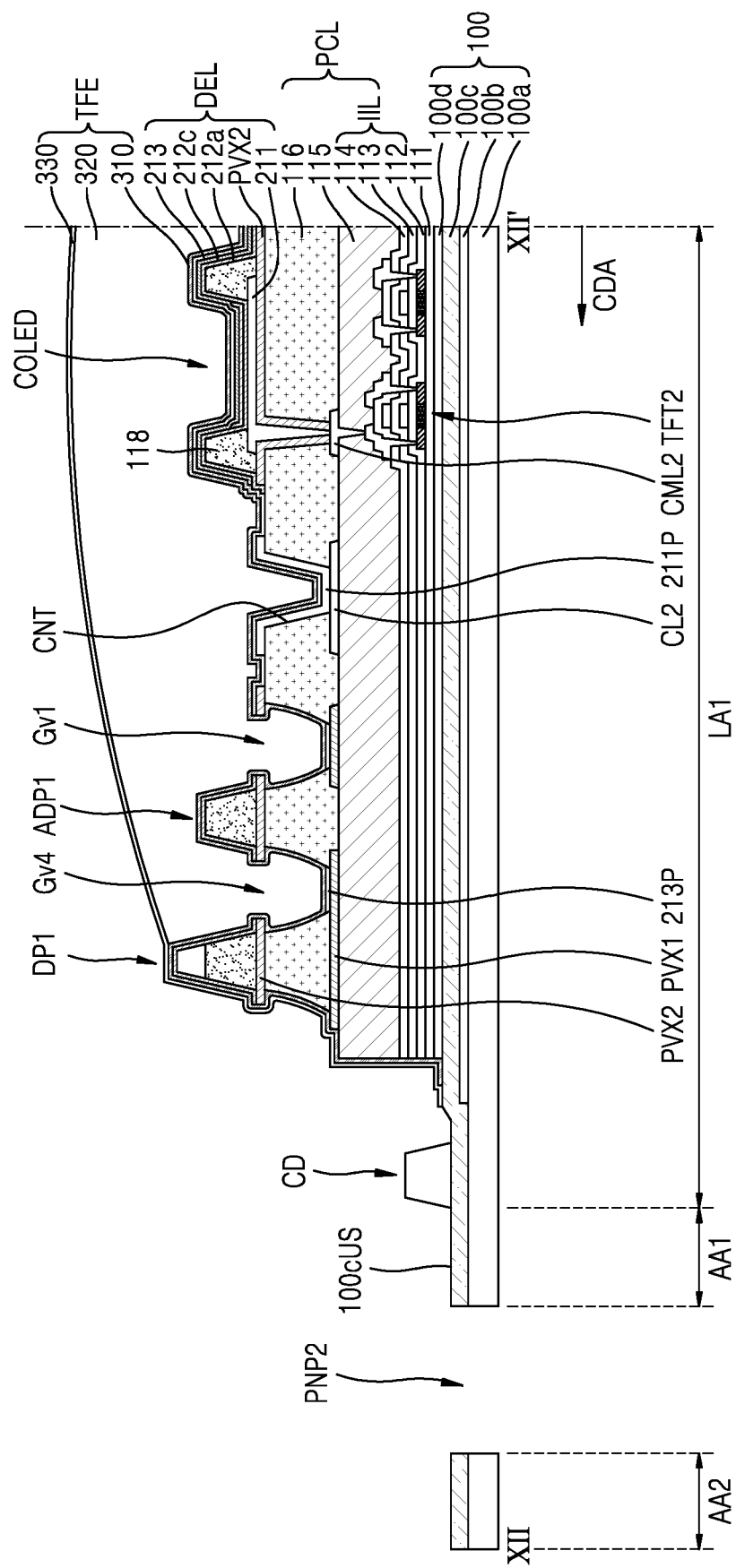
FIG. 12 is a cross-sectional view taken along the line XII-XII' of the display panel of FIG. 8, according to an embodiment.

FIG. 12 is a cross-sectional view taken along the line XII-XII' of the display panel of FIG. 8, according to an embodiment. In FIG. 12, the same reference symbols as those of FIGS. 9A and 9B are used to denote the same or substantially the same elements, and thus, redundant descriptions thereof may not be repeated.

Referring to FIG. 12, the display panel may include the substrate 100 including the corner display area CDA arranged at the corner of the display panel, the second thin-film transistor TFT2 arranged at (e.g., in or on) the corner display area CDA, and the corner organic light-emitting diode COLED. The corner organic light-emitting diode COLED of FIG. 12 may correspond to a corner organic light-emitting diode COLED located farthest away from the intermediate display area MDA.

The corner display area CDA may include the first extension area LA1 and the first auxiliary area AA1. The first extension area LA1 may extend in a direction away from the front display area FDA.

The substrate 100 may include a base layer and a barrier layer arranged on the base layer. For example, the substrate 100 may include the first base layer 100a, the first barrier layer 100b, the second base layer 100c, and the second barrier layer 100d stacked in order.

The first extension area LA1 may overlap with the base layer and the barrier layer. For example, the first extension area LA1 may overlap with the first base layer 100a, the first barrier layer 100b, the second base layer 100c, and the second barrier layer 100d.

At least one of the first base layer 100a and the second base layer 100c may extend from the first extension area LA1 to the first auxiliary area AA1. For example, the first base layer 100a and the second base layer 100c may extend from the first extension area LA1 to the first auxiliary area AA1. The first base layer 100a and the second base layer 100c may contact each other at (e.g., in or on) the first auxiliary area AA1.

The first auxiliary area AA1 may be connected to the first extension area LA1, and may extend in a direction away from the front display area FDA. The first auxiliary area AA1 may overlap with the first base layer 100a and the second base layer 100c. The first auxiliary area AA1 may overlap with the first base layer 100a and the second base layer 100c. each extending thereto from the first extension area LA1. The first barrier layer 100b and the second barrier layer 100d may be spaced apart from the first auxiliary area AA1. In other words, the first barrier layer 100b and the second barrier layer 100d may not overlap with the first auxiliary area AA1. In an embodiment, an end of the first barrier layer 100b may be closer to the first auxiliary area AA1 than an end of the second barrier layer 100d.

In an embodiment, an upper surface of the base layer may be exposed at (e.g., in or on) the first auxiliary area AA1. For example, an upper surface 100cUS of the second base layer 100c may be exposed at (e.g., in or on) the first auxiliary area AA1.

The second auxiliary area AA2 may be spaced apart from the first auxiliary area AA1 with the second through portion PNP2 therebetween. The second auxiliary area AA2 may include the first base layer 100a and the second base layer 100c. In this case, the upper surface 100cUS of the second base layer 100c may be exposed at (e.g., in or on) the second auxiliary area AA2.

The second connection line CL2 may be arranged at (e.g., in or on) the first extension area LA1. In an embodiment, the second connection line CL2 may be arranged between the first insulating layer 115 and the second insulating layer 116. In an embodiment, the second connection line CL2 may apply the second power voltage ELVSS (e.g., see FIG. 3) to the corner organic light-emitting diode COLED.

The second insulating layer 116 may include the contact hole CNT through which at least a portion of the second connection line CL2 is exposed. In this case, the contact hole CNT may be arranged at the end of the first extension area LA1. The contact hole CNT may be arranged between the corner organic light-emitting diode COLED and the first groove Gv1, where the corner organic light-emitting diode COLED is the farthest away from the intermediate display area MDA from among the corner organic light-emitting diodes COLED arranged at (e.g., in or on) the first extension area LA1.

The second connection line CL2 may be connected to the opposite electrode 213. The second connection line CL2 may apply the second power voltage ELVSS to the opposite electrode 213 of the corner organic light-emitting diode COLED. In an embodiment, the second connection line CL2 and the opposite electrode 213 may be connected to each other through a pixel electrode pattern 211P including the same or substantially the same material as that of the pixel electrode 211. The pixel electrode pattern 211P may be spaced apart from the pixel electrode 211, and may overlap with the contact hole CNT. The pixel electrode pattern 211P may be formed concurrently (e.g., simultaneously) when the pixel electrode 211 is formed.

The first functional layer 212a and the second functional layer 212c may be spaced apart from the contact hole CNT to expose the contact hole CNT. In other words, the first functional layer 212a and the second functional layer 212c may not extend to the contact hole CNT through which the second connection line CL2 is exposed. Therefore, the second connection line CL2 and the opposite electrode 213 that are connected to each other through the pixel electrode pattern 211P may maintain or substantially maintain a low resistance. A range in which the first functional layer 212a and the second functional layer 212c are formed on the entire surface of the first extension area LA1 may be adjusted, so that neither the first functional layer 212a nor the second functional layer 212c may be formed at (e.g., in or on) an end of the extension area LA. The opposite electrode 213 may overlap with the pixel electrode pattern 211P by adjusting a range in which the opposite electrode 213 is formed on the entire surface of the first extension area LA1.

An opposite electrode pattern 213P at (e.g., in or on) the first groove Gv1 and the fourth groove Gv4 may contact the lower inorganic pattern layer PVX1 or the first insulating layer 115, and the protruding tip PT of the inorganic pattern layer PVX2 may contact the opposite electrode 213.

The inorganic insulating layer IIL, the first insulating layer 115, the second insulating layer 116, the display element layer DEL, and the thin-film encapsulation layer TFE may be arranged at (e.g., in or on) the first extension area LA1. The inorganic insulating layer IIL may be spaced apart from the first auxiliary area AA1 and the second auxiliary area AA2. In an embodiment, a metal layer that is arranged on the pixel circuit layer PCL and/or the display element layer DEL may be spaced apart from the first auxiliary area AA1 and the second auxiliary area AA2.

In an embodiment, a crack dam CD may be arranged at (e.g., in or on) the first extension area LA1 to prevent or substantially prevent cracks in the display panel. The crack dam CD may be arranged at an end of the first extension area LA1, and may include an organic material.

FIGS. 13A to 13K are enlarged views of the corner CN of a display panel according to various embodiments. FIGS. 13A to 13K are enlarged views of the region V of FIG. 4. In FIGS. 13A to 13K, the same reference symbols as those of FIG. 5A are used to denote the same or substantially the same elements, and thus, redundant descriptions thereof may not be repeated.

Referring to FIGS. 13A to 13K, the display panel may include the corner CN. In this case, a substrate included in the display panel may include the front display area FDA, the first side display area SDA1, the second side display area SDA2, the corner display area CDA, and the intermediate display area MDA. The first pixel PX1 may be arranged at (e.g., in or on) the front display area FDA, the second pixel PX2 may be arranged at (e.g., in or on) the corner display area CDA, and the third pixel PX3 may be arranged at (e.g., in or on) the intermediate display area MDA.

The corner display area CDA may be arranged at the corner CN of the display panel. The corner display area CDA may include an extension area LA, an auxiliary area AA, a first adjacent area ADA1, and a second adjacent area ADA2. In an embodiment, each of the extension area LA, the auxiliary area AA, the first adjacent area ADA1, and the second adjacent area ADA2 may extend in a direction away from the front display area FDA.

Each of the first extension area LA1 and the second extension area LA2 may extend in a direction away from the front display area FDA. The first auxiliary area AA1 may be connected to the first extension area LA1, and may extend in a direction away from the front display area FDA. The second auxiliary area AA2 may be connected to the second extension area LA2, and may extend in a direction away from the front display area FDA.

Figure 13A:
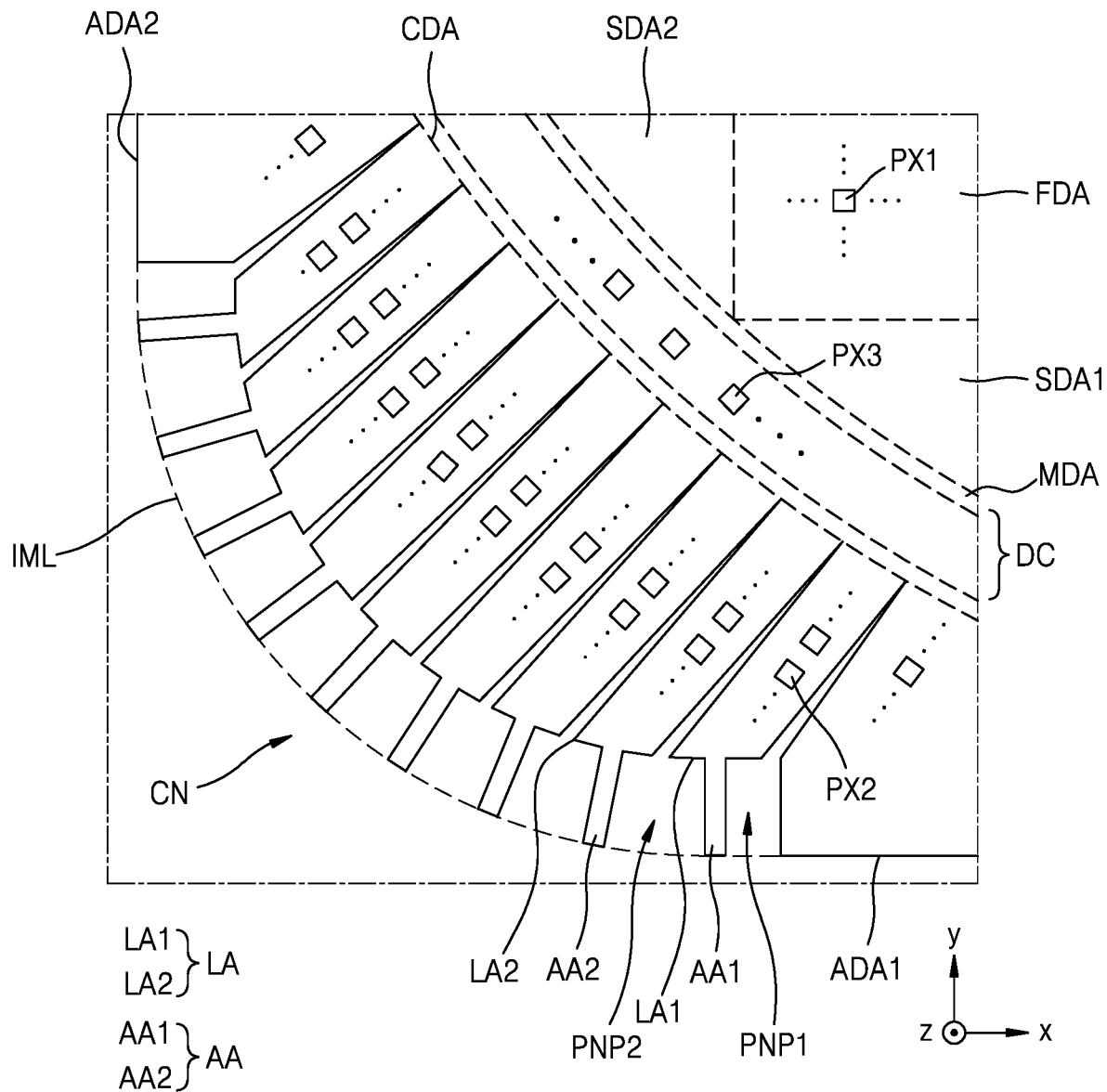
FIGS. 13A-13K are enlarged views of a corner of a display panel according to various embodiments.

Referring to FIG. 13A, a direction in which the first extension area LA1 extends may be different from a direction in which the first auxiliary area AA1 extends. For example, the first extension area LA1 may extend in a direction crossing the first direction (e.g., the y direction or the −y direction) and the second direction (e.g., the x direction or the −x direction). The first auxiliary area AA1 may extend in the first direction (e.g., the y direction or the −y direction). In addition, a direction in which the second extension area LA2 extends may be different from a direction in which the second auxiliary area AA2 extends.

In an embodiment, a direction in which the auxiliary areas AA extend may be orthogonal to or substantially orthogonal to a direction in which an imaginary line IML connecting ends of the auxiliary areas AA to each other extends. For example, the imaginary line IML may extend in the second direction (e.g., the x direction or the −x direction) from the end of the first auxiliary area AA1. In this case, the first auxiliary area AA1 may extend in the first direction (e.g., the y direction or the −y direction).

Figure 13B:
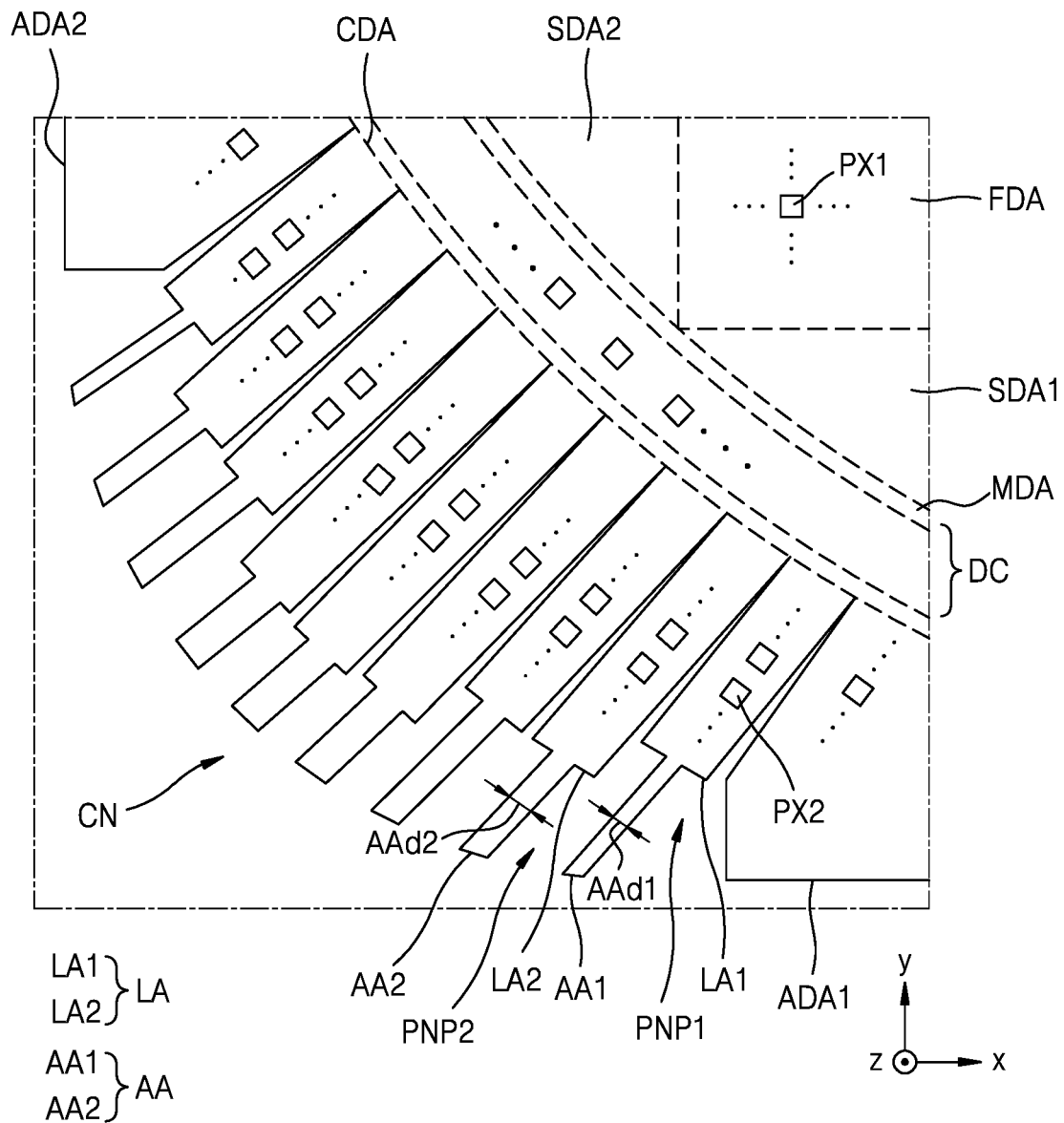

Referring to FIG. 13B, the width AAd1 of the first auxiliary area AA1 may be less than a width AAd2 of the second auxiliary area AA2. The width AAd1 of the first auxiliary area AA1 may be a distance between edges (e.g., opposite edges) of the first auxiliary area AA1 in a direction perpendicular to or substantially perpendicular to the extension direction of the first auxiliary area AA1. The width AAd2 of the second auxiliary area AA2 may be a distance between edges (e.g., opposite edges) of the second auxiliary area AA2 in a direction perpendicular to or substantially perpendicular to the extension direction of the second auxiliary area AA2. In other words, the first auxiliary area AA1 may be closer to the first adjacent area ADA1 than the second auxiliary area AA2, and the width AAd1 of the first auxiliary area AA1 may be less than the width AAd2 of the second auxiliary area AA2.

Figure 13C:
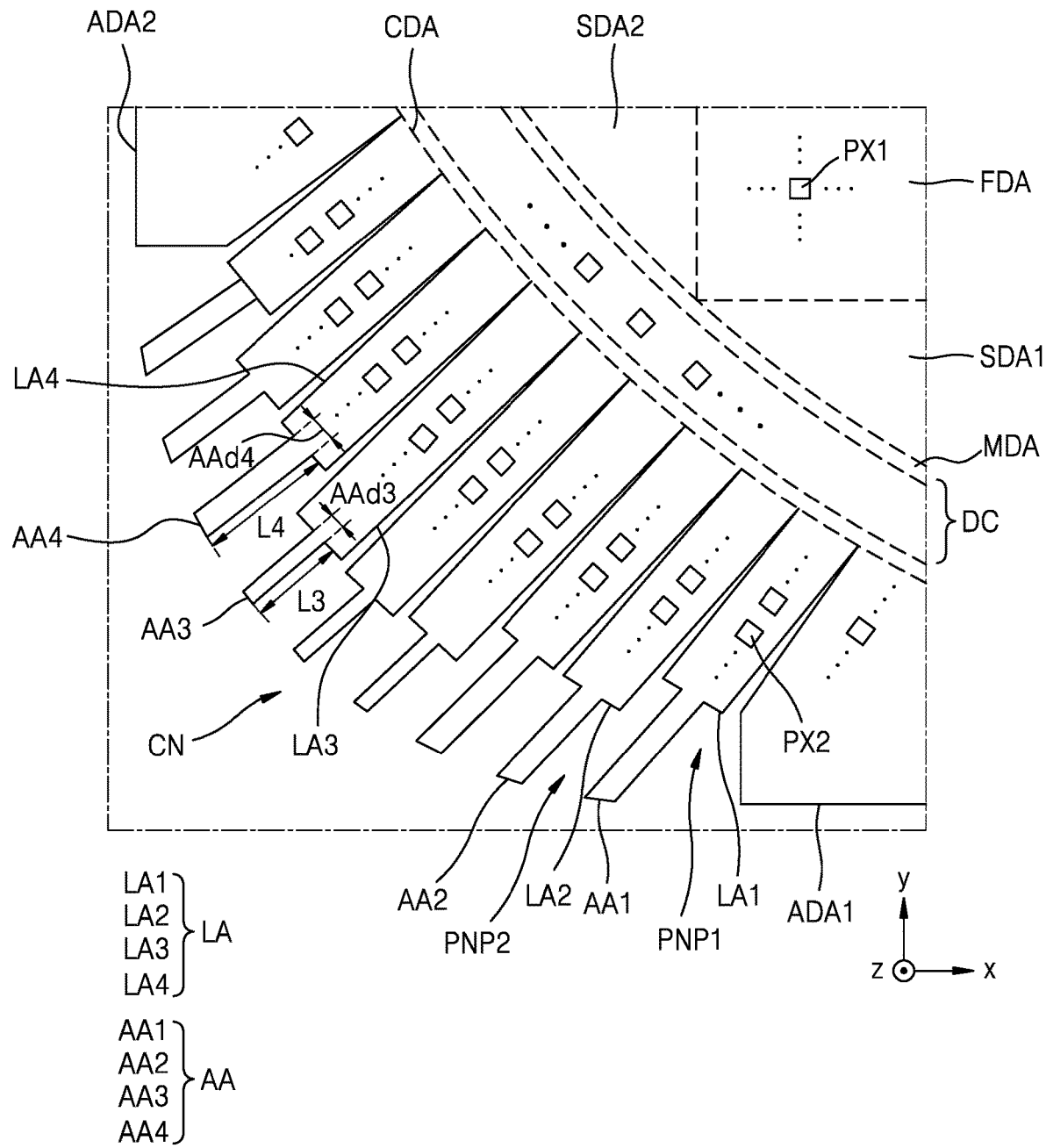

Referring to FIG. 13C, the plurality of extension areas LA may include a third extension area LA3 and a fourth extension area LA4. The third extension area LA3 and the fourth extension area LA4 are the same or substantially the same as (or similar to) the second extension area LA2, and thus, redundant descriptions thereof may not be repeated.

A third auxiliary area AA3 may be connected to the third extension area LA3, and may extend in a direction away from the front display area FDA. A fourth auxiliary area AA4 may be connected to the fourth extension area LA4, and may extend in a direction away from the front display area FDA.

A length L3 of the third auxiliary area AA3 may be less than a length L4 of the fourth auxiliary area AA4. The length L3 of the third auxiliary area AA3 may correspond to a distance between an end of the third extension area LA3 and an end of the third auxiliary area AA3. The length L4 of the fourth auxiliary area AA4 may correspond to a distance between an end of the fourth extension area LA4 and an end of the fourth auxiliary area AA4.

A width AAd3 of the third auxiliary area AA3 may be less than a width AAd4 of the fourth auxiliary area AA4. The width AAd3 of the third auxiliary area AA3 may correspond to a distance between edges (e.g., opposite edges) of the third auxiliary area AA3 in a direction perpendicular to or substantially perpendicular to the extension direction of the third auxiliary area AA3. The width AAd4 of the fourth auxiliary area AA4 may be a distance between edges (e.g., opposite edges) of the fourth auxiliary area AA4 in a direction perpendicular to or substantially perpendicular to the extension direction of the fourth auxiliary area AA4.

Thus, the modulus of elasticity of the third auxiliary area AA3 and the fourth auxiliary area AA4 may be maintained to be constant or substantially constant, even if the length L3 of the third auxiliary area AA3 differs from the length L4 of the fourth auxiliary area AA4.

Figure 13D:
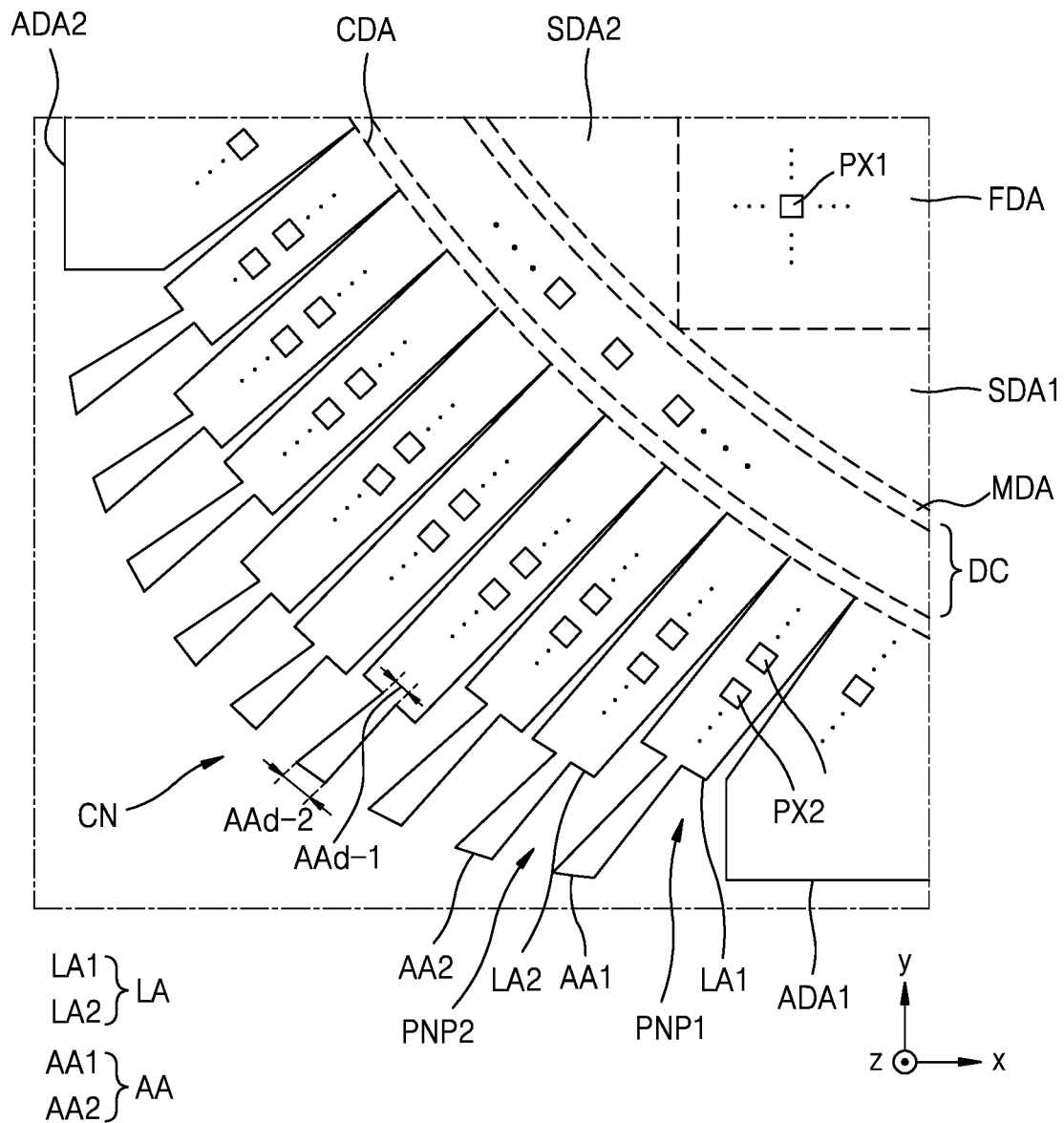

Referring to FIG. 13D, a width of the auxiliary area AA may increase in the extension direction of the auxiliary area AA from the extension area LA. For example, a width AAd-1 of the auxiliary area AA at a portion (e.g., an end portion) where the auxiliary area AA and the extension area LA are connected to each other may be less than a width AAd-2 of the auxiliary area AA at an end (e.g., an opposite end) of the auxiliary area AA.

Figure 13E:
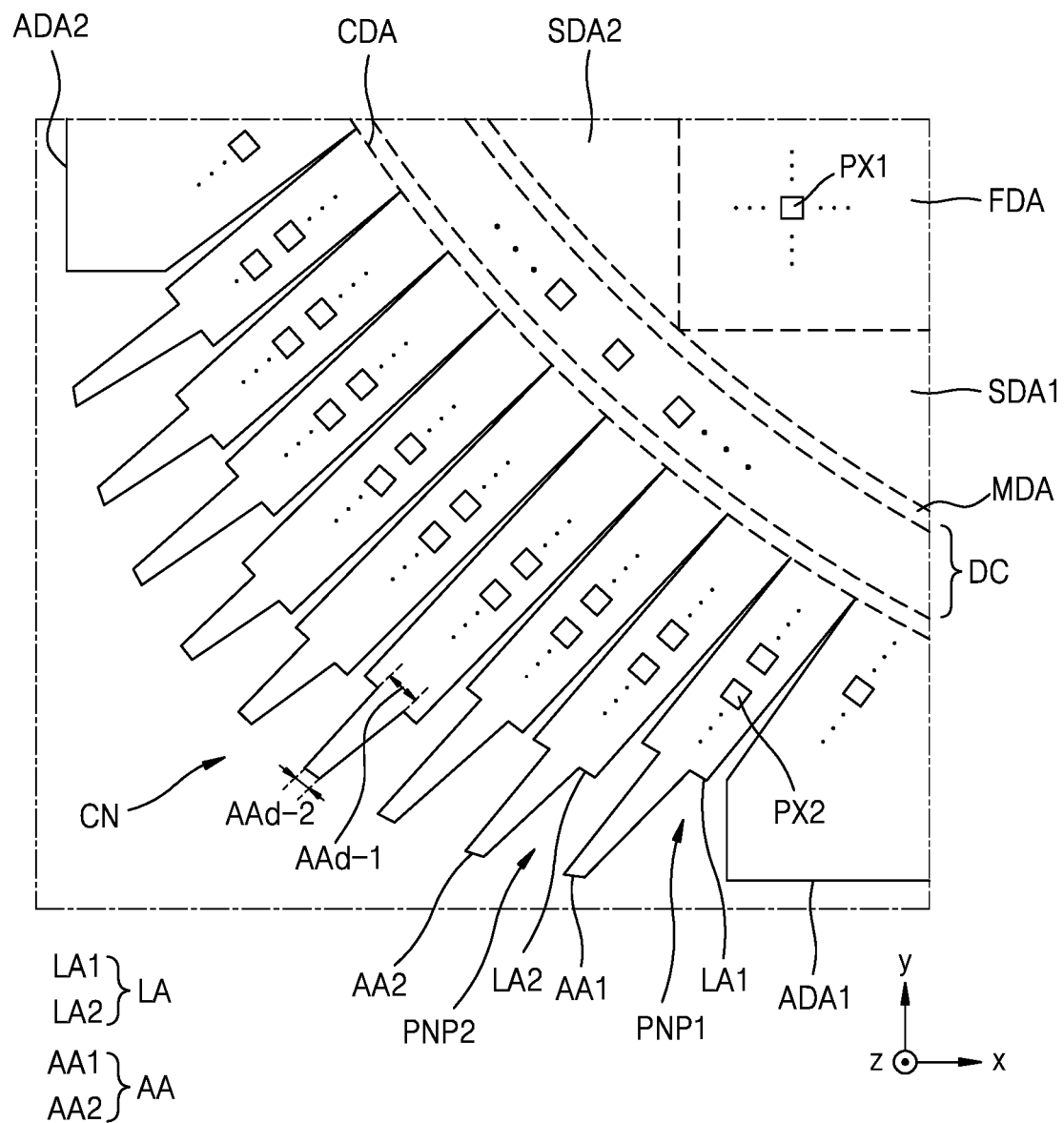

Referring to FIG. 13E, the width of the auxiliary area AA may decrease in the extension direction of the auxiliary area AA from the extension area LA. For example, the width AAd-1 of the auxiliary area AA at a portion (e.g., an end portion) where the auxiliary area AA and the extension area LA are connected to each other may be greater than the width AAd-2 of the auxiliary area AA at an end (e.g., an opposite end) of the auxiliary area AA.

Figure 13F:
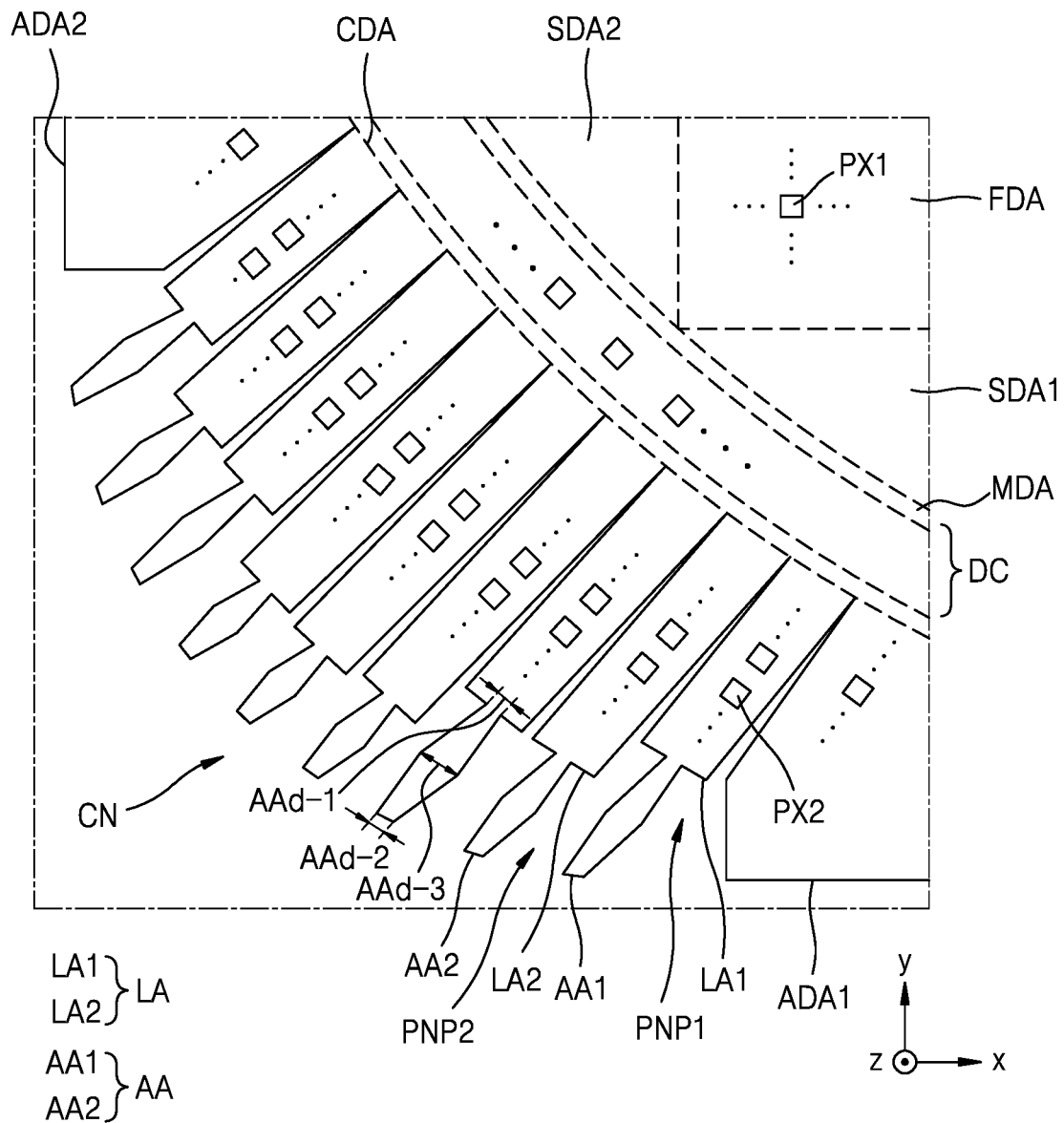

Referring to FIG. 13F, the width of the auxiliary area AA may increase in the extension direction of the auxiliary area AA from the extension area LA and then may decrease. For example, a width AAd-3 at a middle portion (e.g., at any suitable middle portion) of the auxiliary area AA may be greater than the width AAd-1 of the auxiliary area AA at a portion (e.g., an end portion) where the auxiliary area AA and the extension area LA are connected to each other. In addition, the width AAd-3 at the middle portion of the auxiliary area AA may be greater than the width AAd-2 of the auxiliary area AA at the end (e.g., the opposite end) of the auxiliary area AA.

Figure 13G:
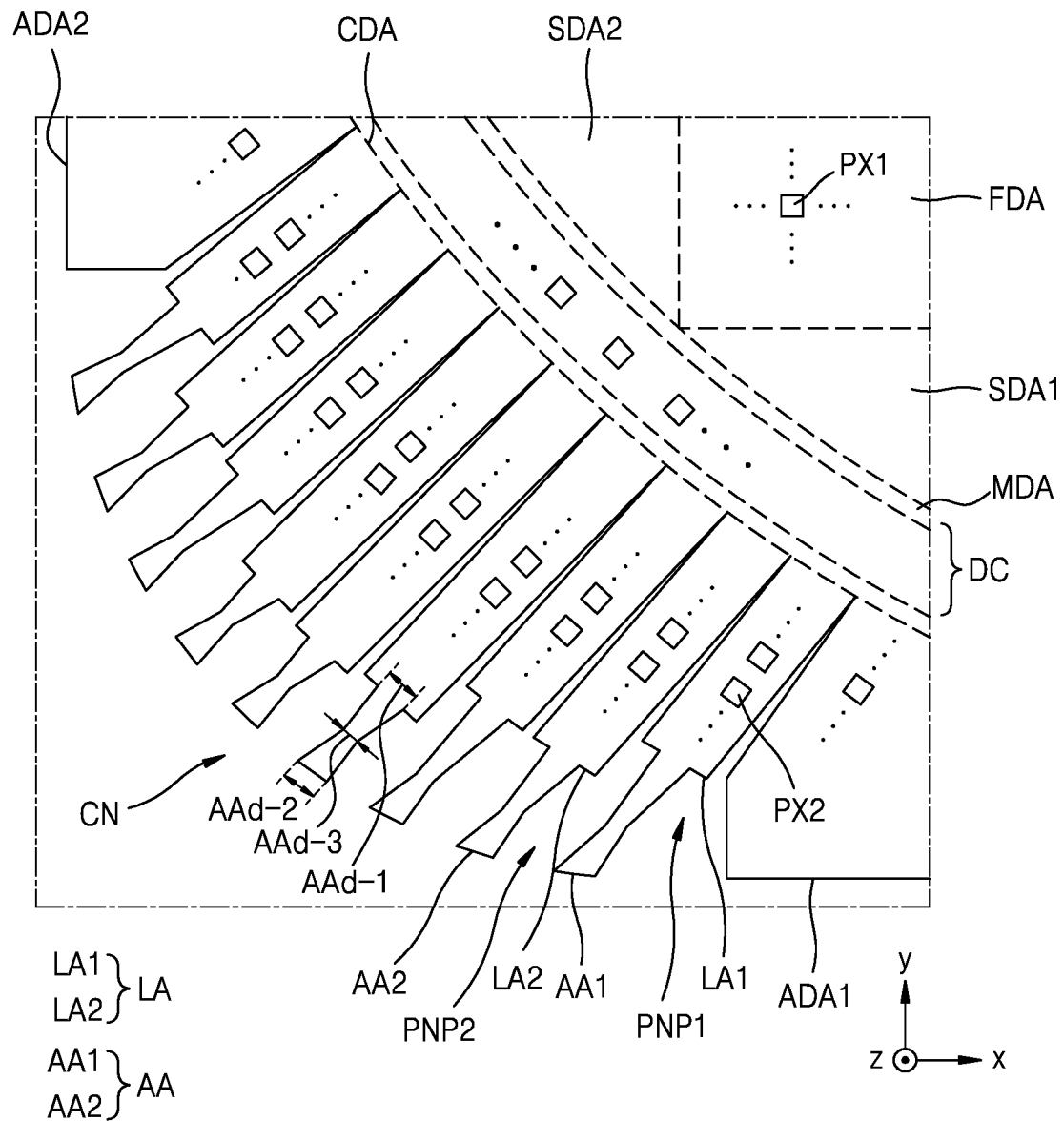

Referring to FIG. 13G, the width of the auxiliary area AA may decrease in the extension direction of the auxiliary area AA from the extension area LA and then may increase. For example, the width AAd-3 of the middle portion (e.g., of any suitable middle portion) of the auxiliary area AA may be less than the width AAd-1 of the auxiliary area AA at a portion (e.g., an end portion) where the auxiliary area AA and the extension area LA are connected to each other. In addition, the width AAd-3 of the middle portion of the auxiliary area AA may be less than the width AAd-2 of the auxiliary area AA at the end (e.g., the opposite end) of the auxiliary area AA.

Thus, as shown in FIGS. 13D to 13G, a shape of the second through portion PNP2 may be variously adjusted (e.g., may be variously modified) based on a shape of the auxiliary area AA.

Figure 13H:
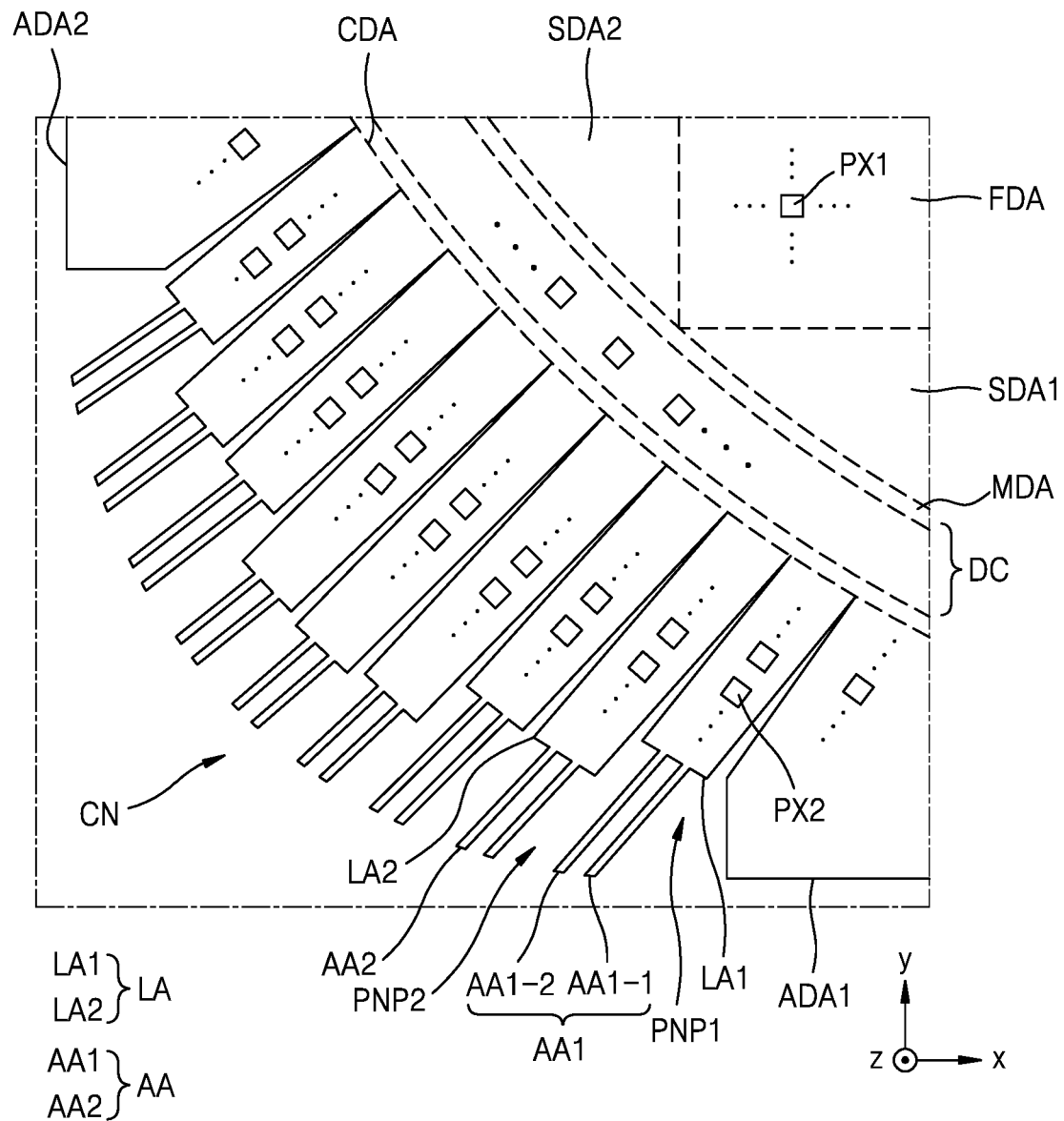

Referring to FIG. 13H, the first auxiliary area AA1 may include a first portion AA1-1 and a second portion AA1-2, each connected to the first extension area LA1.

Figure 13I:
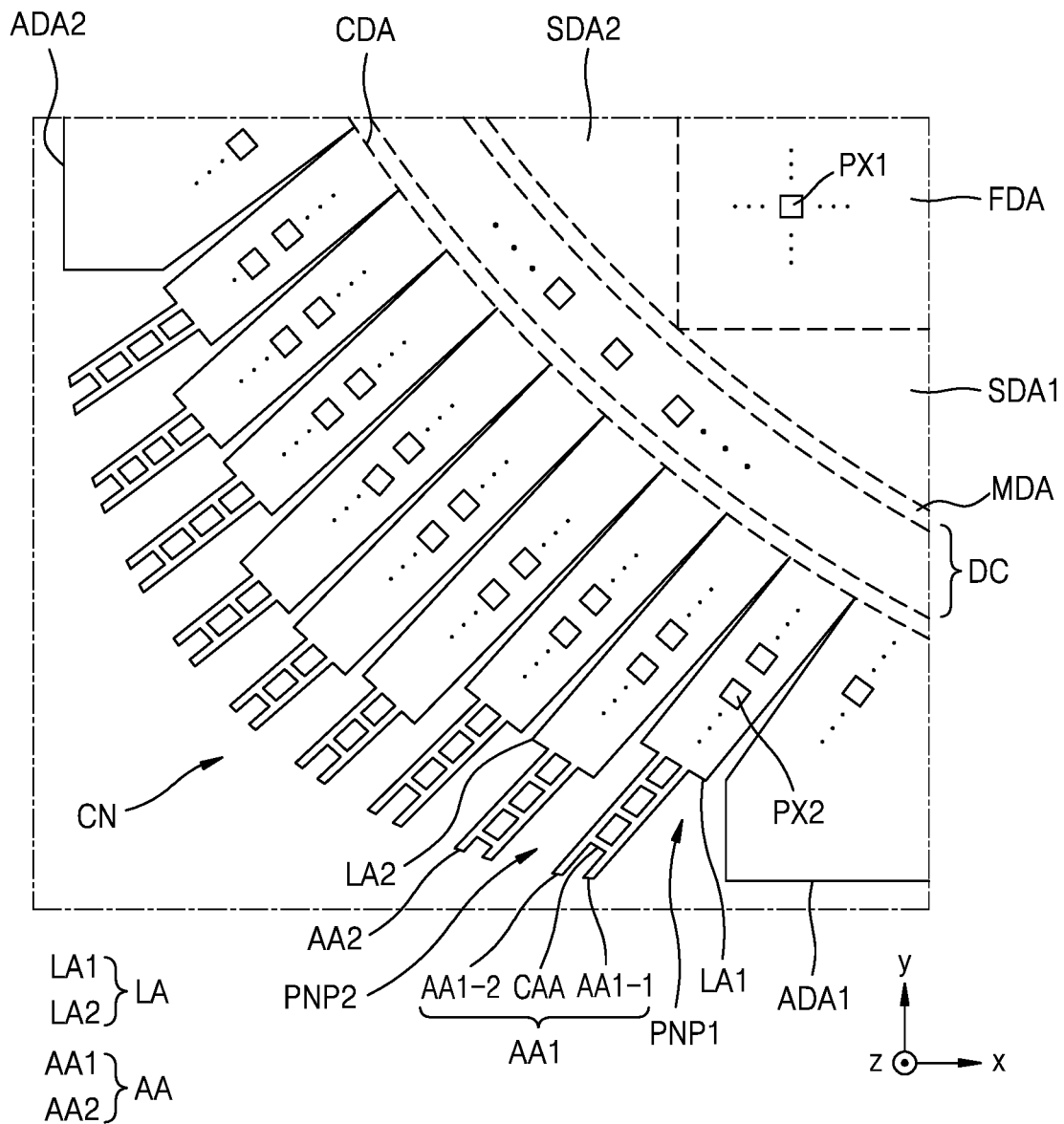

Referring to FIG. 13I, the first portion AA1-1 and the second portion AA1-2 may be connected to each other by a connection portion CAA. Each of the first portion AA1-1 and the second portion AA1-2 may be connected to a plurality of connection portions CAA. In this case, the first auxiliary area AA1 may have a ladder shape.

Figure 13J:
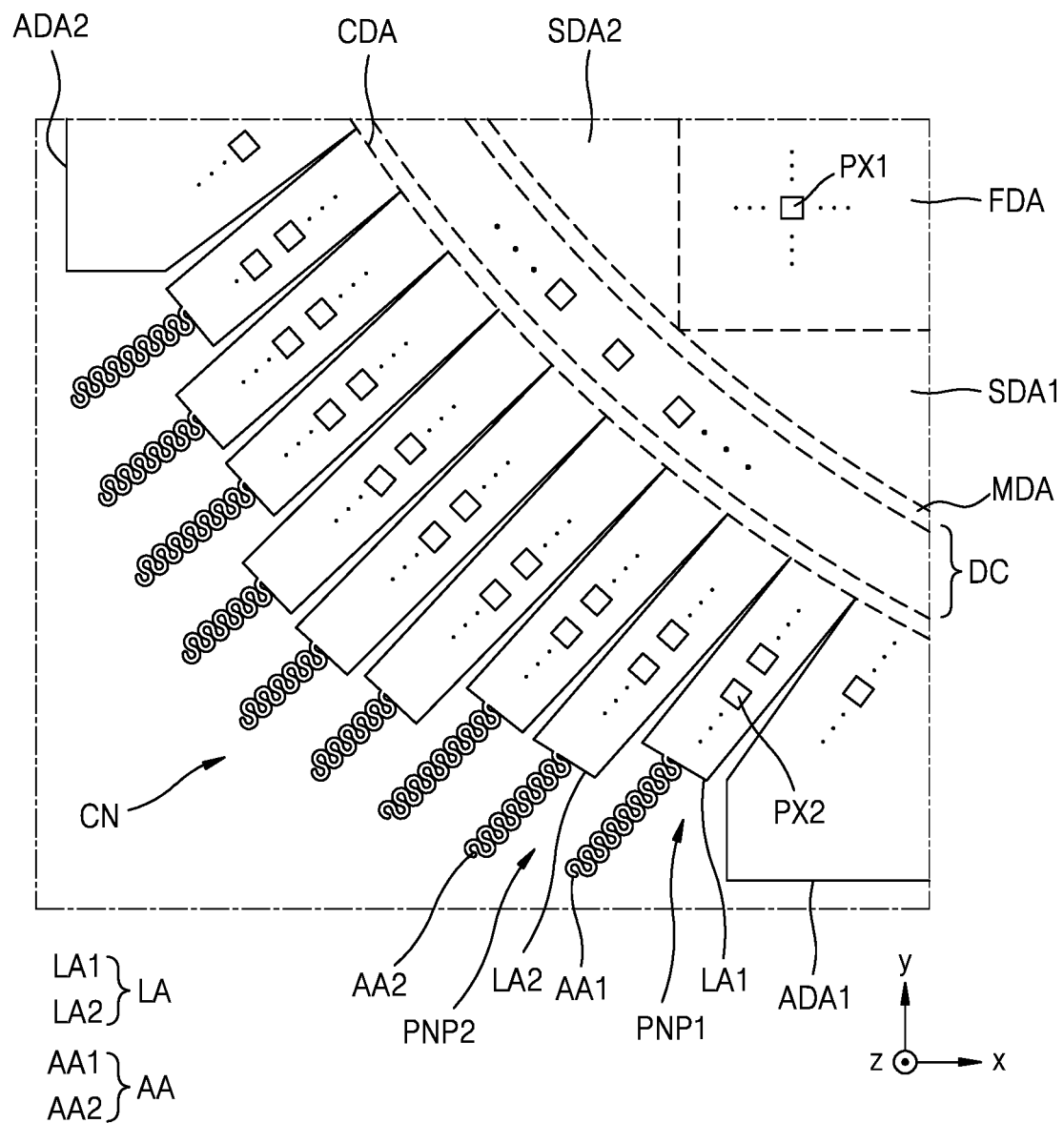

Referring to FIG. 13J, the extension direction of the first auxiliary area AA1 may be changed at least two times. The first auxiliary area AA1 may serpentinely extend from the first extension area LA1. For example, the first auxiliary area AA1 may extend in a sine (e.g., a sinusoidal) curved shape.

Figure 13K:
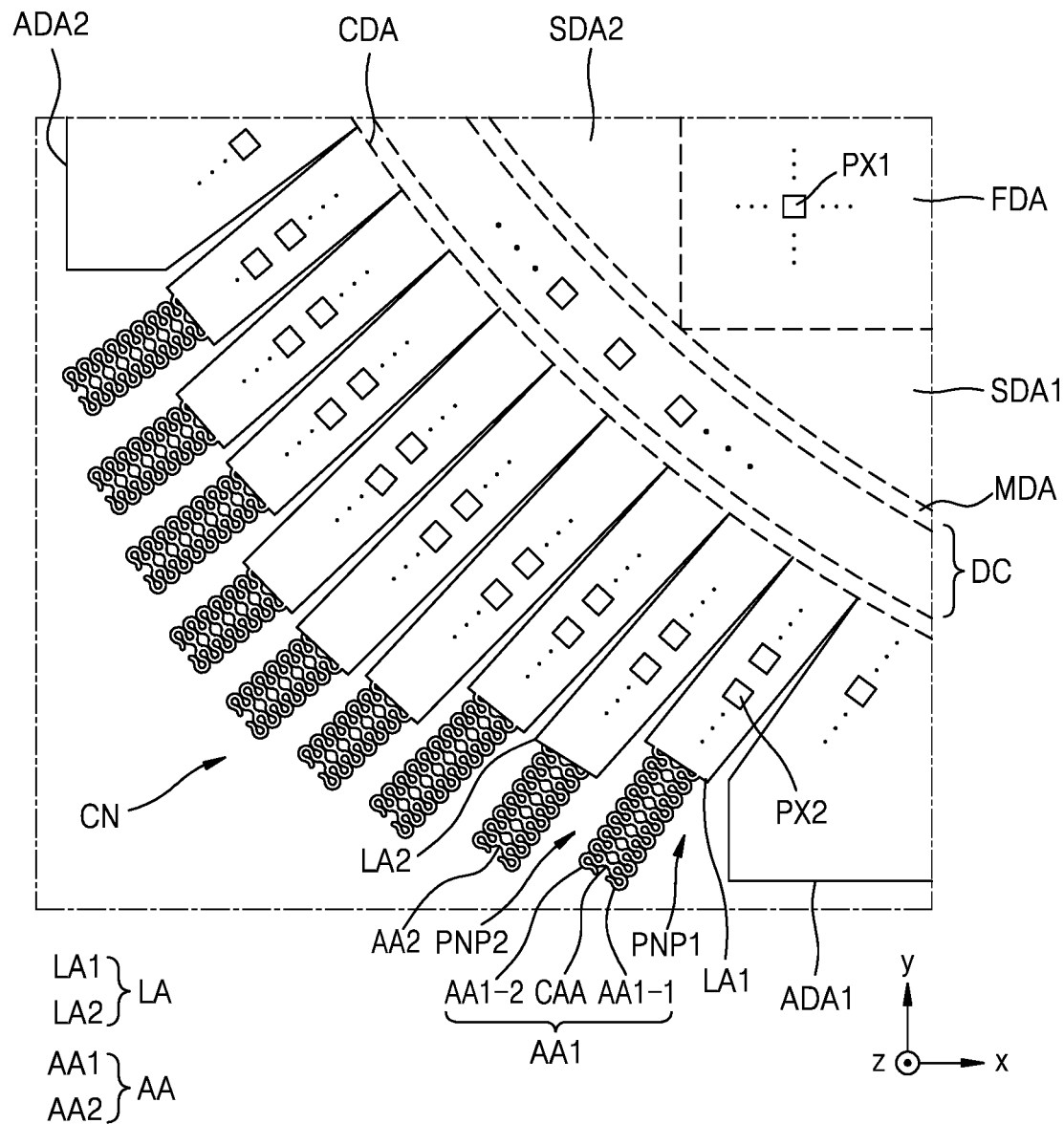

Referring to FIG. 13K, the first auxiliary area AA1 may include the first portion AA1-1 and the second portion AA1-2, each connected to the first extension area LA1. Each of the first portion AA1-1 and the second portion AA1-2 may change its extension direction at least twice. Each of the first portion AA1-1 and the second portion AA1-2 may serpentinely extend from the first extension area LA1.

The first portion AA1-1 and the second portion AA1-2 may be connected to each other by the connection portion CAA. Each of the first portion AA1-1 and the second portion AA1-2 may be connected to a plurality of connection portions CAA.

Figure 14:
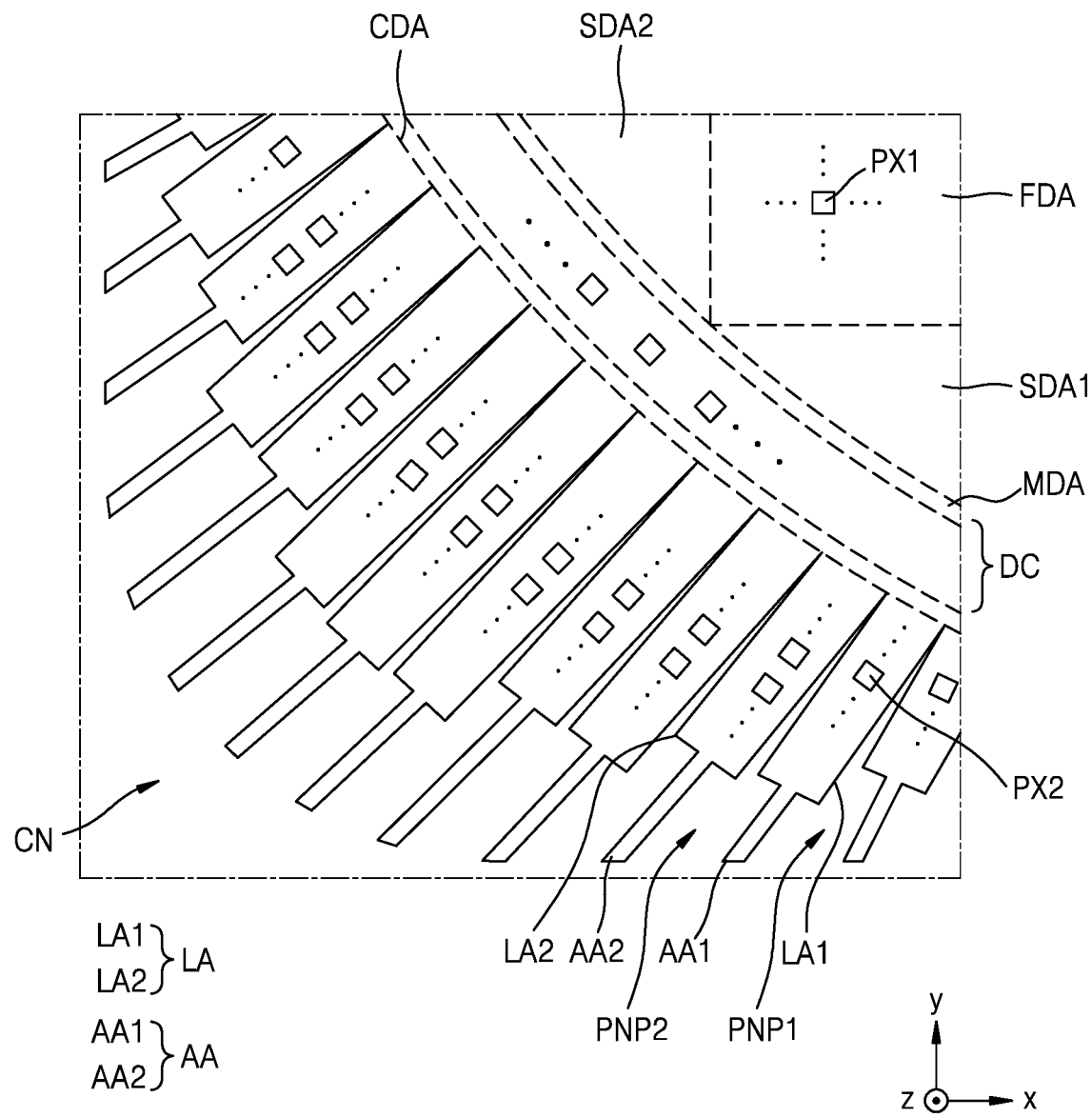
FIG. 14 is an enlarged view of a corner of a display panel according to another embodiment.

FIG. 14 is an enlarged view of a corner CN of a display panel according to another embodiment. FIG. 14 is an enlarged view of the region V of FIG. 4 according to an embodiment. In FIG. 14, the same reference symbols as those of FIG. 5A are used to denote the same or substantially the same elements, and thus, redundant descriptions thereof may not be repeated.

Referring to FIG. 14, the display panel may include the corner CN. In this case, a substrate included in the display panel may include the front display area FDA, the first side display area SDA1, the second side display area SDA2, the corner display area CDA, and the intermediate display area MDA. The first pixel PX1 may be arranged at (e.g., in or on) the front display area FDA, the second pixel PX2 may be arranged at (e.g., in or on) the corner display area CDA, and the third pixel PX3 may be arranged at (e.g., in or on) the intermediate display area MDA.

The corner display area CDA may be arranged at the corner CN of the display panel. The corner display area CDA may include the extension area LA and the auxiliary area AA. In an embodiment, each of the extension area LA and the auxiliary area AA may extend in a direction away from the front display area FDA. In other words, in the embodiment shown in FIG. 14, the first adjacent area ADA1 and the second adjacent area ADA2 of the embodiment shown in FIG. 5A may be omitted.

Each of the first extension area LA1 and the second extension area LA2 may extend in a direction away from the front display area FDA. The first auxiliary area AA1 may be connected to the first extension area LA1, and may extend in a direction away from the front display area FDA. The second auxiliary area AA2 may be connected to the second extension area LA2, and may extend in a direction away from the front display area FDA. In a case where the compressive strain occurs overall (or mainly) in the corner display area CDA, the corner display area CDA may include a plurality of extension areas LA that are spaced apart from each other (e.g., without the first and second adjacent areas ADA1 and ADA2).

Figure 15A:
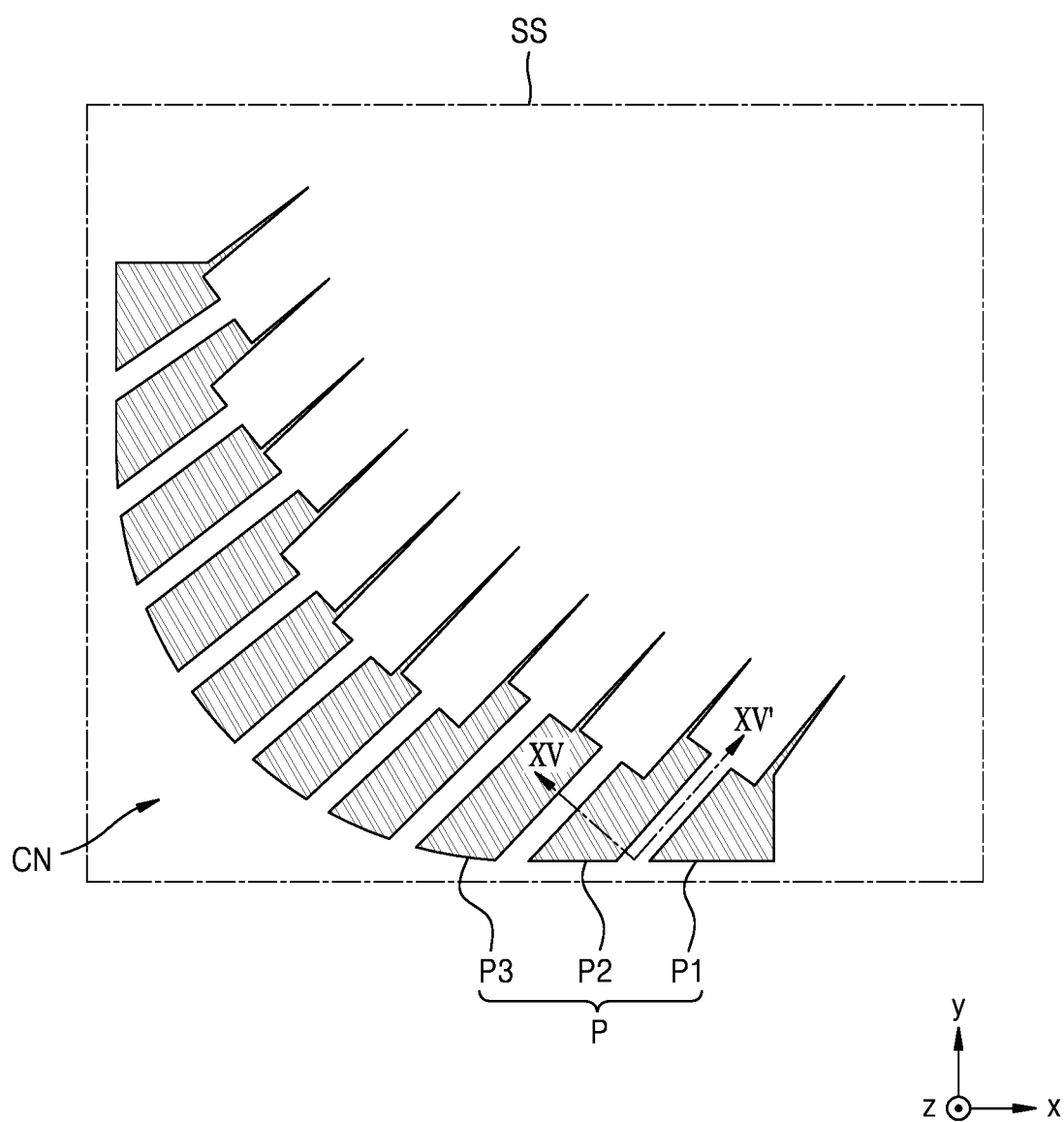
FIG. 15A is a plan view illustrating a method of manufacturing a display device, according to an embodiment.
Figure 15B:
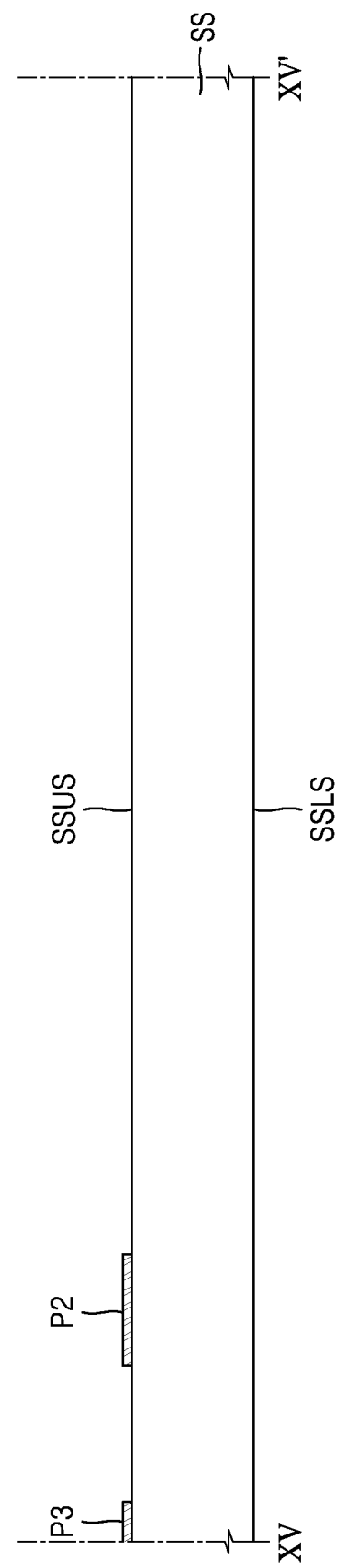
FIG. 15B is a cross-sectional view taken along the line XV-XV' of the display device of FIG. 15A, according to an embodiment.
Figure 16A:
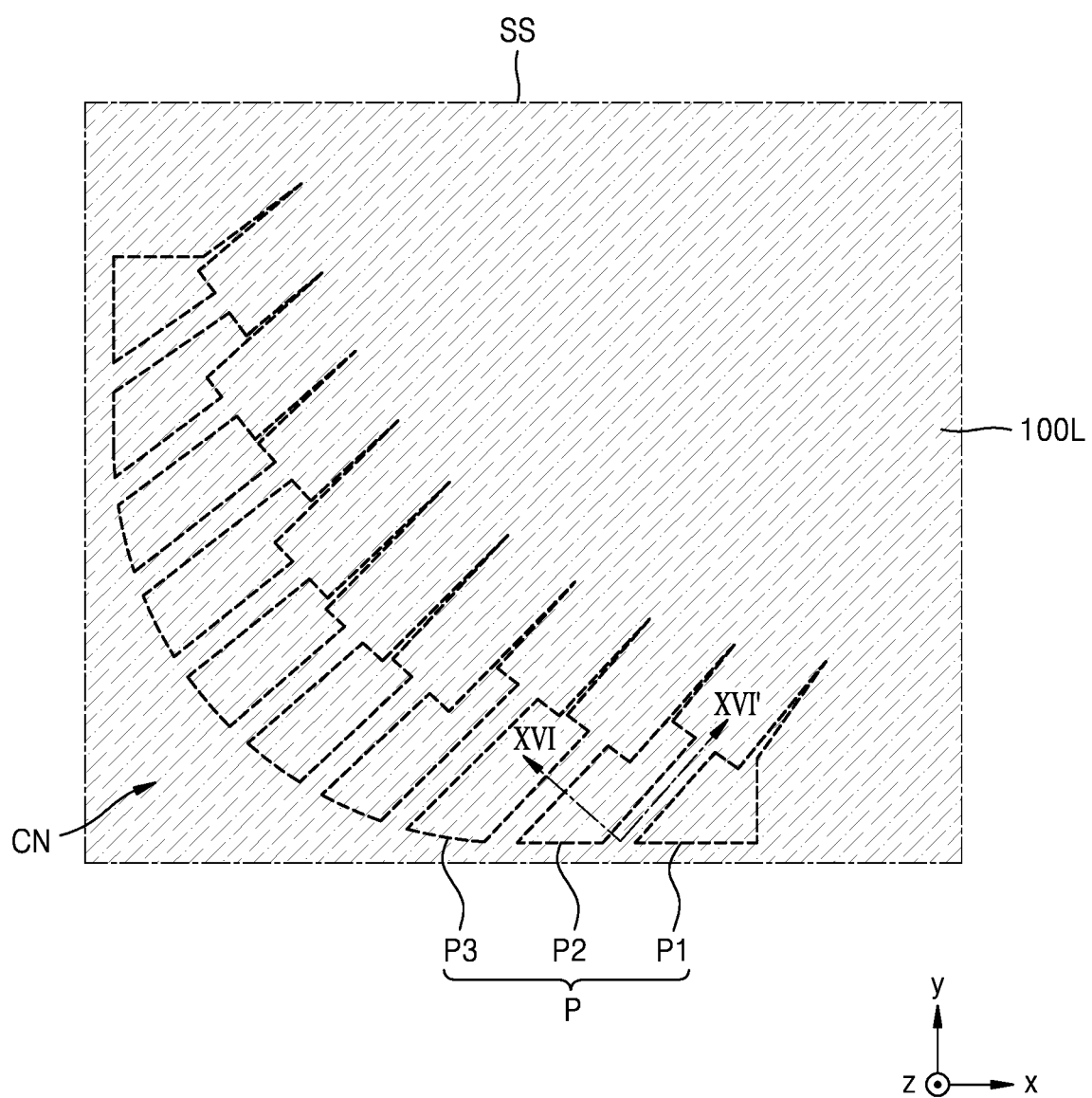
FIG. 16A is a plan view illustrating a method of manufacturing a display device, according to an embodiment.
Figure 16B:
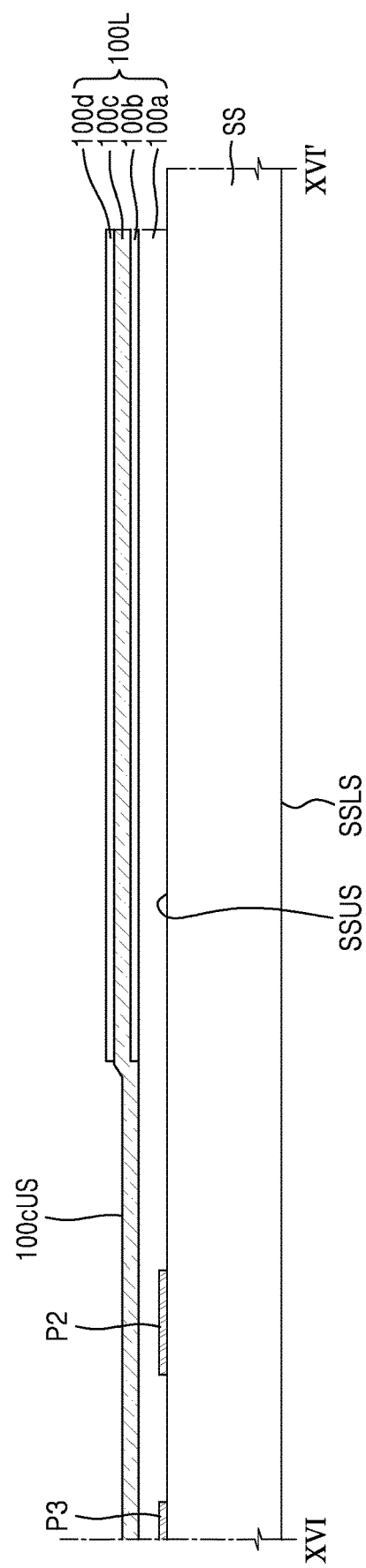
FIG. 16B is a cross-sectional view taken along the line XVI-XVI' of the display device of FIG. 16A, according to an embodiment.
Figure 17A:
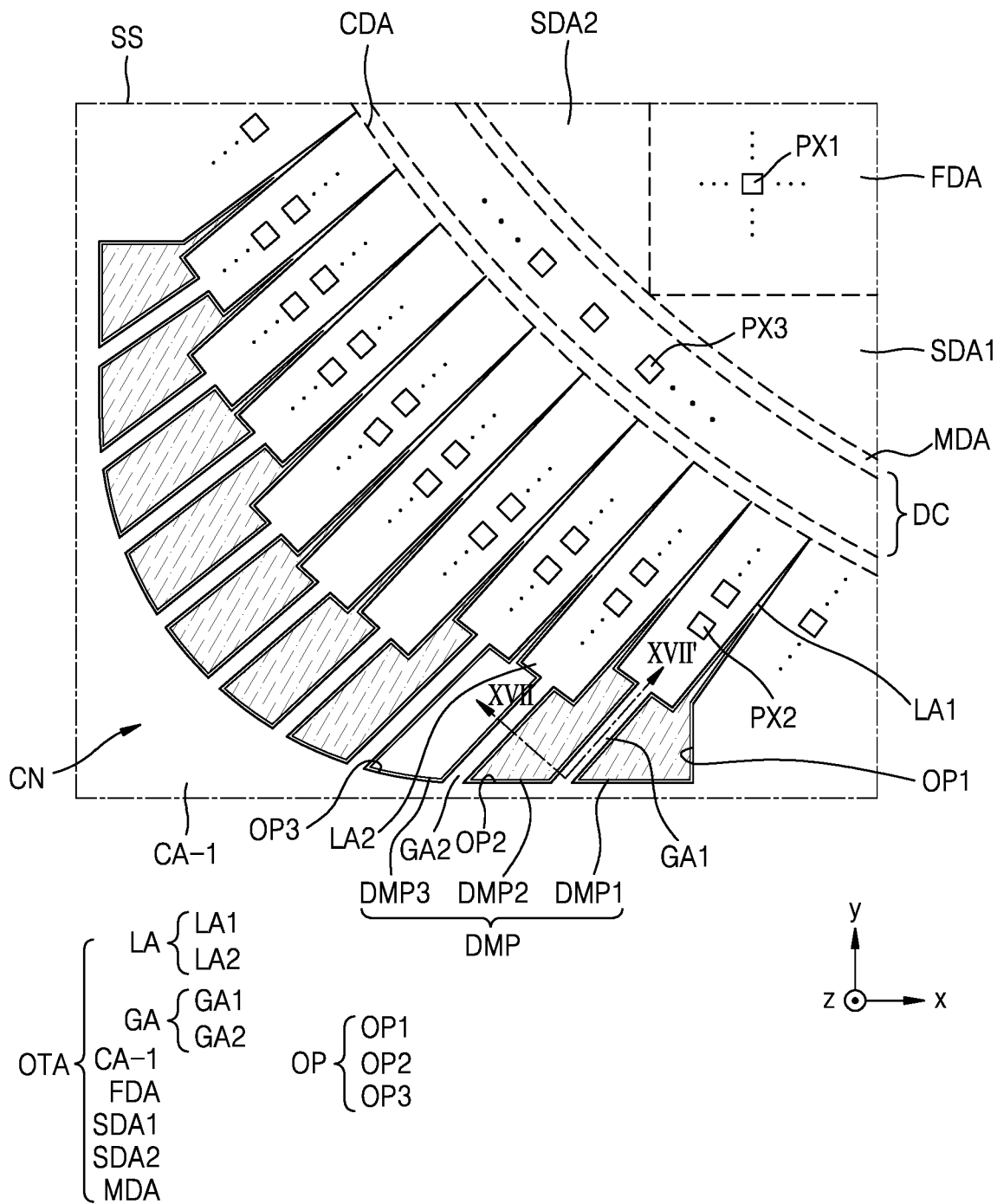
FIG. 17A is a plan view illustrating a method of manufacturing a display device, according to an embodiment.
Figure 17B:
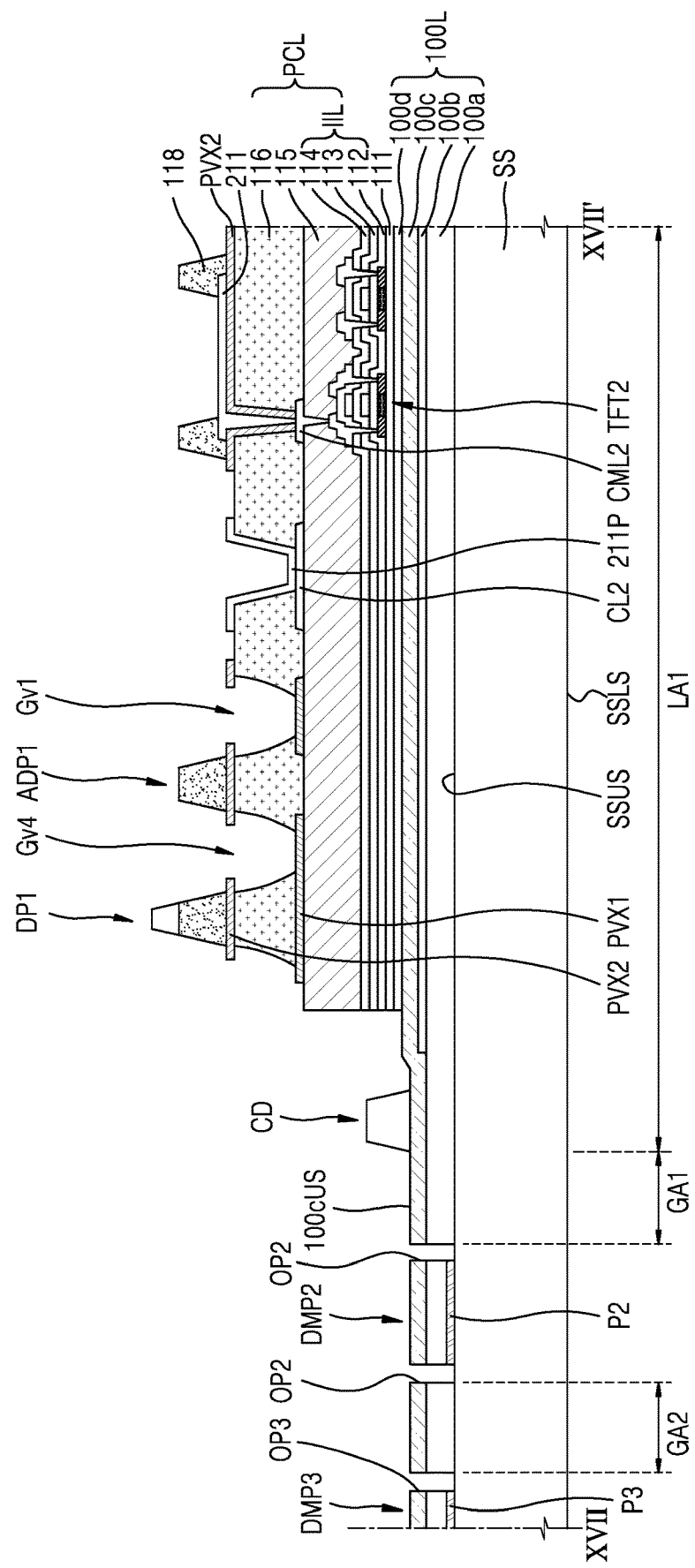
FIG. 17B is a cross-sectional view taken along the line XVII-XVII' of the display device of FIG. 17A, according to an embodiment.
Figure 18:
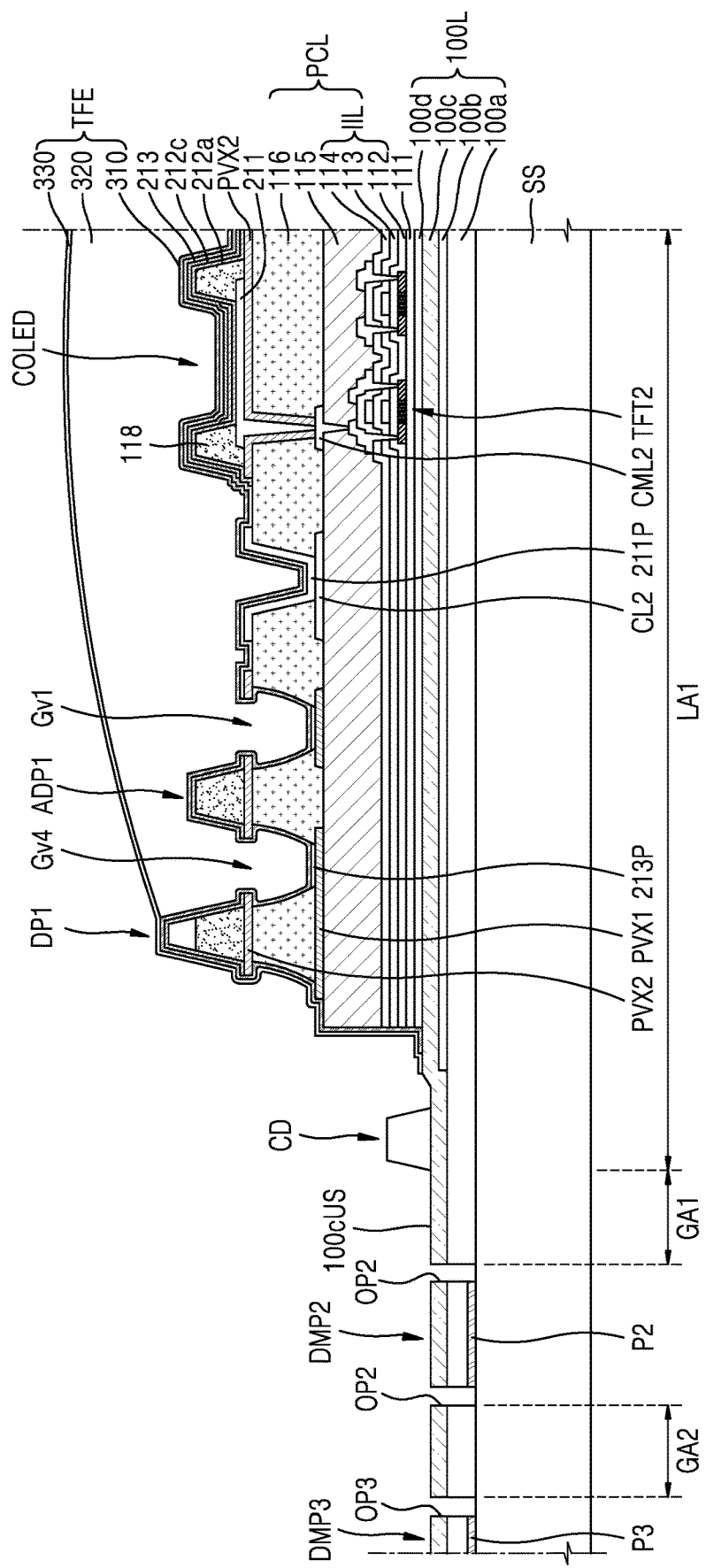
FIGS. 18-19 are cross-sectional views illustrating a method of manufacturing a display device, according to an embodiment.
Figure 19:
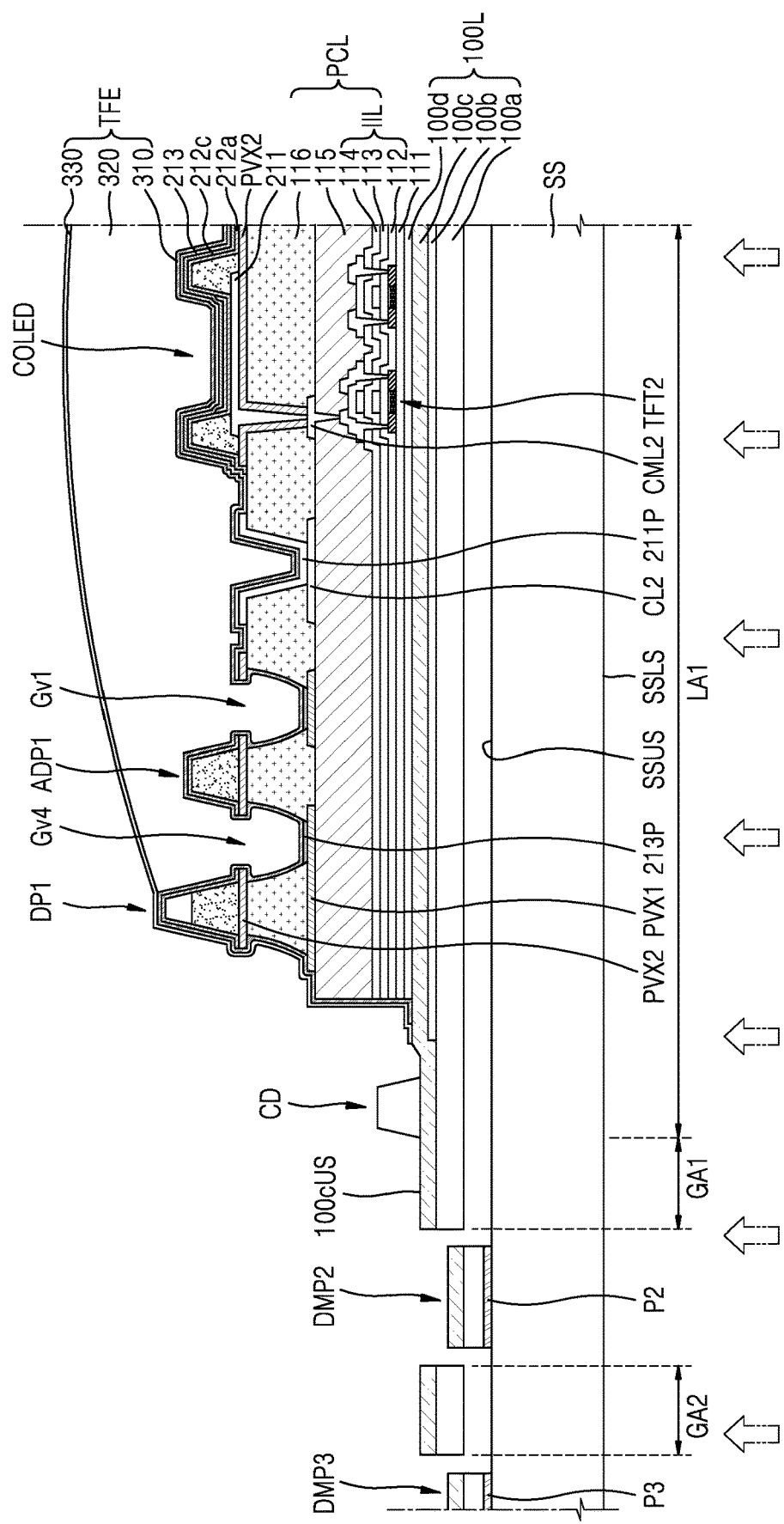
Figure 20:
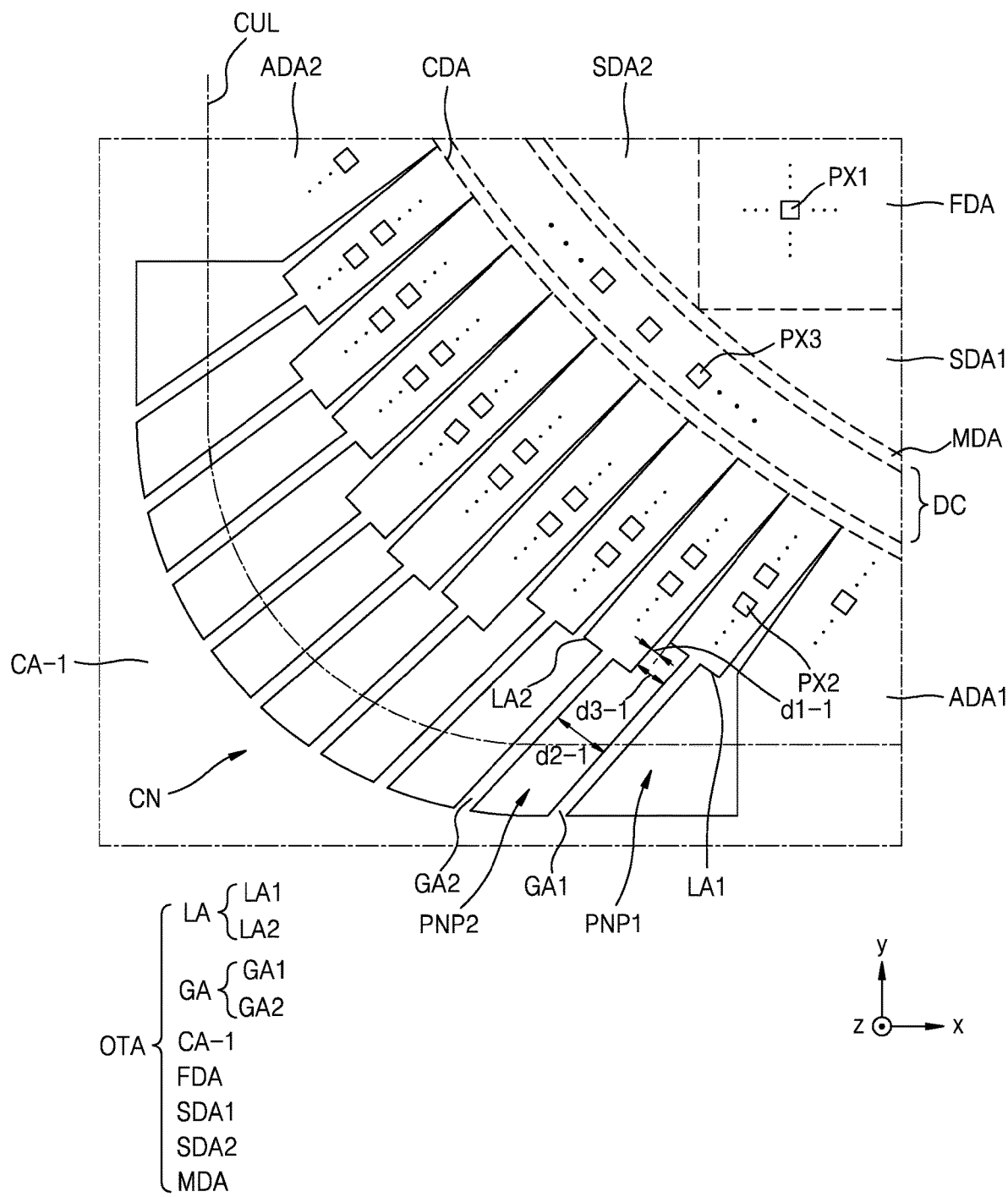
FIGS. 20-21 are plan views illustrating a method of manufacturing a display device, according to an embodiment.
Figure 21:
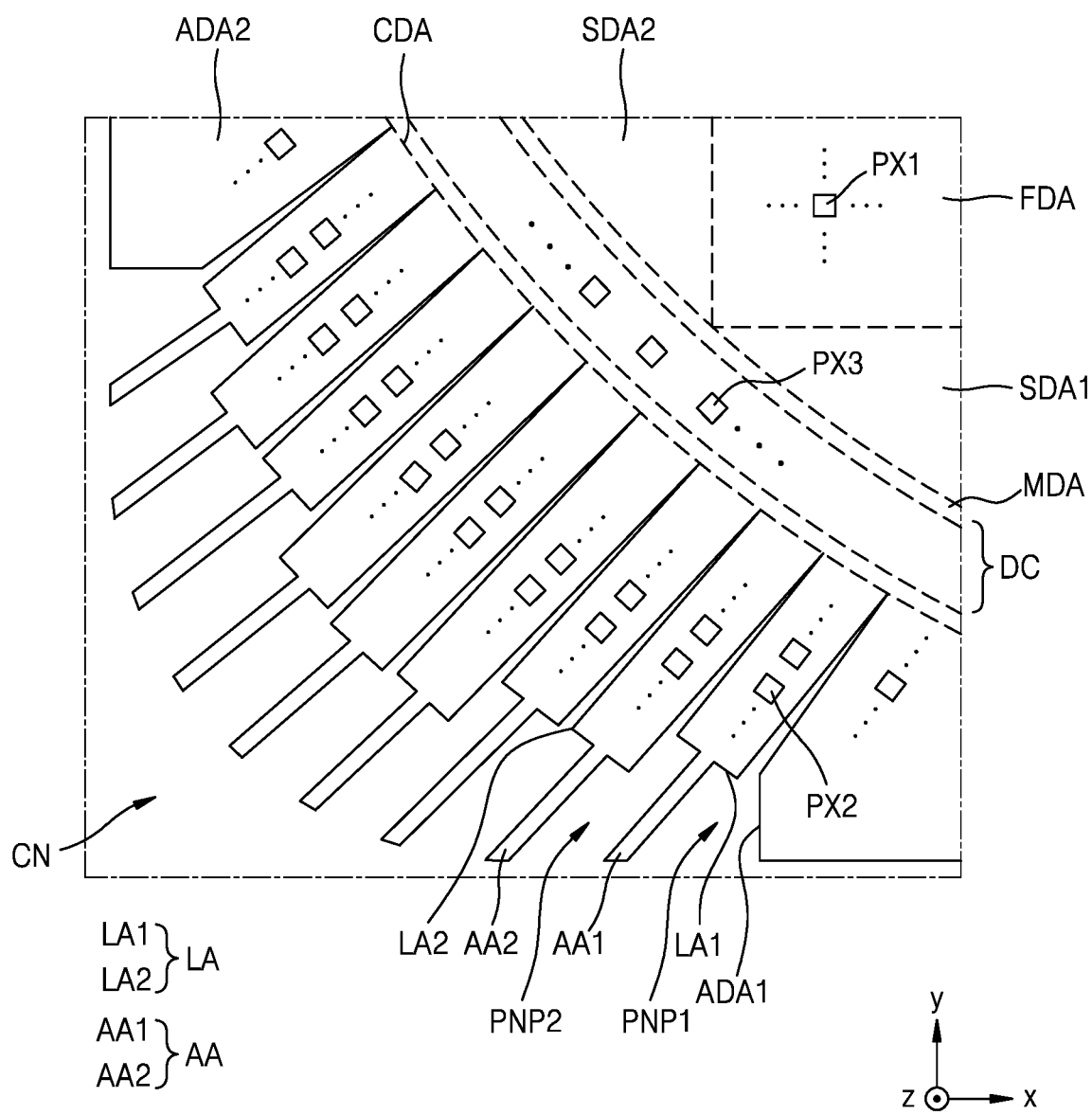
Figure 22:
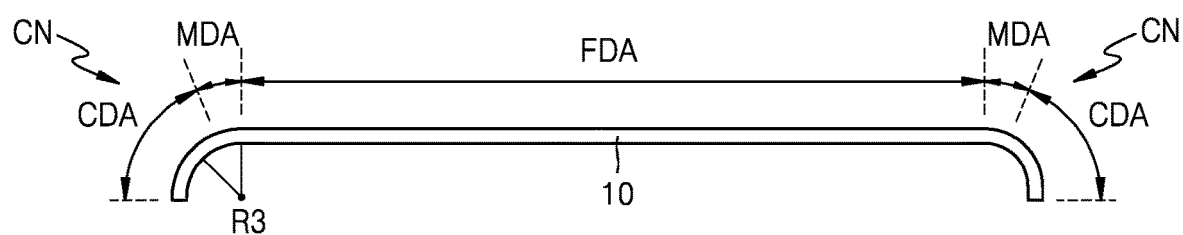
FIGS. 22-23 are cross-sectional views illustrating a method of manufacturing a display device, according to an embodiment.
Figure 23:
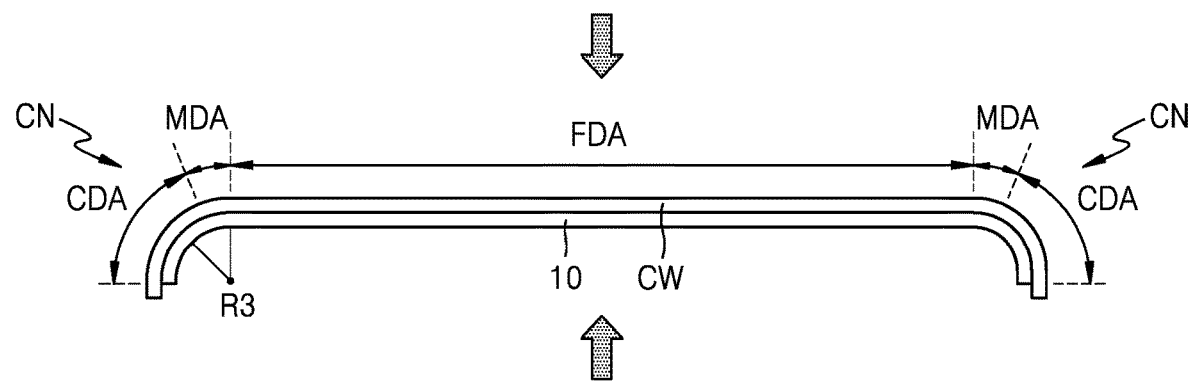

FIG. 15A is a plan view illustrating a method of manufacturing a display device, according to an embodiment. FIG. 15B is a cross-sectional view taken along the line XV-XV' of the display device of FIG. 15A, according to an embodiment. FIG. 16A is a plan view illustrating a method of manufacturing a display device, according to an embodiment. FIG. 16B is a cross-sectional view taken along the line XVI-XVI' of the display device of FIG. 16A, according to an embodiment. FIG. 17A is a plan view illustrating a method of manufacturing a display device, according to an embodiment. FIG. 17B is a cross-sectional view taken along the line XVII-XVII' of the display device of FIG. 17A, according to an embodiment. FIGS. 18 and 19 are cross-sectional views illustrating a method of manufacturing a display device, according to an embodiment. FIGS. 20 and 21 are plan views illustrating a method of manufacturing a display device, according to one or more embodiments. FIGS. 22 and 23 are cross-sectional views illustrating a method of manufacturing a display device, according to an embodiment.

Referring to FIGS. 15A and 15B, a pattern layer P may be formed on a support substrate SS. The pattern layer P may overlap with the corner CN of a display panel and/or a manufactured display device that are manufactured. The support substrate SS may include an upper surface SSUS of the support substrate SS and a lower surface SSLS of the support substrate SS. The pattern layer P may be formed on the upper surface SSUS of the support substrate SS. The lower surface SSLS of the support substrate SS may be opposite to the upper surface SSUS of the support substrate SS. The support substrate SS may include a material having a suitable hardness and rigidity that are sufficient to support the manufactured display panel, for example, such as a glass material.

A plurality of pattern layers P may be spaced apart from one another on the support substrate SS. For example, the pattern layer P may include a first pattern layer P1, a second pattern layer P2, and a third pattern layer P3 that are spaced apart from one another. The pattern layer P may be patterned in a suitable shape (e.g., a predetermined or a certain shape). The shape of the pattern layer P shown in FIG. 15A is illustrated as an example, and thus, may be variously modified as needed or desired.

The pattern layer P may include a material capable of blocking or substantially blocking a laser used in a process of separating the substrate 100 from the support substrate SS, which will be described in more detail below. In an embodiment, the pattern layer P may include a material having an absorption rate of 90% or more (or a transmittance of 10% or less) in the vicinity of a wavelength of 300 nm. For example, the pattern layer P may include at least one of amorphous silicon (a-Si), polysilicon (Poly-Si), crystalline silicon (Crystalline-Si), ZnO, IZO, and/or the like. In an embodiment, when using an excimer laser having a wavelength of 308 nm, amorphous silicon (a-Si) may be used at a wavelength of 308 nm.

The pattern layer P may be formed by forming a layer on the support substrate SS, and then patterning the layer. The pattern layer P and the layer may include the same or substantially the same material, and the layer may be patterned through exposure and development processes using a photoresist.

Referring to FIGS. 16A and 16B, a substrate layer 100L may be formed on the support substrate SS. In an embodiment, the substrate layer 100L may cover the pattern layer P. The substrate layer 100L may include the first base layer 100a, the first barrier layer 100b, the second base layer 100c, and the second barrier layer 100d that are sequentially stacked.

At least one of the first base layer 100a and the second base layer 100c may overlap with the pattern layer P. For example, each of the first base layer 100a and the second base layer 100c may extend from the end of the first barrier layer 100b and/or the end of the second barrier layer 100d, and may overlap with the pattern layer P. In this case, the first base layer 100a and the second base layer 100c may contact each other. The upper surface 100cUS of the second base layer 100c may be exposed to the outside.

The first barrier layer 100b and the second barrier layer 100d may be spaced apart from the pattern layer P. The first barrier layer 100b and the second barrier layer 100d may not overlap with the pattern layer P.

Referring to FIGS. 17A and 17B, the substrate layer 100L may be etched. In an embodiment, the substrate layer 100L may be etched along the edge of the pattern layer P. For example, the substrate layer 100L may be etched along the edge of the second pattern layer P2. The substrate layer 100L may be etched along the edge of the third pattern layer P3. In an embodiment, the first base layer 100a and the second base layer 100c may be etched along the edge of the pattern layer P. In this case, the etching may include dry etching and/or wet etching.

An opening OP may be formed by etching the substrate layer 100L. A plurality of openings OP may be provided in the substrate layer 100L. For example, the substrate layer 100L may include a first opening OP1, a second opening OP2, and a third opening OP3. The first opening OP1, the second opening OP2, and the third opening OP3 may be spaced apart from one another.

The opening OP may have a closed curved shape. For example, each of the first opening OP1, the second opening OP2, and the third opening OP3 may have a closed curved shape. In an embodiment, the opening OP may have a ring shape. The opening OP may have a ring shape along the edge of the pattern layer P. In FIG. 17A, the first opening OP1, the second opening OP2, and the third opening OP3 are provided in a ring shape along the edge of the first pattern layer P1, the edge of the second pattern layer P2, and the edge of the third pattern layer P3, respectively.

The opening OP may divide the substrate layer 100L into a dummy pattern DMP and an outer area OTA. The dummy pattern DMP may be arranged on the pattern layer P, and may be surrounded (e.g., around a periphery thereof) by the opening OP. In an embodiment, the dummy pattern DMP may include at least one of a portion of the first base layer 100a and/or a portion of the second base layer 100c. For example, the dummy pattern DMP may include a portion of the first base layer 100a, and a portion of the second base layer 100c arranged on the portion of the first base layer 100a.

A first dummy pattern DMP1 may be arranged on the first pattern layer P1, and may be surrounded (e.g., around a periphery thereof) by the first opening OP1. A second dummy pattern DMP2 may be arranged on the second pattern layer P2, and may be surrounded (e.g., around a periphery thereof) by the second opening OP2. A third dummy pattern DMP3 may be arranged on the third pattern layer P3, and may be surrounded (e.g., around a periphery thereof) by the third opening OP3.

In some embodiments, the opening OP may expose a portion of the pattern layer P. In some embodiments, the opening OP may expose the pattern layer P entirely. In this case, the dummy pattern DMP may be omitted. Hereinbelow, a case where the opening OP divides the substrate layer 100L into the dummy pattern DMP and the outer area OTA will be mainly described in more detail.

The outer area OTA may surround (e.g., around a periphery of) the opening OP. The outer area OTA may include the extension area LA, a guide area GA, a connection area CA-1, the front display area FDA, the first side display area SDA1, the second side display area SDA2, and the intermediate display area MDA.

The extension area LA may extend away from the front display area FDA. The extension area LA may extend between adjacent ones of the openings OP. For example, the first extension area LA1 may extend between the first opening OP1 and the second opening OP2. As another example, the second extension area LA2 may extend between the second opening OP2 and the third opening OP3. Thus, adjacent ones of the extension areas LA may be separated at least partially by a corresponding opening OP.

The connection area CA-1 may face a plurality of extension areas LA. The connection area CA-1 may face the plurality of extension areas LA with the plurality of openings OP therebetween. The connection area CA-1 may surround (e.g., around a periphery of) at least a portion of each of the openings OP. The connection area CA-1 may surround (e.g., around a periphery of) at least some of the openings OP, and may be connected to the front display area FDA and/or the intermediate display area MDA.

The guide area GA may be arranged between the extension area LA and the connection area CA-1. The guide area GA may connect the extension area LA and the connection area CA-1 to each other. A plurality of guide areas GA may be provided, and the plurality of guide areas GA may each connect one or more of the extension areas LA to the connection area CA-1. For example, a first guide area GA1 may connect the first extension area LA1 to the connection area CA-1. As another example, a second guide area GA2 may connect the second extension area LA2 to the connection area CA-1.

The guide area GA may extend between the openings OP that face each other. For example, the first guide area GA1 may extend between the first opening OP1 and the second opening OP2. As another example, the second guide area GA2 may extend between the second opening OP2 and the third opening OP3. The opening OP may have a closed curved shape, and thus, the extension area LA may be connected to the connection area CA-1 through the guide area GA.

Referring to FIG. 17B, the pixel circuit layer PCL may be formed on the first extension area LA1. The pixel circuit layer PCL may include the buffer layer 111, the inorganic insulating layer IIL, the first insulating layer 115, and the second insulating layer 116. In addition, the pixel circuit layer PCL may include the second thin-film transistor TFT2, the second connection line CL2, and the second connection electrode CML2. Then, the inorganic pattern layer PVX2, the first groove Gv1, the fourth groove Gv4, the first auxiliary dam portion ADP1, and the first dam portion DP1 may be formed.

In an embodiment, the opening OP may be formed after the pixel circuit layer PCL is formed. In an embodiment, the upper surface 100cUS of the second base layer 100c may be exposed to the outside. In this case, the opening OP may be formed by etching only the first base layer 100a and the second base layer 100c.

Referring to FIG. 18, the display element layer DEL and the thin-film encapsulation layer TFE may be formed on the pixel circuit layer PCL. The first functional layer 212a, the second functional layer 212c, the opposite electrode 213, the first inorganic encapsulation layer 310, and the second inorganic encapsulation layer 330 may be formed at (e.g., in or on) the first extension area LA1. The first functional layer 212a, the second functional layer 212c, the opposite electrode 213, the first inorganic encapsulation layer 310, and the second inorganic encapsulation layer 330 may be spaced apart from the first guide area GA1 and the second guide area GA2. Therefore, the upper surface 100cUS of the second base layer 100c may be exposed to the outside at (e.g., in or on) the guide area GA.

In an embodiment, the opening OP may be formed before the first functional layer 212a, the second functional layer 212c, and the opposite electrode 213 are formed. In an embodiment, the opening OP may be formed before the first inorganic encapsulation layer 310 and the second inorganic encapsulation layer 330 are formed. The first functional layer 212a, the second functional layer 212c, the opposite electrode 213, the first inorganic encapsulation layer 310, and the second inorganic encapsulation layer 330 may be formed on the entire surface of the substrate layer 100L, and thus, the first base layer 100a and the second base layer 100c may be etched before the above-described layers are formed.

Referring to FIGS. 19 and 20, the outer area OTA may be separated from the support substrate SS. In an embodiment, the outer area OTA may be separated from the support substrate SS according to a laser release method in which a laser is irradiated to the substrate layer 100L. The laser may be irradiated in a direction from the lower surface SSLS of the support substrate SS to the upper surface SSUS of the support substrate SS. Thus, the laser may be irradiated toward the lower surface of the substrate layer 100L facing the upper surface SSUS of the support substrate SS. For example, the laser may include an excimer laser having a wavelength of 308 nm, a solid UV laser having a wavelength of 343 nm or a wavelength of 355 nm, and/or the like.

The pattern layer P may be arranged below the dummy pattern DMP, and may absorb the laser. For example, the second pattern layer P2 may be arranged under the second dummy pattern DMP2 to absorb the laser, and the third pattern layer P3 may be arranged under the third dummy pattern DMP3 to absorb the laser. Therefore, the dummy pattern DMP may not be detached from the support substrate SS, even though the laser is irradiated. In other words, the dummy pattern DMP may remain on the support substrate SS.

When the outer area OTA is separated from the support substrate SS, the guide area GA may fix the extension area LA to the connection area CA-1. In a case where the guide area GA is omitted, and the extension area LA is spaced apart from the connection area CA-1, when the outer area OTA is separated from the support substrate SS, an unintended deformation and/or damage may occur in at least one of the extension areas LA. For example, in a case where an unintended deformation occurs in the first extension area LA1, a shape of the first extension area LA1 may be different from shapes of the other plurality of extension areas LA. In some embodiments, the gaps between the extension areas LA may not match with each other. In this case, the first extension area LA1 may be recognized differently from the other extension areas LA. In the present embodiment, when the outer area OTA is separated from the support substrate SS, the guide area GA may fix the extension area LA to the connection area CA-1. Thus, when separating the outer area OTA from the support substrate SS, the occurrence of damage and/or unintended deformation of the extension area LA may be prevented or reduced.

A second distance d2-1 between the first guide area GA1 and the second guide area GA2 may be greater than a first distance d1-1 between the first extension area LA1 and the second extension area LA2. The first distance d1-1 may correspond to a distance between the edge of the first extension area LA1 and the edge of the second extension area LA2 that face each other. The second distance d2-1 may correspond to a distance between the edge of the first guide area GA1 and the edge of the second guide area GA2 that face each other. The second distance d2-1 between the first guide area GA1 and the second guide area GA2 may be greater than the first distance d1-1 between the first extension area LA1 and the second extension area LA2, and thus, deformation and/or damage of the extension area LA may be prevented or substantially prevented.

In a case where the outer area OTA does not include the guide area GA, the substrate layer 100L that is arranged on the pattern layer P may include one dummy pattern DMP. In this case, when the extension areas LA are separated from the support substrate SS, a portion of the dummy pattern DMP that is arranged between adjacent extension areas LA may not remain on the support substrate SS, and may be detached together from the extension areas LA. Thus, some of the adjacent extension areas LA may be connected to each other, and when the extension area LA is bent or bends, a high compressive strain may occur. Thus, the extension area LA may be damaged.

In an embodiment, the outer area OTA may include the guide area GA, and thus, the substrate layer 100L that is arranged on the pattern layer P may be divided into a plurality of dummy patterns DMP. A stress generated when the outer area OTA is detached may be distributed to each of the plurality of dummy patterns DMP, and thus, a magnitude of the stress applied to the dummy pattern DMP that is arranged between the end of the first extension area LA1 and the end of the second extension area LA2 may be reduced. Thus, when the outer area OTA is detached from the support substrate SS, a portion of the dummy pattern DMP that is arranged between the adjacent extension areas LA may remain on the support substrate SS. Thus, a through portion may be formed between the extension area LA, and even when a compressive strain is generated when the corner display area is bent or bends, damage that may be caused by the compressive strain may be prevented or reduced.

In an embodiment, a third distance d3-1 between the second extension area LA2 and the first guide area GA1 may be greater than the first distance d1-1 between the first extension area LA1 and the second extension area LA2. In addition, the third distance d3-1 may be less than the second distance d2-1 between the first guide area GA1 and the second guide area GA2. Here, the third distance d3-1 may correspond to a distance between the edge of the second extension area LA2 and the edge of the first guide area GA1. A size of the second through portion PNP2 may gradually decrease in a direction from the guide area GA to the extension area LA, and thus, a stress generated when the outer area OTA is detached may be distributed. Thus, an element formed between the first guide area GA1 and the second guide area GA2, and between the first extension area LA1 and the second extension area LA2, may be removed.

Referring to FIG. 20, at least a portion of the connection area CA-1 may be removed. In an embodiment, the connection area CA-1 may be cut along a cutting line CUL. For example, the connection area CA-1 may be laser cut along the cutting line CUL. In an embodiment, when at least a portion of the connection area CA-1 is removed, a portion of the guide area GA may also be removed. The guide area GA may overlap with the first base layer 100a and the second base layer 100c, each including an organic material, and may be spaced apart from the first barrier layer 100b and the second barrier layer 100d, each including an inorganic material. Thus, the guide area GA may be easily cut.

In an embodiment of the present disclosure, the outer area OTA includes the guide area GA, and thus, the extension area LA may be prevented or substantially prevented from being peeled off between processes, and/or a gap between the adjacent extension areas LA may be prevented or substantially prevented from being deformed.

In some embodiments, an extension direction of the guide area GA may be the same or substantially the same as an extension direction of the extension area LA. In another embodiment, the extension direction of the guide area GA may be different from the extension direction of the extension area LA.

In some embodiments, a width of the first guide area GA1 may be the same or substantially the same as a width of the second guide area GA2. In another embodiment, the width of the first guide area GA1 may be different from the width of the second guide area GA2.

In some embodiments, a length of the first guide area GA1 may be different from a length of the second guide area GA2. In addition, the width of the first guide area GA1 may be different from the width of the second guide area GA2. In this case, the modulus of elasticity of the first guide area GA1 may be the same or substantially the same as that of the second guide area GA2.

In some embodiments, the width of the guide area GA may be constant or substantially constant in a direction from the extension area LA to the connection area CA-1. In another embodiment, the width of the guide area GA may increase in the direction from the extension area LA to the connection area CA-1. In another embodiment, the width of the guide area GA may decrease in the direction from the extension area LA to the connection area CA-1. In another embodiment, the width of the guide area GA may increase in the direction from the extension area LA to the connection area CA-1 and then decrease. In another embodiment, the width of the guide area GA may decrease in the direction from the extension area LA to the connection area CA-1 and then increase.

In an embodiment, the first guide area GA1 may include a first portion and a second portion, each connected to the first extension area LA1. In an embodiment, the first portion and the second portion may be connected to each other by a connection portion. In this case, the first guide area GA1 may have a ladder shape. In a case where the first guide area GA1 has the ladder shape, the first guide area GA1 may support the first extension area LA1 and the connection area CA-1, and may be easily laser cut.

In an embodiment, the guide area GA may change its extension direction at least twice. The guide area GA may extend serpentinely from the extension area LA. For example, the guide area GA may extend in a sine (e.g., a sinusoidal) curved shape. When the extension direction of the guide area GA is changed at least twice, a transfer of external impacts to the extension area LA through the guide area GA during a process may be mitigated.

Referring to FIG. 21, a portion of the laser-cut guide area GA may remain in the display panel as the auxiliary area AA that is connected to the extension area LA. For example, the first guide area GA1 may be laser cut, and a portion thereof may remain as the first auxiliary area AA1 that is connected to the first extension area LA1. The second guide area GA2 may be laser cut, and a portion thereof may remain as the second auxiliary area AA2 that is connected to the second extension area LA2.

Referring to FIG. 22, the display panel 10 may be bendable. For example, the corner display area CDA overlapping with the corner CN of the display panel 10 may be bent or may bend. In an embodiment, the corner display area CDA may include the third curvature radius R3. In an embodiment, the corner display area CDA may be bent or bend in a vacuum state by arranging a guide film under the display panel 10. In an embodiment, the corner display area CDA may be bent or bend in a thermoforming method.

Referring to FIG. 23, the cover window CW may be arranged on the display panel 10 that has been manufactured as described above. In addition, the display panel 10 may be attached to the cover window CW. In an embodiment, the display panel 10 and the cover window CW may be connected to each other by an optically clear adhesive. The display panel 10 may be attached to the cover window CW by a lamination process. Thus, the cover window CW may be arranged on the corner display area CDA of the display panel 10.

Figure 24:
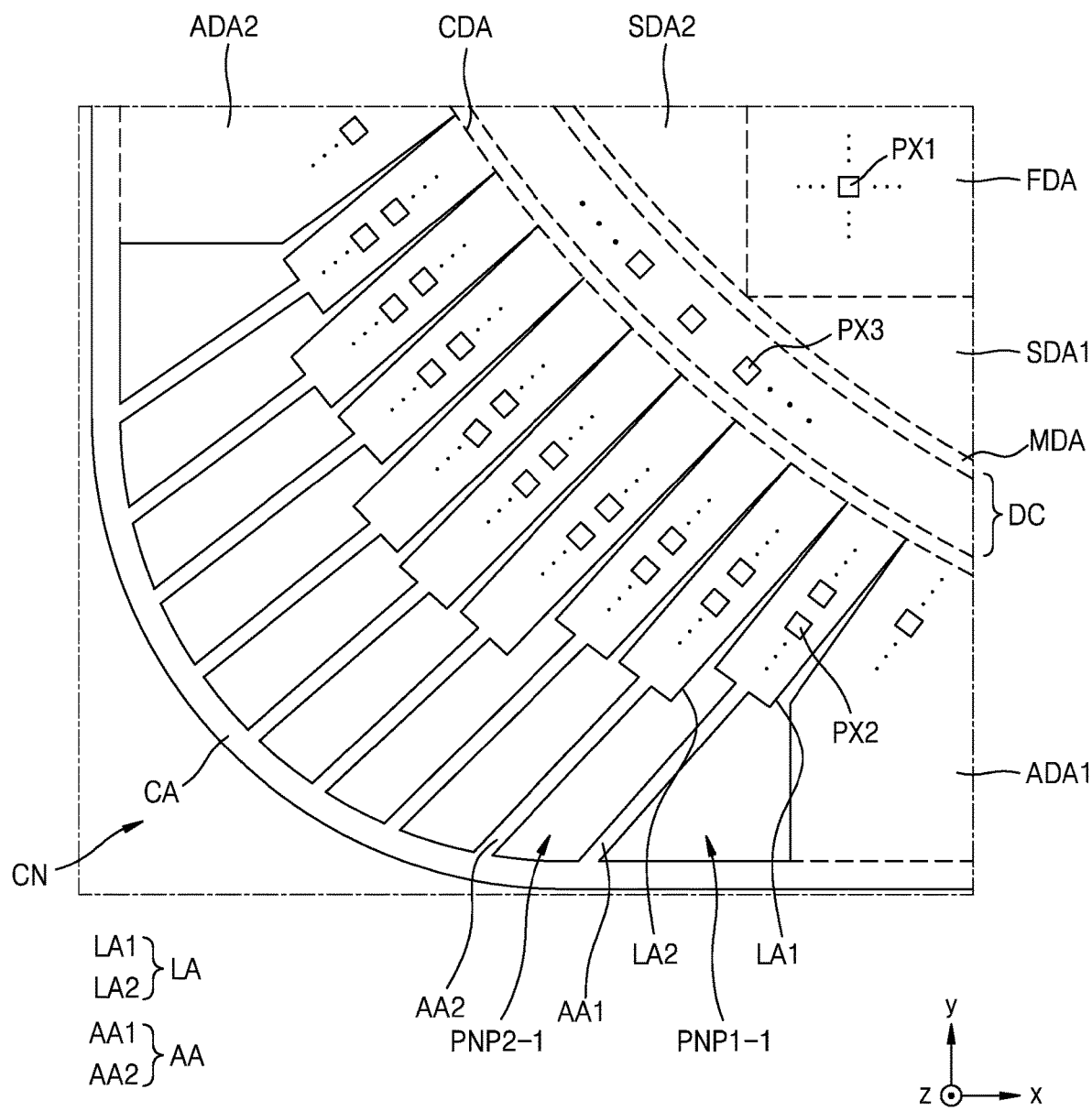
FIG. 24 is an enlarged view of a corner of a display panel according to another embodiment.

FIG. 24 is an enlarged view of a corner CN of a display panel according to another embodiment. In FIG. 24, the same reference symbols as those of FIG. 5A are used to denote the same or substantially the same elements, and thus, redundant descriptions thereof may not be repeated. The embodiment of FIG. 24 may be different from the embodiment of FIG. 5A, in that the corner display area CDA further includes a connection area CA in FIG. 24.

Referring to FIG. 24, the display panel may include the corner CN. In this case, a substrate included in the display panel may include the front display area FDA, the first side display area SDA1, the second side display area SDA2, the corner display area CDA, and the intermediate display area MDA. The first pixel PX1 may be arranged at (e.g., in or on) the front display area FDA, the second pixel PX2 may be arranged at (e.g., in or on) the corner display area CDA, and the third pixel PX3 may be arranged at (e.g., in or on) the intermediate display area MDA.

The corner display area CDA may be arranged at the corner CN of the display panel. The corner display area CDA may include the extension area LA, the auxiliary area AA, the first adjacent area ADA1, the second adjacent area ADA2, and the connection area CA. In an embodiment, each of the extension area LA, the auxiliary area AA, the first adjacent area ADA1, and the second adjacent area ADA2 may extend in a direction away from the front display area FDA.

The connection area CA may face a plurality of extension areas LA. The connection area CA may be connected to the first adjacent area ADA1, the second adjacent area ADA2, and a plurality of auxiliary areas AA.

The auxiliary area AA may be arranged between the extension area LA and the connection area CA. The auxiliary area AA may connect the extension area LA and the connection area CA to each other. The plurality of auxiliary areas AA may be provided, and the plurality of auxiliary areas AA may connect the plurality of extension areas LA to the connection area CA. For example, the first auxiliary area AA1 may connect the first extension area LA1 to the connection area CA. As another example, the second auxiliary area AA2 may connect the second extension area LA2 to the connection area CA.

A first through portion PNP1-1 may be defined between the first extension area LA1, the first auxiliary area AA1, the first adjacent area ADA1, and the connection area CA. The first through portion PNP1-1 may be defined by a portion of the edge of the first extension area LA1, a portion of the edge of the first auxiliary area AA1, a portion of the edge of the first adjacent area ADA1, and a portion of the edge of the connection area CA. The first through portion PNP1-1 may be surrounded (e.g., around a periphery thereof) by the first extension area LA1, the first auxiliary area AA1, the first adjacent area ADA1, and the connection area CA. The first through portion PNP1-1 may penetrate into the display panel.

A second through portion PNP2-1 may be defined between the first extension area LA1, the second extension area LA2, the first auxiliary area AA1, the second auxiliary area AA2, and the connection area CA. The second through portion PNP2-1 may be defined by a portion of the edge of the first extension area LA1, a portion of the edge of the second extension area LA2, a portion of the edge of the first auxiliary area AA1, a portion of the edge of the second auxiliary area AA2, and a portion of the edge of the connection area CA. The second through portion PNP2-1 may be surrounded (e.g., around a periphery thereof) by the first extension area LA1, the first auxiliary area AA1, the second extension area LA2, the second auxiliary area AA2, and the connection area CA. The second through portion PNP2-1 may penetrate into the display panel, similar to the first through portion PNP1-1.

Figure 25:
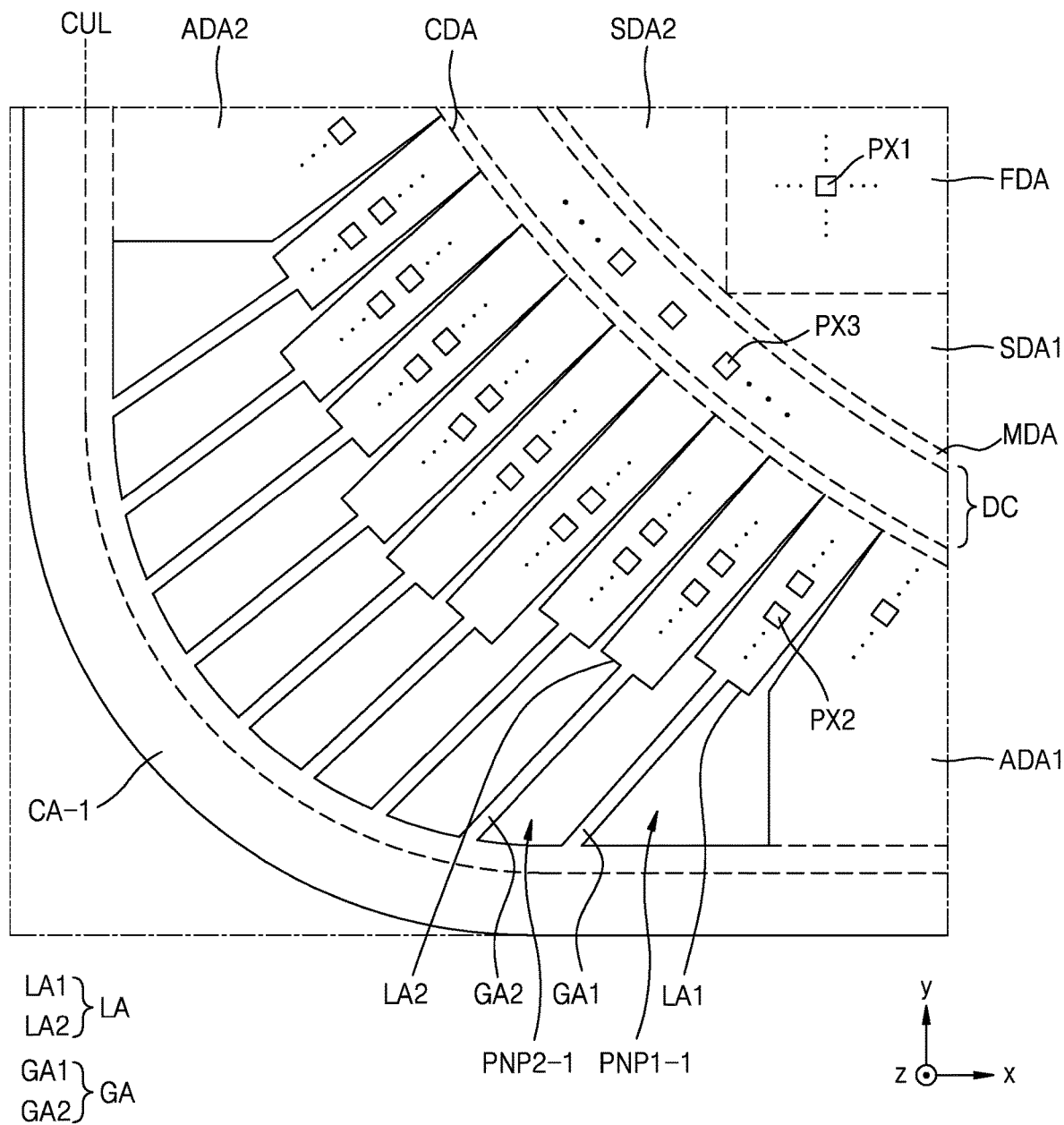
FIG. 25 is a plan view illustrating a method of manufacturing a display device, according to another embodiment.

FIG. 25 is a plan view illustrating a method of manufacturing a display device, according to another embodiment. In FIG. 25, the same reference symbols as those of FIG. 22 are used to denote the same or substantially the same elements, and thus, redundant descriptions thereof may not be repeated.

Referring to FIG. 25, at least a portion of the connection area CA-1 may be removed. At this time, the cutting line CUL may be spaced apart from the guide area GA. In this case, a portion of the connection area CA-1 may remain, and the remaining portion of the connection area CA-1 may connect the first adjacent area ADA1, the second adjacent area ADA2, and the auxiliary area AA (e.g., shown as the guide area GA in FIG. 25) to one another.

As described above, according to one or more embodiments of the present disclosure, a first auxiliary area may be connected to a first extension area, and may extend in a direction way from a front display area, such that an unintended deformation of the first extension area may be prevented or reduced.

In addition, according to one or more embodiments of the present disclosure, a display device including a corner display area that is capable of preventing or substantially preventing peeling and/or gap deformation between processes may be manufactured.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
   a substrate comprising a front display area, and a corner display area at a corner of the display panel; and
   a display element at the corner display area,
   wherein the corner display area comprises:
      a first extension area extending in a direction away from the front display area; and
      a first auxiliary area connected to the first extension area, and extending in a direction away from the front display area,
   wherein the substrate comprises a base layer, and a barrier layer on the base layer, the base layer overlapping with the first extension area and the first auxiliary area, and the barrier layer overlapping with the first extension area and spaced from the first auxiliary area.

2. The display panel of claim 1, wherein the corner display area further comprises an adjacent area that is adjacent to the first extension area, and extends in a direction away from the front display area, and
   wherein a first through portion penetrating through the display panel is defined between the adjacent area and the first extension area, and between the adjacent area and the first auxiliary area.

3. The display panel of claim 1, wherein the corner display area further comprises:
   a second extension area extending in a direction away from the front display area; and
   a second auxiliary area connected to the second extension area, and extending in a direction away from the front display area, and
   wherein a second through portion penetrating through the display panel is defined between the first extension area and the second extension area, and between the first auxiliary area and the second auxiliary area.

4. The display panel of claim 3, wherein a distance between the first auxiliary area and the second auxiliary area is greater than a distance between the first extension area and the second extension area.

5. The display panel of claim 1, wherein a width of the first extension area is greater than a width of the first auxiliary area.

6. The display panel of claim 1, wherein the first auxiliary area extends in the same direction as that of the first extension area.

7. The display panel of claim 1, wherein the first auxiliary area extends in a direction different from that of the first extension area.

8. The display panel of claim 1, wherein an extension direction of the first auxiliary area is changed at least twice.

9. The display panel of claim 1, wherein the corner display area further comprises:
   an adjacent area that is adjacent to the first extension area, and extends in a direction away from the front display area;

a connection area connecting the adjacent area to the first auxiliary area; and a first through portion penetrating through the display panel, the first through portion being surrounded by the adjacent area, the first extension area, the first auxiliary area, and the connection area.

10. The display panel of claim 1, wherein the display element comprises a plurality of display elements at the first extension area, wherein the plurality of display elements are arranged in the direction in which the first extension area extends.

11. A display device comprising:

a display panel; and a cover window on the display panel, wherein the display panel comprises:

a substrate comprising a front display area, and a corner display area at a corner of the display panel, the corner display area being bendable; and a display element at the corner display area, wherein the corner display area comprises:

a first extension area extending in a direction away from the front display area; and a first auxiliary area connected to the first extension area, and extending in a direction away from the front display area, and wherein a width of the first auxiliary area is less than a width of the first extension area.

12. The display device of claim 11, wherein the corner display area further comprises an adjacent area that is adjacent to the first extension area, and extends in a direction away from the front display area, and wherein a first through portion penetrating through the display panel is defined between the first extension area and the adjacent area, and between the first auxiliary area and the adjacent area.

13. The display device of claim 11, wherein the corner display area further comprises:

a second extension area extending in a direction away from the front display area; and a second auxiliary area connected to the second extension area, and extending in a direction away from the front display area, and wherein a second through portion penetrating through the display panel is defined between the first extension area and the second extension area, and between the first auxiliary area and the second auxiliary area.

14. The display device of claim 11, wherein the substrate comprises a base layer, and a barrier layer on the base layer, the base layer overlapping with the first extension area and the first auxiliary area, and the barrier layer overlapping with the first extension area and spaced from the first auxiliary area.

15. The display device of claim 11, wherein the corner display area further comprises:

an adjacent area that is adjacent to the first extension area, and extends in a direction away from the front display area;

a connection area connecting the adjacent area to the first auxiliary area; and a first through portion penetrating through the display panel, and surrounded by the adjacent area, the first extension area, the first auxiliary area, and the connection area.

16. The display device of claim 11, wherein the substrate further comprises:

a first side display area connected to the front display area in a first direction, and bent at a first curvature radius; and a second side display area connected to the front display area in a second direction crossing the first direction, and bent at a second curvature radius different from the first curvature radius, and wherein the corner display area at least partially surrounds the front display area between the first side display area and the second side display area.

17. A method of manufacturing a display device, comprising:

forming a first pattern layer and a second pattern layer on a support substrate to overlap with a corner of the display device;

forming a substrate layer on the support substrate;

forming a first opening having a closed loop shape by etching the substrate layer along an edge of the first pattern layer;

forming a second opening spaced from the first opening and having a closed loop shape, by etching the substrate layer along an edge of the second pattern layer; and separating an outer area from the support substrate, the outer area surrounding the first opening and the second opening of the substrate layer.

18. The method of claim 17, wherein the outer area comprises:

a first extension area extending between the first opening and the second opening;

a connection area facing the first extension area, and at least partially surrounding the first opening and the second opening; and a first guide area extending between the first opening and the second opening, and connecting the first extension area to the connection area.

19. The method of claim 18, wherein:

the substrate layer comprises a base layer, and a barrier layer on the base layer;

the first extension area overlaps with the base layer and the barrier layer; and the first guide area overlaps with the base layer, and is spaced from the barrier layer.

20. The method of claim 18, further comprising:

forming a pixel circuit layer on the first extension area; and forming a display element layer and a thin-film encapsulation layer on the pixel circuit layer.

21. The method of claim 18, further comprising removing at least a portion of the connection area.

22. The method of claim 21, further comprising removing at least a portion of the first guide area.

23. The method of claim 18, further comprising:

forming a third pattern layer on the support substrate to overlap with the corner; and forming a third opening surrounded by the outer area in a closed loop shape, by etching the substrate layer along an edge of the third pattern layer, wherein the third opening is spaced from the first opening and the second opening, wherein the outer area comprises:

a second extension area extending between the second opening and the third opening; and a second guide area extending between the second opening and the third opening, and connecting the second extension area to the connection area, and wherein a distance between the first guide area and the second guide area is greater than a distance between the first extension area and the second extension area.

24. The method of claim 17, wherein, in the separating of the outer area from the support substrate, a first dummy pattern in the substrate layer remains on the support substrate, the first dummy pattern being arranged on the first pattern layer and surrounded by the first opening.

25. The method of claim 17, further comprising:
bending a corner display area that overlaps with the corner; and
arranging a cover window on the corner display area.

26. A display panel comprising:
a substrate comprising:
  a front display area;
  a first side display area extending from the front display area in a first direction;
  a second side display area extending from the front display area in a second direction crossing the first direction; and
  a corner display area between the first side display area and the second side display area; and
a display element at the corner display area,
wherein the corner display area comprises:
  a first extension area extending in a direction away from the front display area;
  a first auxiliary area extending in a direction away from the front display area at one end of the first extension area, and having a width that is less than a width of the first extension area;
  a second extension area that is adjacent to the first extension area, and extending in a direction away from the front display area; and
  a second auxiliary area extending in a direction away from the front display area at an end of the second extension area, and having a width that is less than a width of the second extension area,
wherein the first extension area, the second extension area, the first auxiliary area, and the second auxiliary area define a through portion therebetween that penetrates through the display panel, and
wherein a size of the through portion between the first extension area and the second extension area is less than a size of the through portion between the first auxiliary area and the second auxiliary area.

* * * * *